United States Patent [19]

Tashiro et al.

[11] Patent Number: 5,566,303
[45] Date of Patent: Oct. 15, 1996

[54] MICROCOMPUTER WITH MULTIPLE CPU'S ON A SINGLE CHIP WITH PROVISION FOR TESTING AND EMULATION OF SUB CPU'S

[75] Inventors: Tetsu Tashiro; Yoshiki Cho, both of Itami, Japan

[73] Assignee: Mitsubishi Denki Kabushiki Kaisha, Tokyo, Japan

[21] Appl. No.: 251,556

[22] Filed: May 31, 1994

[30] Foreign Application Priority Data

May 31, 1993 [JP] Japan ................................. 5-128888
May 19, 1994 [JP] Japan ................................. 6-105768

[51] Int. Cl.⁶ ....................................... G06F 13/00
[52] U.S. Cl. .................. 395/280; 395/421.03; 395/800; 377/39
[58] Field of Search ..................... 395/775, 280, 395/421.03, 800; 377/39

[56] References Cited

U.S. PATENT DOCUMENTS

| | | | |
|---|---|---|---|
| 4,296,467 | 10/1981 | Nibby, Jr. et al. | 364/200 |
| 4,612,631 | 9/1986 | Ochii | 365/203 |
| 4,680,701 | 7/1987 | Cochran | 364/200 |
| 4,698,750 | 10/1987 | Wilkie et al. | 364/200 |
| 4,796,099 | 1/1989 | Comptom | 358/342 |
| 4,799,144 | 1/1989 | Parruck et al. | 364/200 |
| 4,977,494 | 12/1990 | Gabaldon et al. | 364/167.01 |
| 5,032,983 | 7/1991 | Fu et al. | 364/200 |
| 5,121,498 | 6/1992 | Gilbert et al. | 395/700 |
| 5,261,095 | 11/1993 | Crawford et al. | 395/650 |
| 5,287,515 | 2/1994 | Murai | 395/700 |
| 5,367,550 | 11/1994 | Ishida | 377/39 |
| 5,410,718 | 4/1995 | Masumura et al. | 395/800 |

FOREIGN PATENT DOCUMENTS 3903835 8/1989 Germany.

OTHER PUBLICATIONS

David Jones, "Fehlertoleranz und Zuverlassigkeit in Mikroprozessor–Systemen", Elektronik·24/1990, pp. 54–60.

Primary Examiner—Jack B. Harvey
Assistant Examiner—John Travis
Attorney, Agent, or Firm—Lowe, Price, LeBlanc & Becker

[57] ABSTRACT

A control circuit is provided which enables the main CPU 23 to access a memory space of the sub CPU 1 by means of the test mode control register 4 which can be controlled via the main CPU bus 10. Also a control circuit is provided to branch into a break routine by comparing the value of the program counter 5 of the sub CPU 1 and the value set in the break vector register 7. Further, a control circuit which enables it to reset the sub CPU 1, to branch according to a test vector and to make break branch under the control of the main CPU 23 is provided, thereby making it easy to incorporate the sub CPU 1 on-chip in the conventional single CPU constitution. Thus testing environment and debugging environment for the sub CPU 1 is provided in the microcomputer having a plurality of CPUs on a single chip without connecting the exclusive test terminal of the sub CPU 1 or the sub CPU bus 28 with the outside.

2 Claims, 61 Drawing Sheets

FIG. 1
PRIOR ART

| PROGRAM OF CPUa |
|---|
| CPUa  IN1a |
| CPUa  IN2a |
| CPUa  IN3a |
| CPUa  IN4a |
| CPUa  IN5a |
| CPUa  IN6a |
| CPUa  IN7a |
| CPUa  IN8a |
| CPUa  IN9a |
| CPUa  IN10a |
| CPUa  IN11a |
| CPUa  IN12a |
| CPUa  IN13a |
| CPUa  IN14a |
| CPUa  IN15a |
| CPUa  IN16a |

| PROGRAM OF CPUb |
|---|
| CPUb  IN1b |
| CPUb  IN2b |
| CPUb  IN3b |
| CPUb  IN4b |
| CPUb  IN5b |
| CPUb  IN6b |
| CPUb  IN7b |
| CPUb  IN8b |
| CPUb  IN9b |
| CPUb  IN10b |
| CPUb  IN11b |
| CPUb  IN12b |
| CPUb  IN13b |
| CPUb  IN14b |
| CPUb  IN15b |
| CPUb  IN16b |

48: START CONTROL BIT

FIG. 31

| BIT ORDER | G | F | E | D | C | B | A | 9 | 8 | 7 | 6 | 5 | 4 | 3 | 2 | 1 | 0 |
|---|---|---|---|---|---|---|---|---|---|---|---|---|---|---|---|---|---|
| SUB CPU ADD. | | | E | D | C | B | A | 9 | 8 | 7 | 6 | 5 | 4 | 3 | 2 | 1 | 0 |
| MAIN CPU ADD. | | F | E | D | C | B | A | 9 | 8 | 7 | 6 | 5 | 4 | 3 | 2 | 1 | 0 |

SUB CPU ADD.   0020 DATA 5613
MAIN CPU ADD.  4040 DATA 13
               4041 DATA 56

FIG. 35  RELATION BETWEEN EPROM MODES AND INPUT STATUS OF

| EPROM MODE | RESET̄ | VPP | VRFY | CEB | OEB | BWTEST | DTESTB | GTESTB |
|---|---|---|---|---|---|---|---|---|
| STANDBY | L | 12V | L | H | X | H | H | H |
| INHIBIT READ | L | 12V | L | L | H | H | H | H |
| READ | L | 12V | L | L | L | H | H | H |
| INHIBIT PROGRAM | L | 12V | H | H | H | H | H | H |
| VERIFY | L | 12V | H | H | L | H | H | H |
| PROGRAM | L | 12V | H | L | H | H | H | H |

| BIT ORDER | G | F | E | D | C | B | A | 9 | 8 | 7 | 6 | 5 | 4 | 3 | 2 | 1 | 0 |
|---|---|---|---|---|---|---|---|---|---|---|---|---|---|---|---|---|---|
| SUB CPU ADD. | | | | C | B | A | 9 | 8 | 7 | 6 | 5 | 4 | 3 | 2 | 1 | 0 | |
| MAIN CPU ADD. | | F | E | D | C | B | A | 9 | 8 | 7 | 6 | 5 | 4 | 3 | 2 | 1 | 0 |

FIG. 47

FIG. 48A
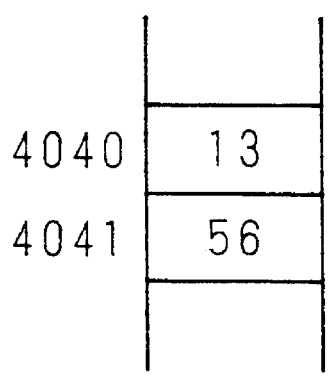
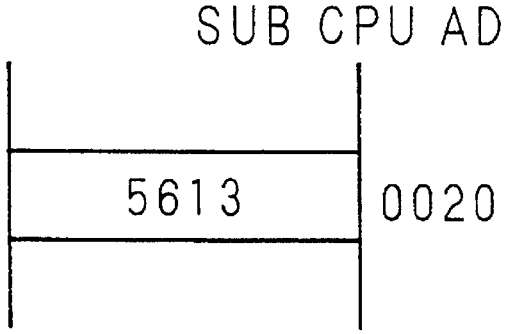
FIG. 48B
SUB CPU ADD.   0020 DATA 5613
MAIN CPU ADD.  4040 DATA 13
               4041 DATA 56

FIG. 56
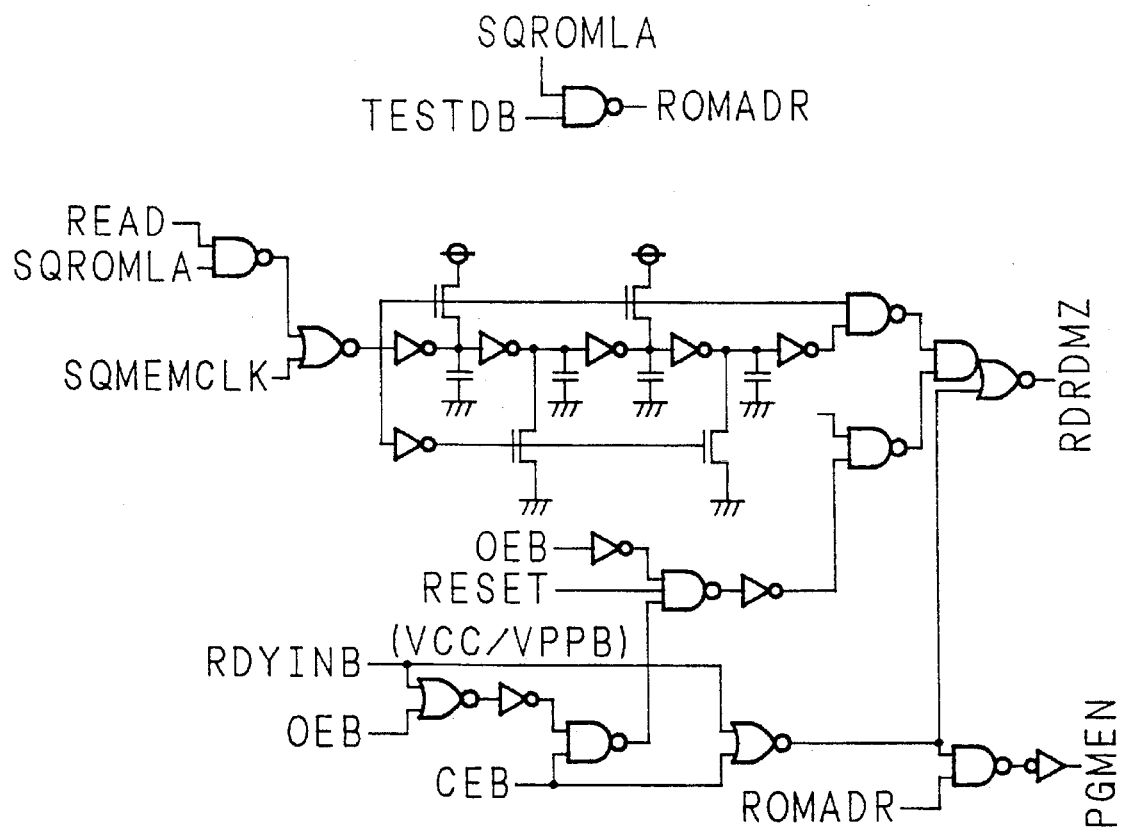
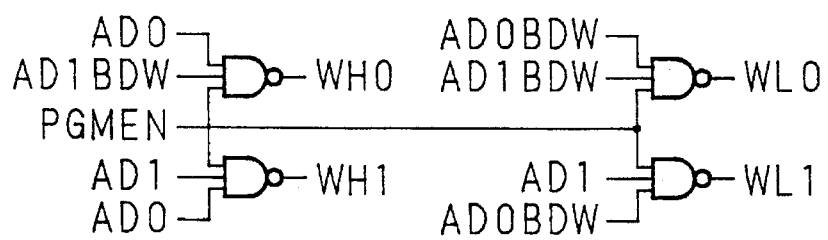
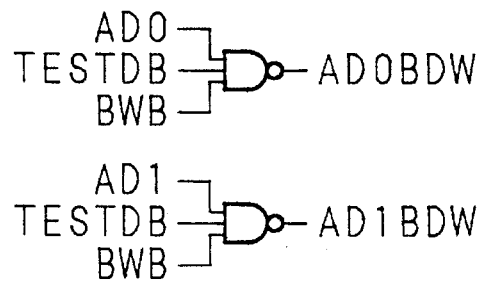

MICROCOMPUTER WITH MULTIPLE CPU'S ON A SINGLE CHIP WITH PROVISION FOR TESTING AND EMULATION OF SUB CPU'S

BACKGROUND OF THE INVENTION

1. Field of the Invention

The present invention relates, among microcomputers for data processing, specifically to a multi-CPU (MPU) system having a plurality of CPUs (Central Processing Unit) or MPUs (Microprocessor unit) mounted on a single chip, and particularly to a technique of testing sub CPUs (MPUs) thereof and a technique of constituting an emulation chip for the development of programs therefor.

2. Description of The Related Art

FIG. 1 through FIG. 4 schematically show an example of operation of a microcomputer program which is required to realize an environment for testing or debugging a multi-CPU system of the prior art.

The example of the prior art shown is a case of executing a program for the MN1880 series microcomputer made by Matsushita Electric Industrial Co., Ltd. The MN1880 series adopts a constitution wherein two sets of a CPU and a register are provided in the same memory space. File two CPUs will be called a CPU a and a CPU b, and FIG. 2 through FIG. 4 show schematic diagrams illustrative of the operation sequences of the CPU a and the CPU b in a time series.

FIG. 2 shows a state of the two CPUs executing instructions alternately. Specifically, as shown in the schematic diagram of FIG. 1, the program executed by the CPU a is constituted from a plurality of instructions IN1a, IN2a . . . IN16a and the program executed by the CPU b is constituted from a plurality of instructions IN1b, IN2b . . . IN16b. These instructions are stored in the same memory space with specific addresses being allocated thereto.

As shown in FIG. 2, these instructions are executed in such a sequence as the instruction IN1a of the CPU a is executed first, then the instruction IN1b of the CPU b is executed, followed by the execution of the instruction IN2a of the CPU a, the instruction IN2b of the CPU b, the instruction IN3a of the CPU a, the instruction IN3b of the CPU b, through the execution of the instruction IN16a of the CPU a and the instruction IN16b of the CPU b. Such a mode of operation by two CPUs to execute instructions alternately is called automatic swapping mode.

FIG. 3 and FIG. 4 show such an operation as the microcomputer switches the mode by executing a specific instruction thereby causing one of the CPUs to execute instructions continuously in a specified period of time. In FIG. 3, both CPUs are once reset thereby "WAITA=0, WAITB=0" is set to enter the automatic swapping mode, and the instructions are executed in the order of the instruction IN1a of the CPU a, IN1b of the CPU b, the instruction IN2a of the CPU a, IN2b of the CPU b, through the instruction IN5a of the CPU a and IN5b of the CPU b. At this point, the system exits the automatic swapping mode with "WAITB=1" being set to stop the CPU b, and thereafter instructions of the CPU a are executed in the order of IN6a, IN7a through IN10a.

In FIG. 4, both CPUs are once reset so that "WAITA=0, WAITB=0" is set to enter the automatic swapping mode, and the instructions IN1a of the CPU a and IN1b of the CPU b are executed. At this point, as the CPU a mode is requested, "WAITB=1" is set to stop the CPU b, and thereafter instructions of the CPU a are executed in the order of IN2a, IN3a through IN6a. Further, as CPU b mode is requested at this point, "WAITA=1, WAITB=0" is set to stop the CPU a, and thereafter instructions of the CPU b are executed in the order of IN2b, IN3b through IN6b. After this, the CPU a mode and the CPU b mode are alternately set similarly to the above, and some consecutive instructions of each CPU are executed alternately.

In such a system of the prior art, because two microcomputers operate in a time sharing scheme, there occurs no conflict in the access to the memory space. Therefore, when viewed from the memory space side, the two CPUs can make access to data stored in the memory at the respective timings without requiring the addition of a special control circuit. Thus when testing such a microcomputer, it is possible to test both CPUs by making access to bus signals which are activated in the time sharing scheme. Also with regard to the program developing environment, use of the same memory space enables it to emulate the two CPUs real-time simply by monitoring or controlling the memory space by means of an emulation controller.

However, although the example of the prior art described above is based on dual-CPU constitution, the two CPUs do not operate independently from each other concurrently, but are restricted to the time sharing operation. Thus the constitution has naturally a problem of limited speed of the CPU operation.

FIG. 5 through FIG. 10 show block diagrams of the constitution of a microcomputer H8/570 (microcomputer equipped with ISP) made by Hitachi Ltd., as another example of the prior art.

FIG. 5 through FIG. 8 are block diagrams illustrative of the overall constitution of the microcomputer H8/570 equipped with ISP wherein H8/500 is used as the main CPU and ISP blocks are provided in various peripheral function blocks. The ISP stands for intelligent Sub Processor, a kind of sub CPU wherein a plurality of functions can be programmed by built-in EPROM base. FIG. 9 and FIG. 10 are lock diagrams illustrative of the internal constitution of the ISP block. It is made in such a constitution that a program routine stored in a microprogram memory area which corresponds to a function No. specified by a programmable sequence generator (called SCM hereafter) is designated indirectly by means of an address register, so that the function defined by the program routine is executed.

The program of the ISP is a collection of short modules in principle, and provides a debugging environment by means of a software simulator, unlike the debugging environment of an ordinary microcomputer. A programmer checks each of the short modules having a single function, by means of the simulator to make sure that the module performs the desired function, and combines the modules according to a function table written in the SCM, thereby to achieve various functions. By writing the program which is completed as described above in the microprogram area comprising EPROM, SCM and address registers, the microcomputer which performs the intended functions is realized.

Because the ISP runs independently from and in parallel with the main CPU, use of the ISP makes it possible to perform highly real-time operation of the functions. However the concept of the ISP is programming through combination of simple functional modules, and therefore the ISP does not need the large scale program developing environment which is required by an ordinary microcomputer. For this reason, real-time debugging environment for the main CPU and the ISP is not provided in the microcomputer H8/570 which is equipped with the ISP.

As described above, a microcomputer of the conventional multi-CPU system wherein a plurality of CPUs are mounted on a chip has various limitations on providing special terminals for address bus, data bus and control bus exclusively for the sub CPU in order to facilitate testing of the microcomputer or program development for the sub CPU, because of the problem of chip layout, design problem of a multi-pin package, and other factors. Attempts of time sharing control through assignment of a plurality of functions to a terminal also encounter such limitations as the timing margin and problems such as complicated circuit, and therefore it has been very difficult to debug the target program by simultaneously operating a plurality of CPUs or MPUs mounted on a chip.

SUMMARY OF THE INVENTION

The present invention has been made to solve such problems as described above, and has an object of providing a technique of testing a sub CPU block or an emulation chip for the program development, by using the test technique employed in a conventional microcomputer having a single CPU or the technique of constituting the emulation chip, without providing special control terminals for the sub CPU.

The microcomputer according to the invention as claimed in claim 1 has a main CPU capable of accessing a main memory area via a main CPU bus, at least one sub CPU capable of accessing a sub memory area via a sub CPU bus, and control means for switching the memory area to make the memory area on the sub CPU side accessible via the main CPU bus by means of a control register which is accessible from the main CPU. While the main CPU bus can be accessed from the main CPU as a matter of course, access can also be made in a process similar to that of the prior art wherein the main CPU bus is separated from the main CPU and access is made directly from an external port of the chip, namely in the bus isolation mode.

The sub CPU according to the invention as claimed in claim 1 is made by providing the microcomputer with means of generating sub CPU reset vector exclusive for testing purpose. That is, when the sub CPU is reset under such a condition as the test mode is set in a control register which is accessible from the main CPU, a test reset vector different from that for ordinary resetting is loaded on the program counter, and a program having a start address corresponding to the test reset vector starts to run. For the test reset vector, hard logic which is fixed in advance, data written in a ROM or a value stored in an exclusive register is loaded onto the program counter.

In the microcomputer according to the invention, the memory of the sub CPU has, in addition, a buffer provided on each of two lines branching the sense amplifier output, one being connected to an access line on the sub CPU side and another connected to a bus of the main CPU side.

The microcomputer of the invention enters a mode wherein only an internal programmable memory (EPROM, for example) portion is made accessible by converting control signals, supplied from a plurality of external terminals, inside the chip, while the microcomputer is provided with controlling means for integrating the programmable memory area on the sub CPU side into the same continuous space integral with the memory area of the main CPU. During the normal operation mode (microcomputer mode), the memory area of the main CPU and the memory area of the sub CPU are separated and independent from each other and are accessible from the main CPU and the sub CPU, respectively.

In the microcomputer of the invention as claimed in claim 2, the sub CPU has a circuit for always comparing the program counter and the break address storing register by means of hardware and detects a break when both values are in agreement, and a control circuit for branching the program to a break vector when a break is detected. For the break vector, such means as loading hard logic which is fixed in advance, data written in a ROM or a value stored in an exclusive register may be employed.

In the microcomputer according to the invention, the sub CPU has, in addition, a circuit for counting the number of detected agreements and a circuit to generate a break interruption only when a target address has been accessed a predetermined number of times.

The microcomputer of the invention is capable of executing STOP instruction to stop the execution of the sub CPU program, and, under the control of the main CPU, is capable of executing return instruction (RTB: Return from Break) by which the stop state of the sub CPU program is released and the routine can return to the original routine from which the routine is branched. The RTB instruction may also be executed as an instruction included in software program.

In the microcomputer according to the invention, the sub CPU, in addition, realizes an emulation chip for program development by constituting the program memory area entirely from RAMs. Further in the main CPU bus, ROM of the main CPU is removed and the exclusive terminals of the existing technique are provided while feeding the program real-time from an exclusive emulator controller provided on the outside, thereby enabling it to provide a program developing tool for the sub CPU.

In the microcomputer according to the invention as claimed in claim 1, while the memory area of the sub CPU side can usually be accessed only from the sub CPU, it can also be accessed from the main CPU during test. This makes it possible to test the operation of reading from a mask ROM or EPROM of the sub CPU. Further, when RAM which allows writing data thereon as well as reading therefrom is provided, logic test of the sub CPU side can be carried out after supplying a program to test the sub CPU from the main CPU bus to the RAM, and an effect to be described later is also realized.

In the microcomputer according to the invention, it is made possible to arrange EPROM in the memory area of the sub CPU and writing onto the EPROM is made possible similarly to the EPROM of the main CPU area. That is, it is made possible to provide EPROM having writing window which can be rewritten, or OTP (One Time Programmable) ROM whereon the user can write programs, for the sub CPU portion as well as the main CPU portion.

In the microcomputer according to the invention as claimed in claim 1, not only the sub CPU can be tested by accessing it via the main CPU bus, but also the test reset vector can be rewritten from the main CPU side. Therefore execution of instructions can be started at an intermediate point of a ROM or EPROM of the program area, enabling it to be used for program debugging or analysis of a defective product.

In the microcomputer according to the invention as claimed in claim 2, because execution of a program in the sub CPU can be broken by means of hardware break, intermediate result of the program execution can be checked by interrupting the program in the course of its execution and reading the intermediate result of the execution from the interface register between the sub CPU and the main CPU by means of a break routine. It is also effective in debugging the program written in the EPROM or examining program steps taking place in the mask ROM.

In the sub CPU, it is made possible to make a break interrupt only when a loop portion of the program has been executed repetitively a predetermined number of times.

In the microcomputer according to the invention, even when the RAM size of the sub CPU is restricted to a certain extent, test can be resumed under the same condition after interrupting the execution of a test program in the course of its execution by means of the STOP function, by rewriting the contents of the RAM by means of the function of claim 1 and loading a new program.

In the microcomputer according to the invention, the target program of the sub CPU is booted into the RAM from the main CPU bus by means of the function described in claim 1, thereby to execute the program by the reset function. This enables it to emulate the program under development.

Also break interrupt of the program execution by means of the function of claim 2, enables it to interrupt the program execution at a point of attention and read the register value at the point from the main CPU bus via RAM or a particular register. Moreover, instructions that follow the break point can be executed by the RTB instruction, and the debugger function to be used during program development can be realized by controlling of the emulation chip from the outside.

In the microcomputer, because output from the memory on the sub CPU side branches into the sub CPU side and main CPU side after being outputted from the sense amplifier which makes analog-like operation, read-out characteristic can be made equivalent and also increasing area can be suppressed at the stage of layout design.

The above and further objects and features of the invention will more fully be apparent from the following detailed description with accompanying drawings.

BRIEF DESCRIPTION OF THE DRAWINGS

FIG. 1 is a schematic diagram illustrative of a storing state of program in the memory of a conventional multi-CPU system.

FIG. 31 is a schematic diagram illustrative of the memory area in an embodiment of the microcomputer of the invention.

FIG. 35 is a schematic diagram illustrative of the states of inputs to mode setting terminals for each of the modes at the time of EPROM mode of the microcomputer of the invention.

FIG. 47 is a schematic diagram illustrative of the memory allocation of the emulation chip of the microcomputer incorporating the sub CPU of the microcomputer of the invention.

FIG. 48A and FIG. 48B are schematic diagrams illustrative of the memory allocation of the emulation chip of the microcomputer incorporating the sub CPU of the microcomputer of the invention.

FIG. 56 is a circuit diagram illustrative of the constitution of a circuit for generating ROM read-out timing signal RDROMZ and EPROM writing timing signal PGMEM.

DESCRIPTION OF THE PREFERRED EMBODIMENTS

Now the invention will be described in detail below with reference to the drawings illustrative of the preferred embodiments.

Figure 2:
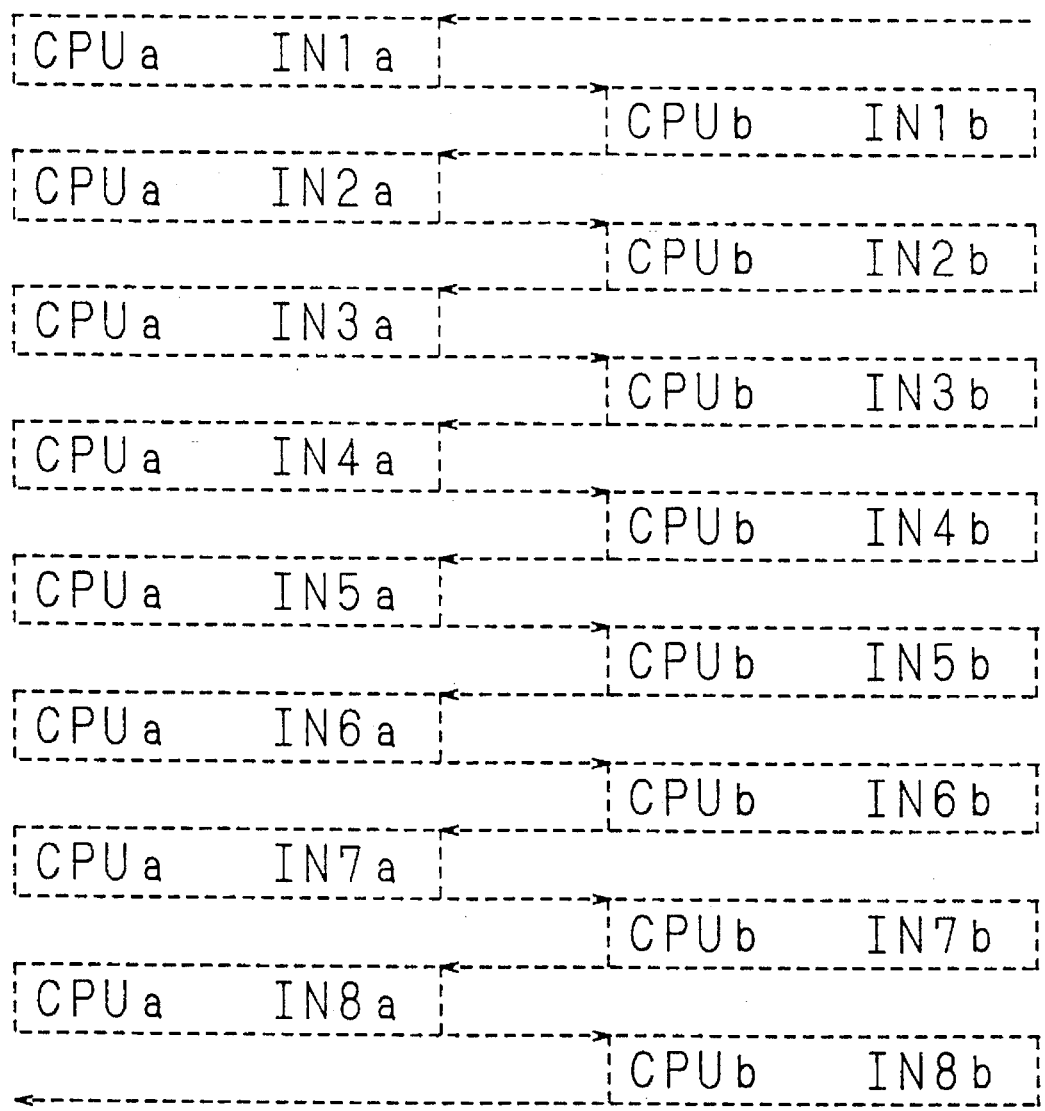
FIG. 2 is a schematic diagram illustrative of an example of operation for the execution of a microcomputer program required to realize an environment for testing or debugging the conventional multi-CPU system.
Figure 3:
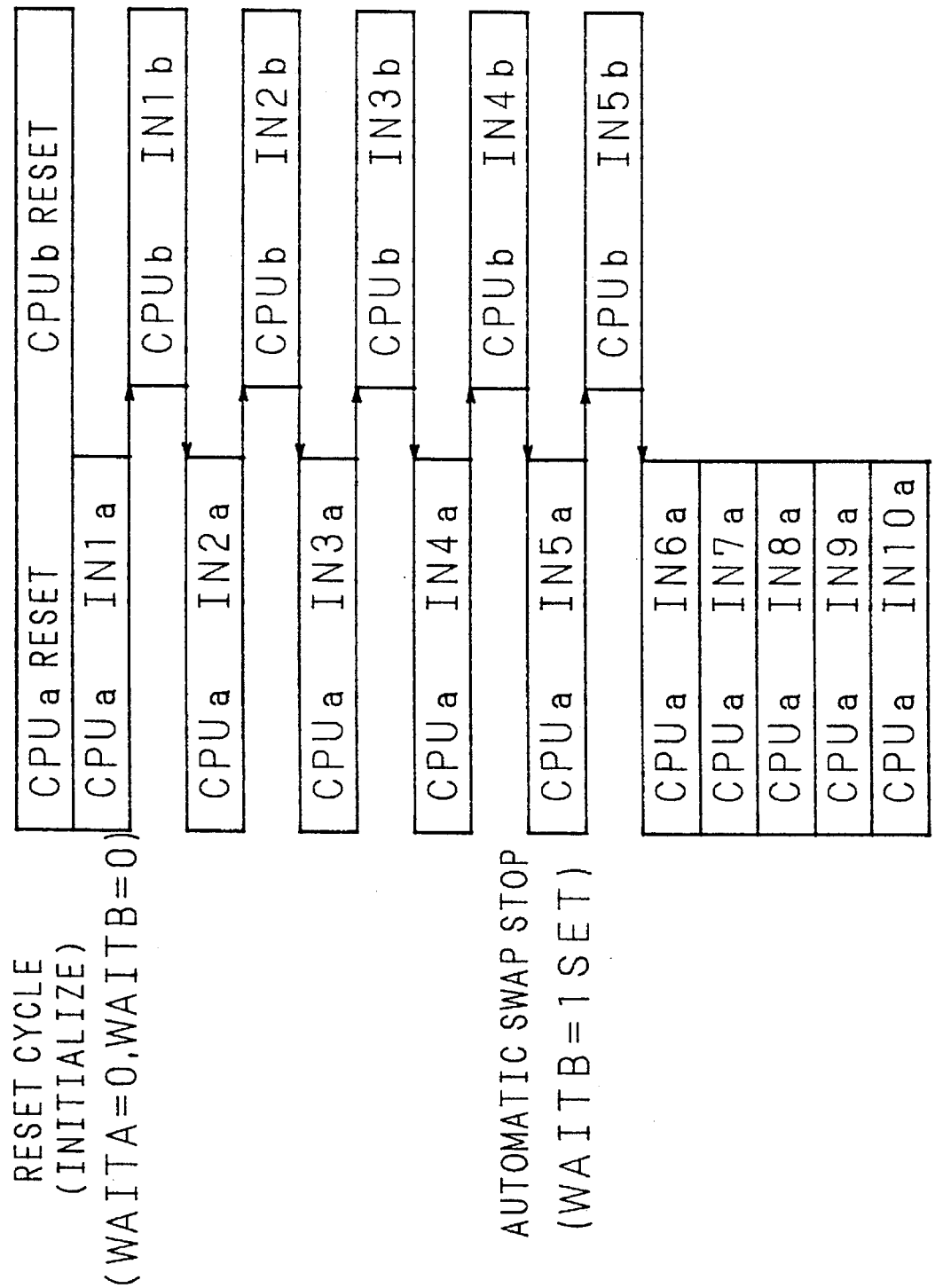
FIG. 3 is a schematic diagram illustrative of an example of operation for the execution of a microcomputer program required to realize an environment for testing or debugging the conventional multi-CPU system.
Figure 4:
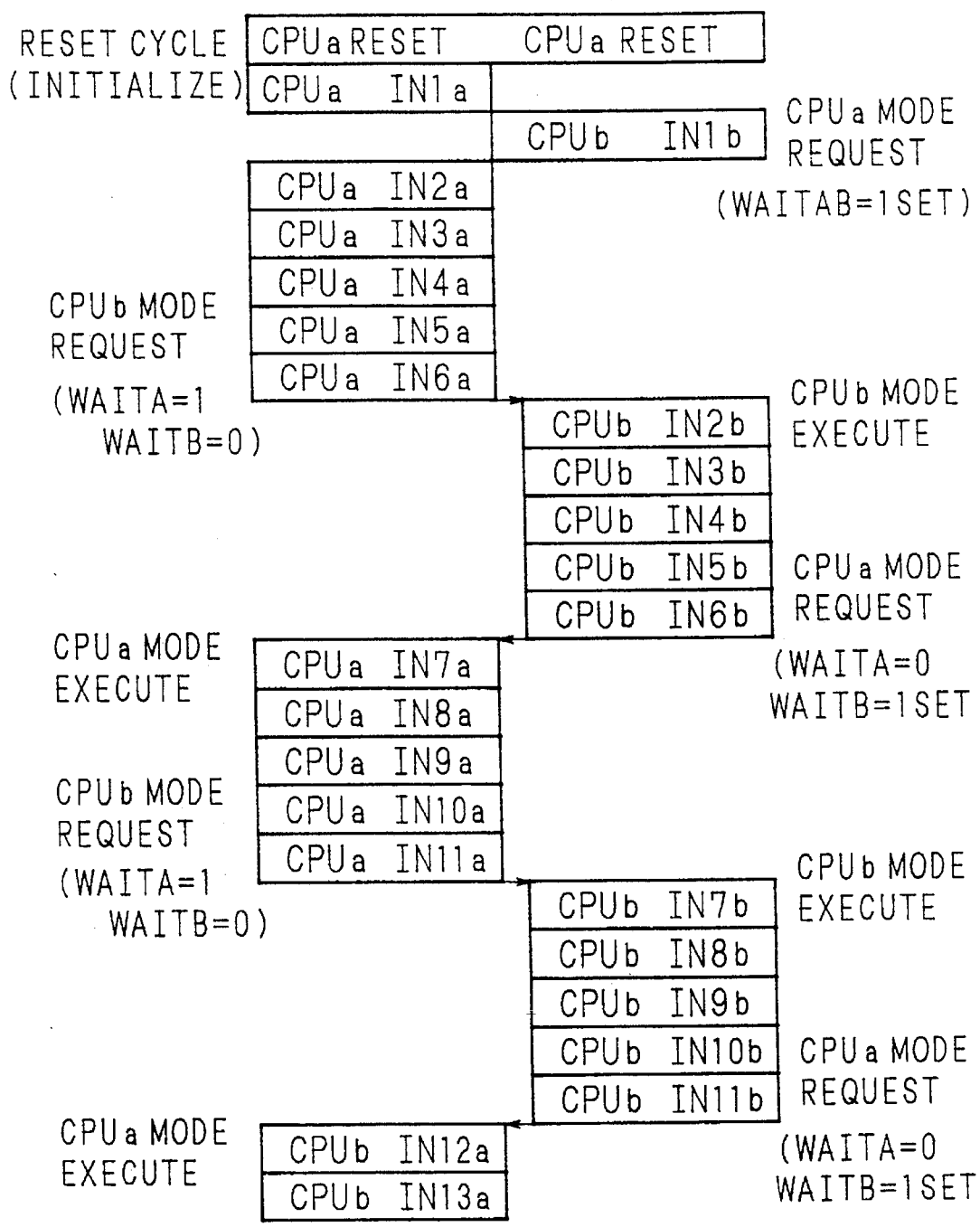
FIG. 4 is a schematic diagram illustrative of an example of operation for the execution of a microcomputer program required to realize an environment for testing or debugging the conventional multi-CPU system.
Figure 5:
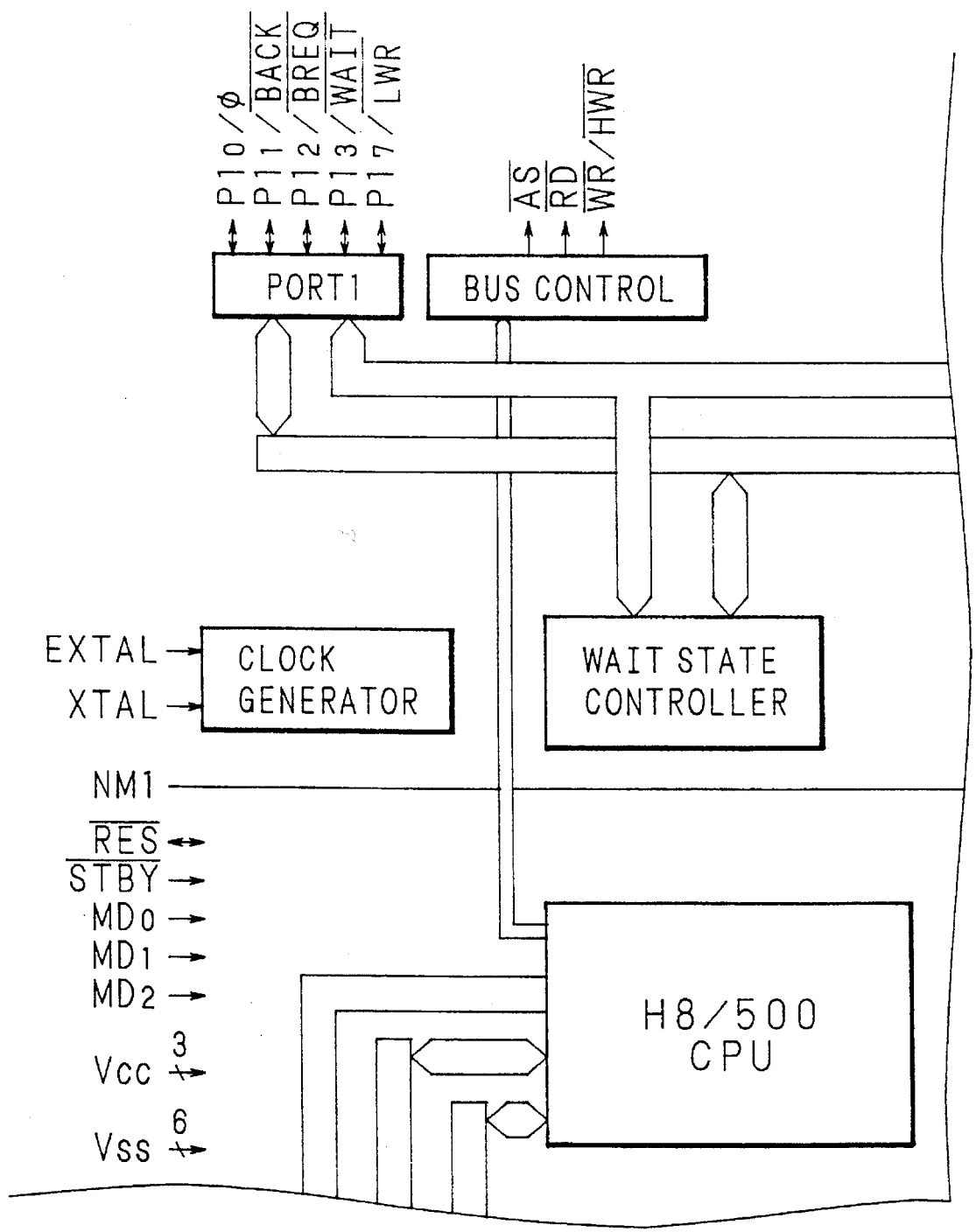
FIG. 5 is a block diagram illustrative of an example of constitution of a conventional microcomputer equipped with ISP.
Figure 6:
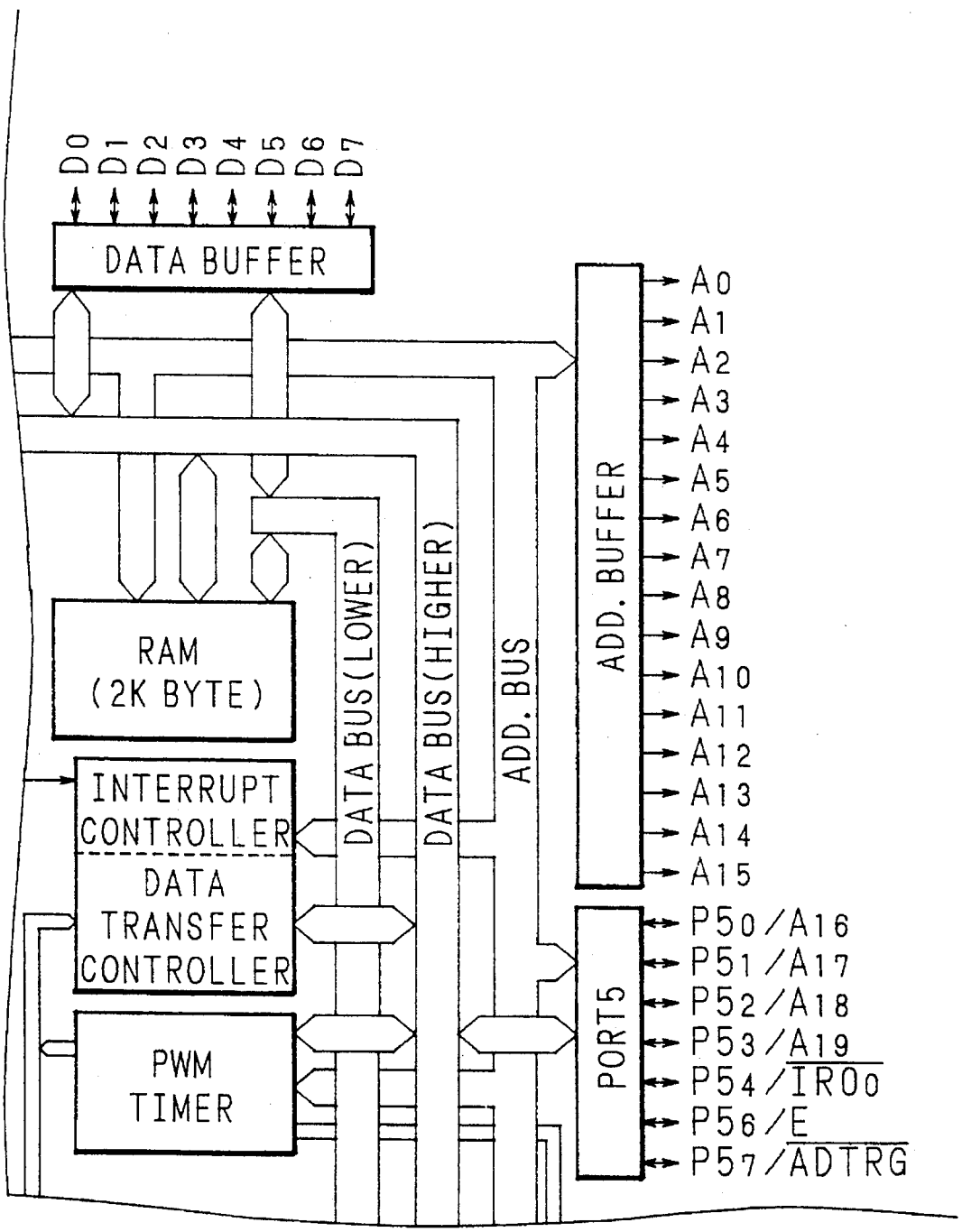
FIG. 6 is a block diagram illustrative of an example of constitution of a conventional microcomputer equipped with ISP.
Figure 7:
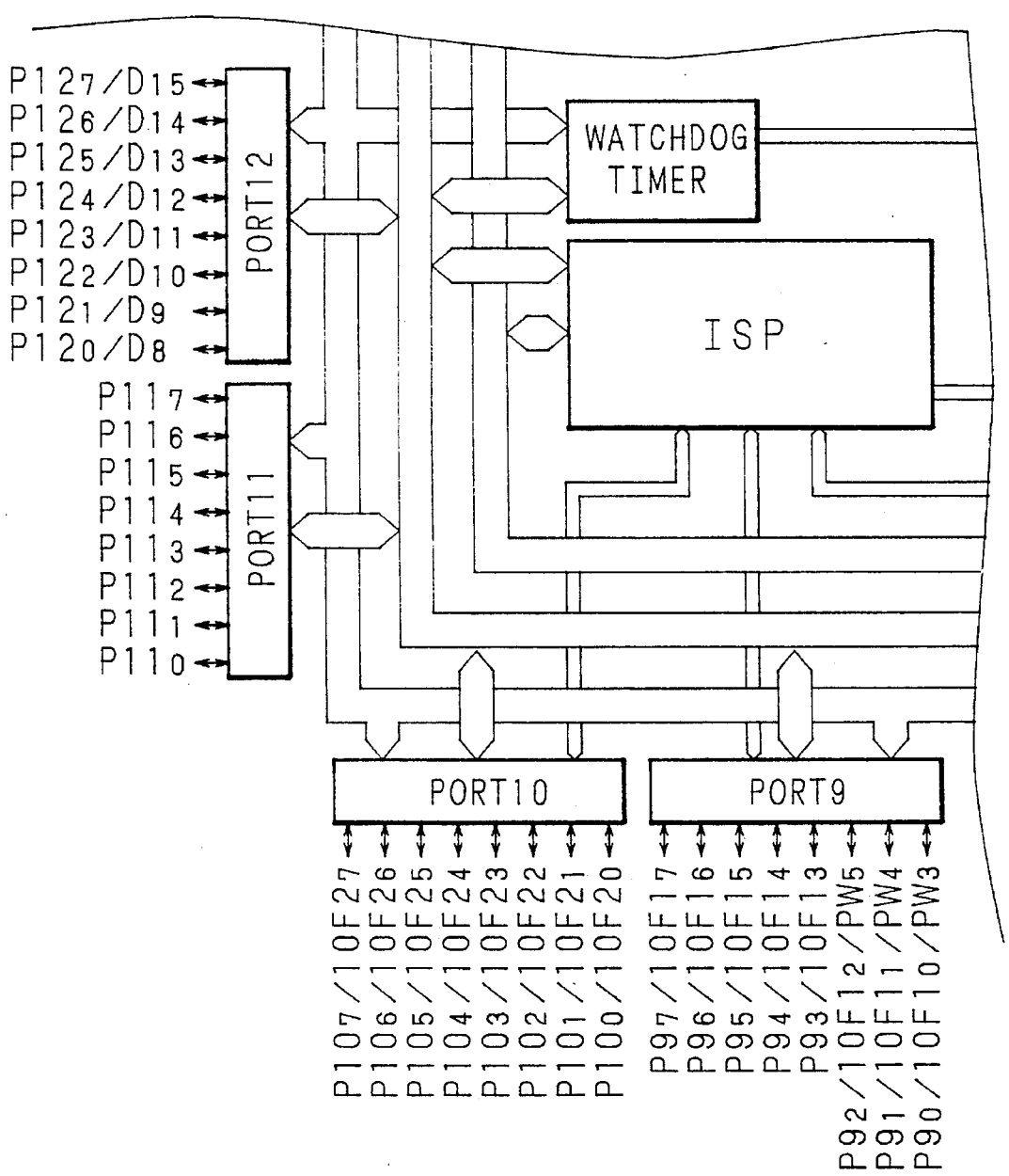
FIG. 7 is a block diagram illustrative of an example of constitution of a conventional microcomputer equipped with ISP.
Figure 8:
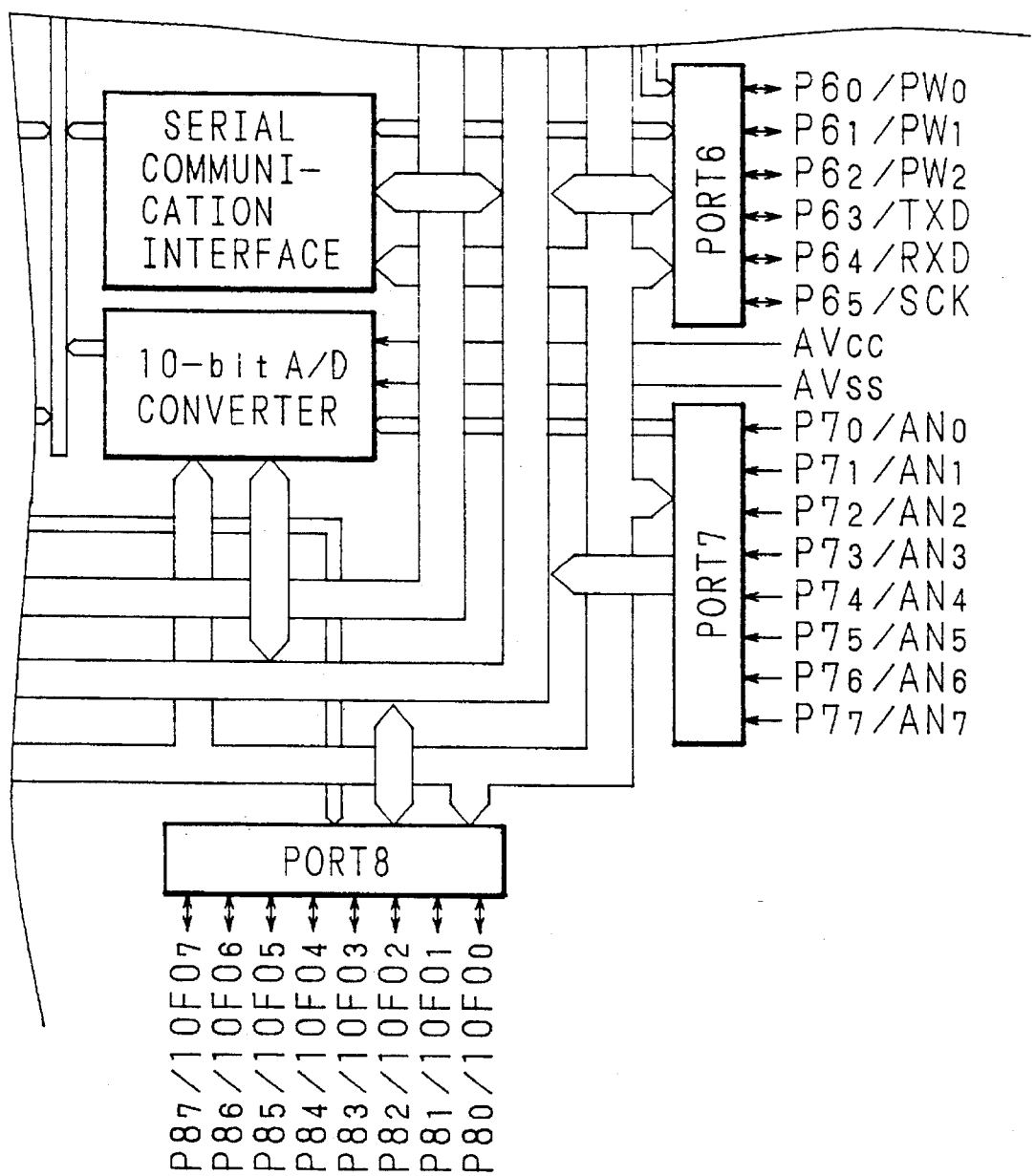
FIG. 8 is a block diagram illustrative of an example of constitution of a conventional microcomputer equipped with ISP.
Figure 9:
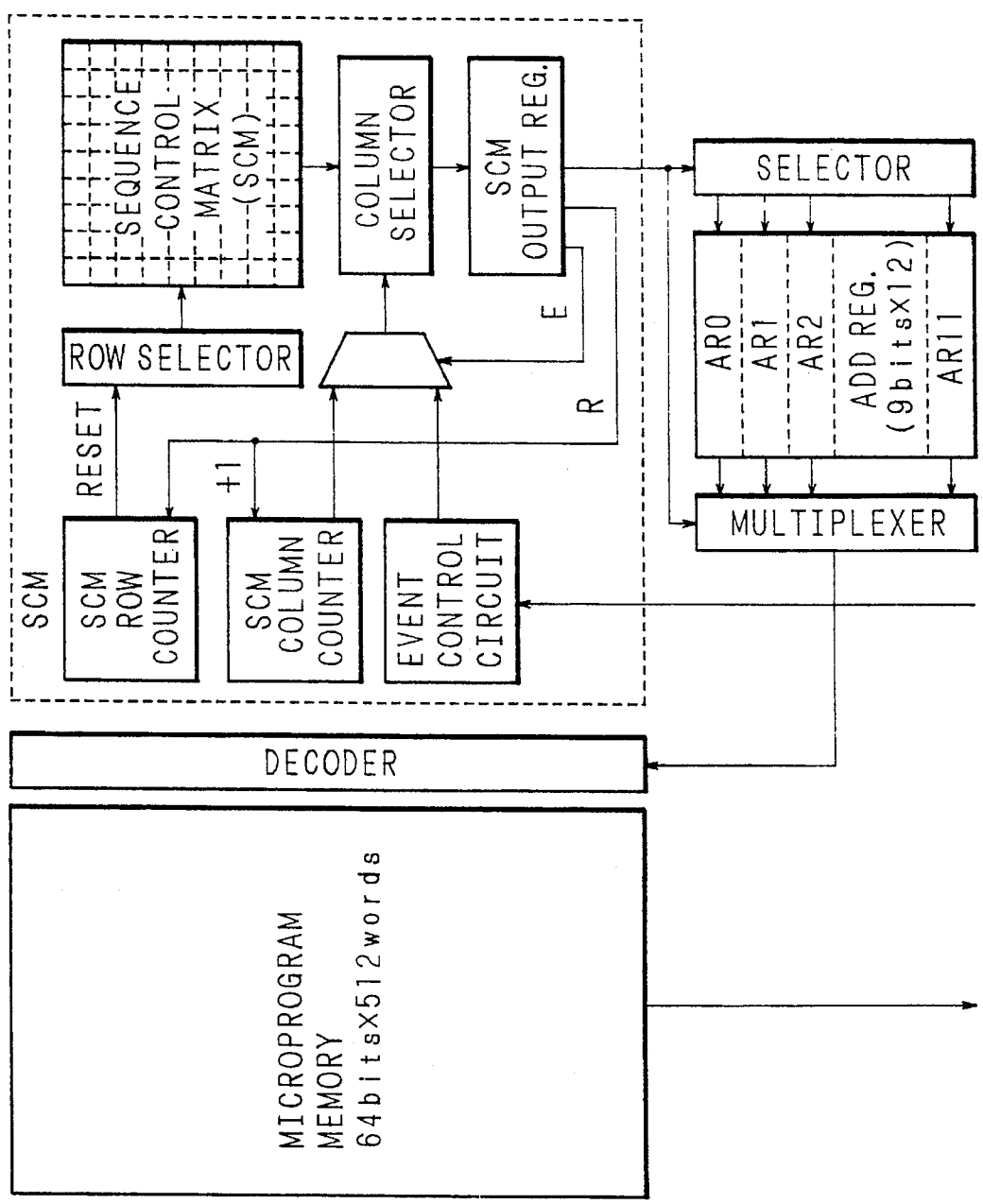
FIG. 9 is a block diagram illustrative of an example of constitution of the ISP of the conventional microcomputer equipped with ISP.
Figure 10:
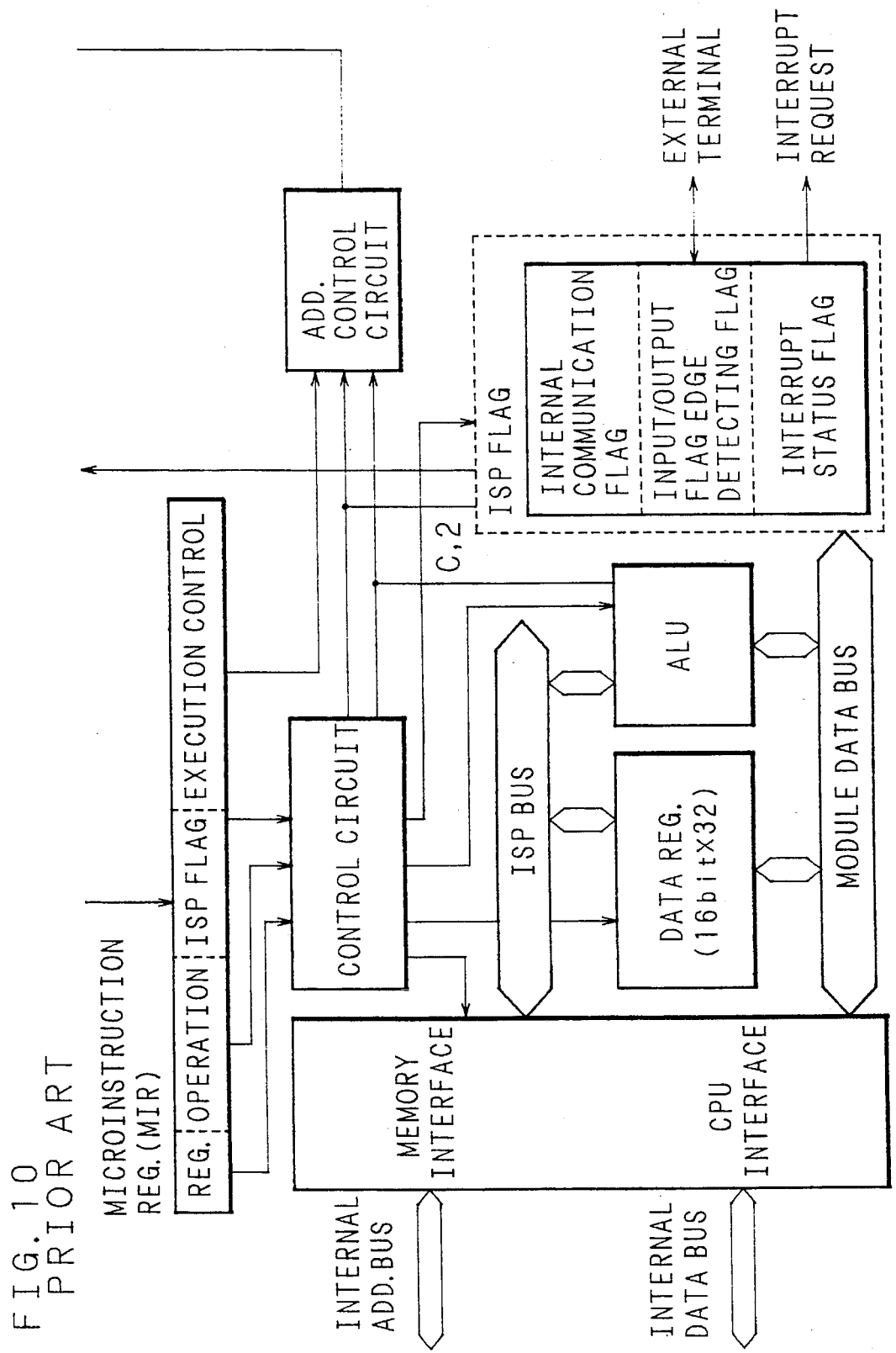
FIG. 10 is a block diagram illustrative of an example of constitution of the ISP of the conventional microcomputer equipped with ISP.
Figure 11:
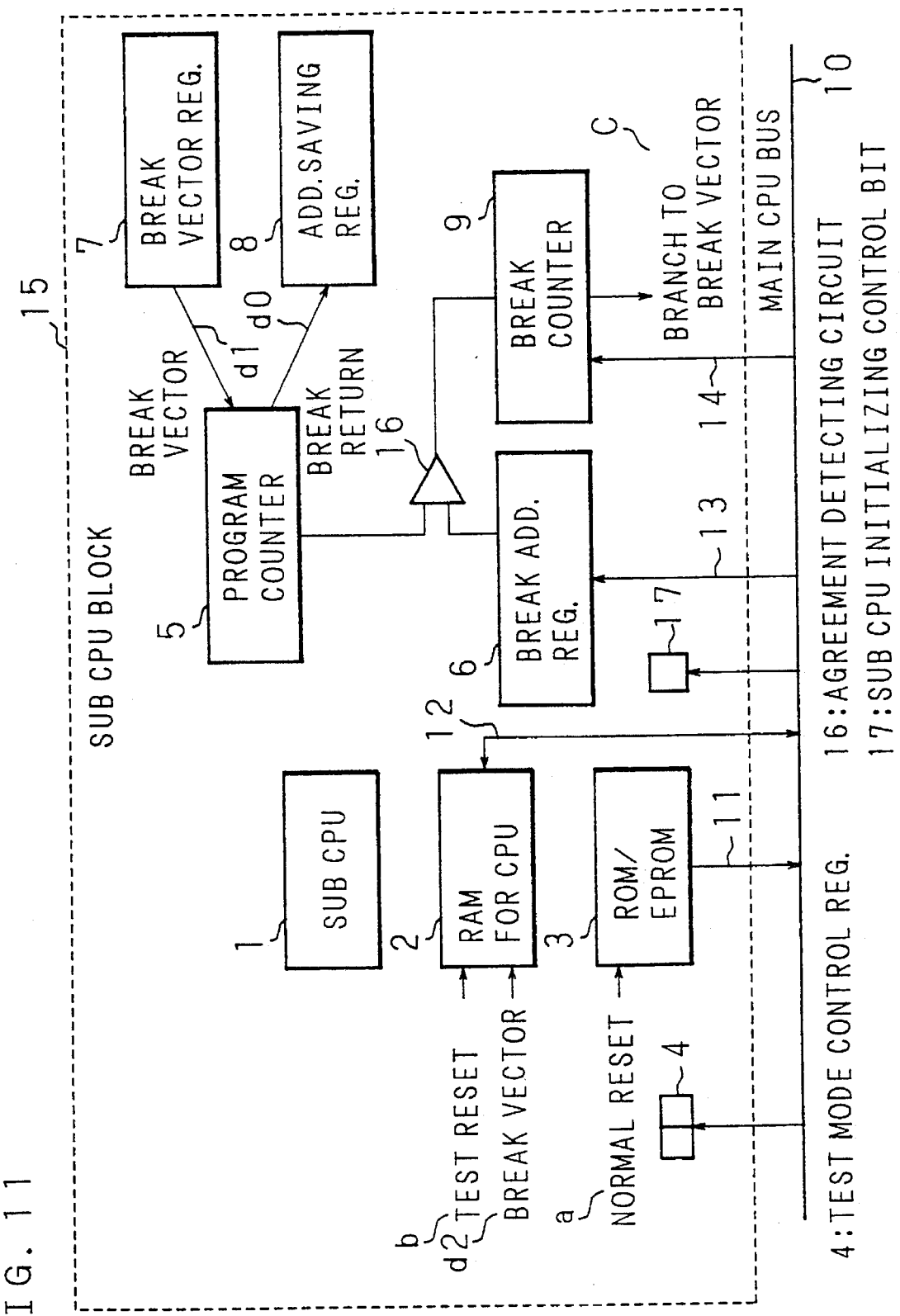
FIG. 11 is a block diagram illustrative of the constitution of control portions of a testing circuit and a debugging circuit of an on-chip sub CPU in an embodiment of the microcomputer according to the invention.

In FIG. 11, numeral 15 denotes the entire sub CPU portion which will be called the sub CPU block hereafter.

Numeral 1 denotes a main portion of the sub CPU (simply called a sub CPU hereafter) which includes a plurality of registers, an arithmetic and logic unit and peripheral function units.

Numeral 2 denotes a RAM for the sub CPU 1 and numeral 3 denotes ROM or EPROM (called a ROM/EPROM hereafter) for storing target program of the sub CPU 1.

Numeral 4 denotes a test mode control register for the sub CPU 1 and numeral 17 denotes an initialization control bit of the sub CPU 1, both being able to be rewritten from the main CPU to be described later. Details of these will be described later with reference to FIG. 23.

Numeral 5 denotes a program counter for the sub CPU 1, 6 denotes a break address register for storing a break address at detecting a break point, 7 denotes a break vector register for storing the branch destination address at the time of break, and 8 denotes an address saving register for saving data of the address where the break took place.

Numeral 16 denotes an agreement detecting circuit which compares the content (PC value) of a program counter 5 and the content, namely a break address, of the break address register 6 to detect whether they agree or not, and is constituted from an exclusive logical sum circuit of the same bit width of the program counter 5. The number of times of agreement is detected by the agreement detecting circuit 16 is counted by a break counter 9.

Figure 12:
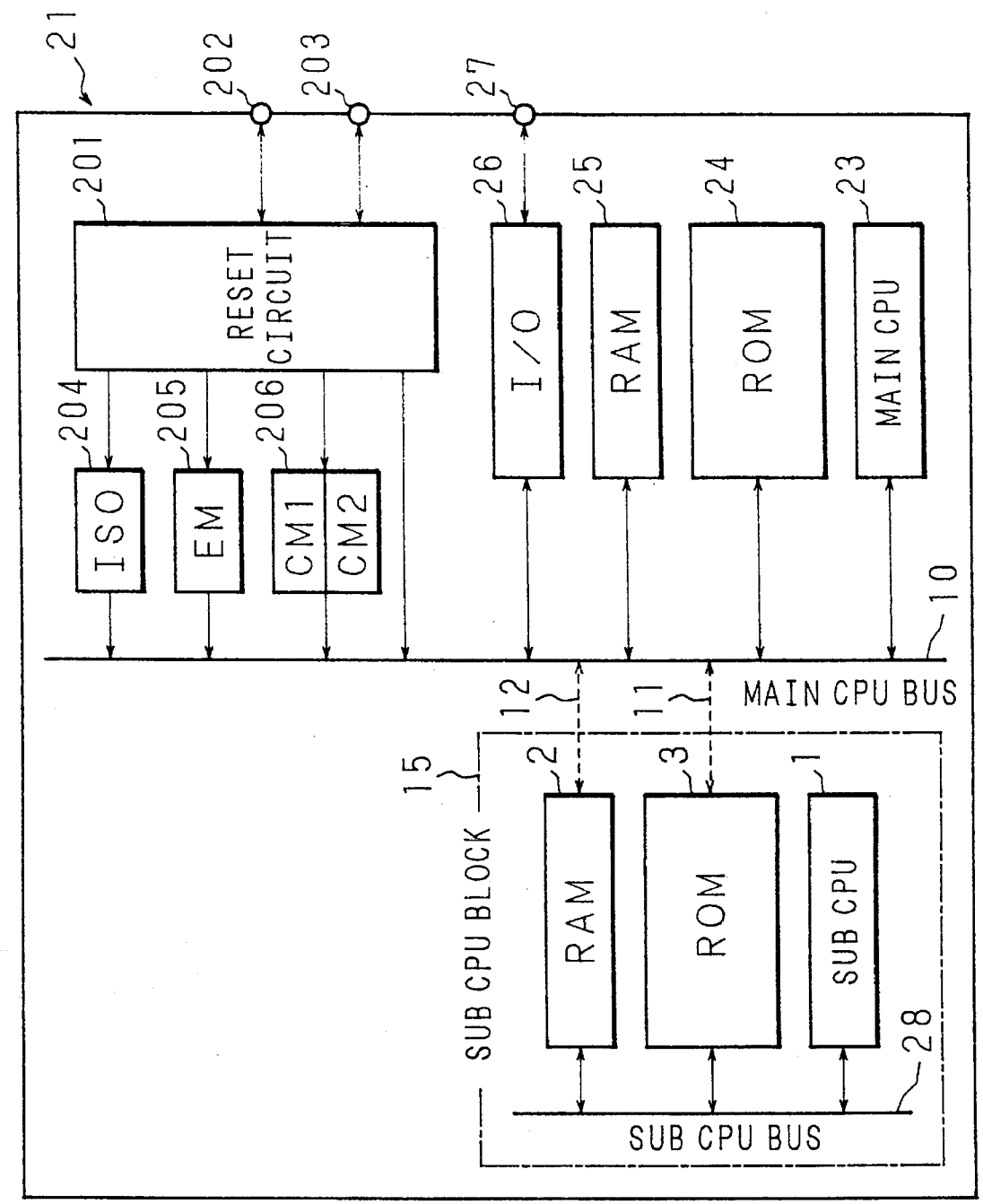
FIG. 12 is a schematic diagram illustrative of the rough constitution of the overall chip including the sub CPU of an embodiment of the microcomputer according to the invention.
Figure 13:
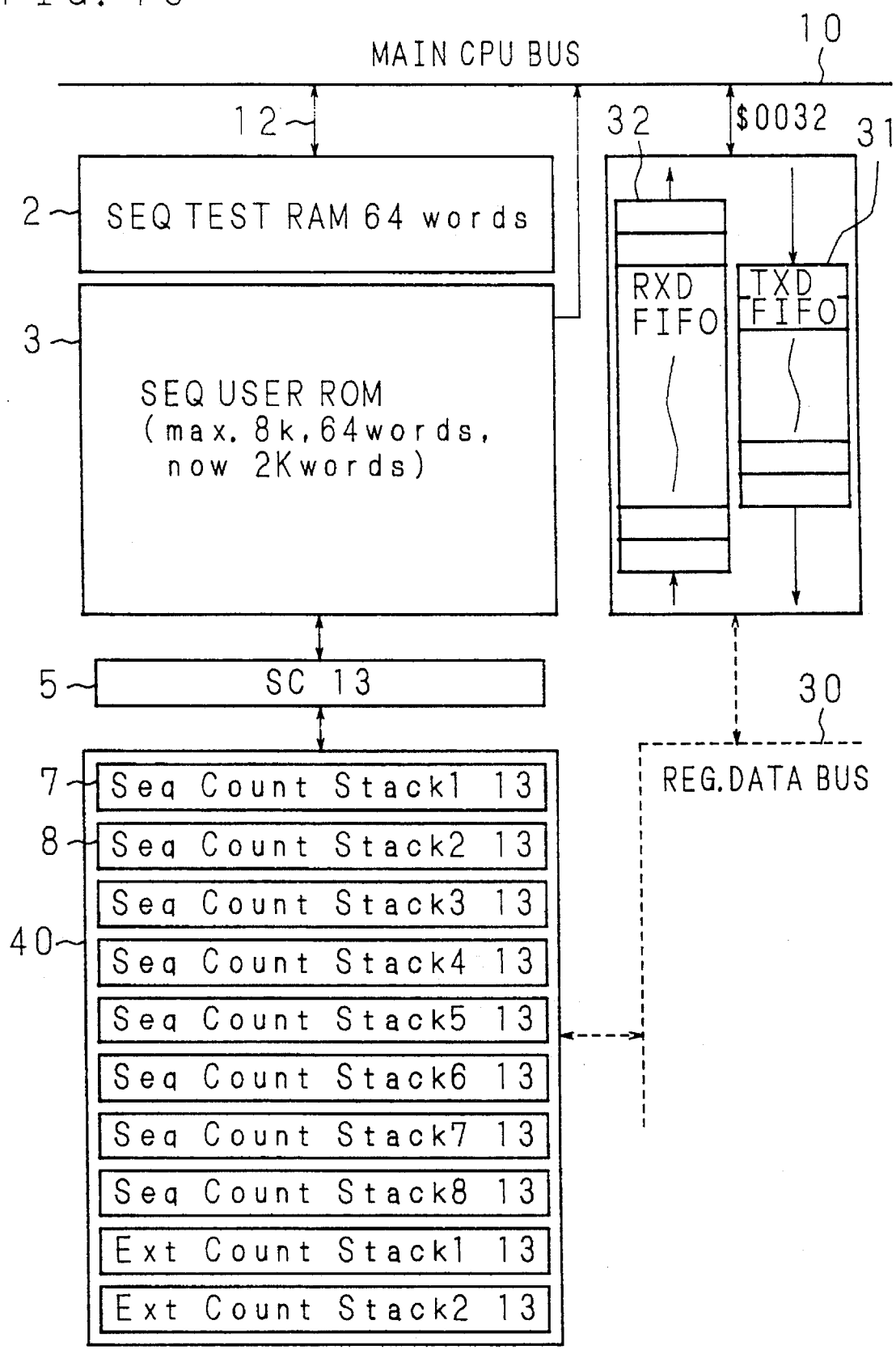
FIG. 13 is part of a block diagram illustrative of the constitution of registers in the sub CPU of an embodiment of the microcomputer according to the invention.
Figure 14:
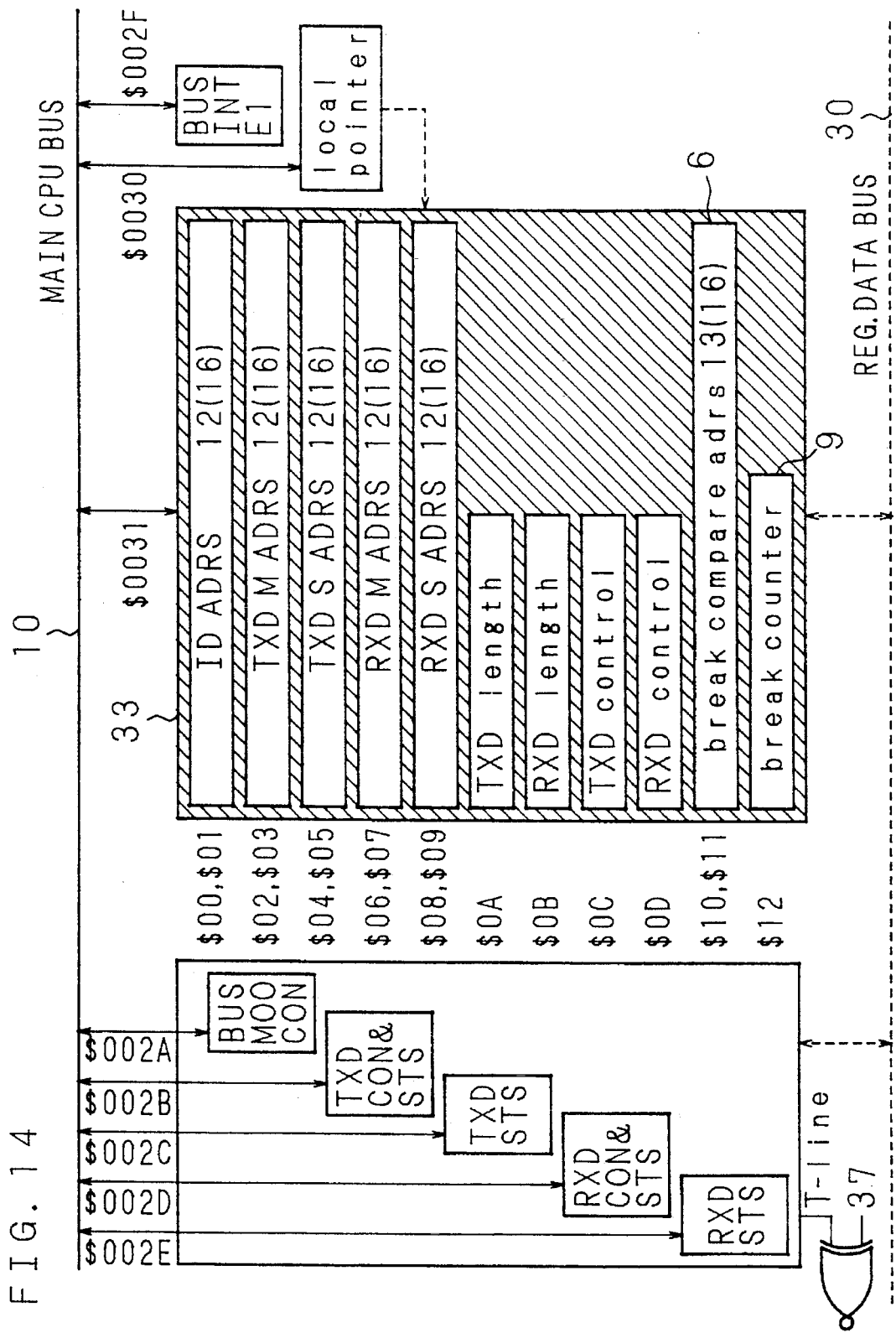
FIG. 14 is part of a block diagram illustrative of the constitution of registers in the sub CPU of an embodiment of the microcomputer according to the invention.
Figure 15:
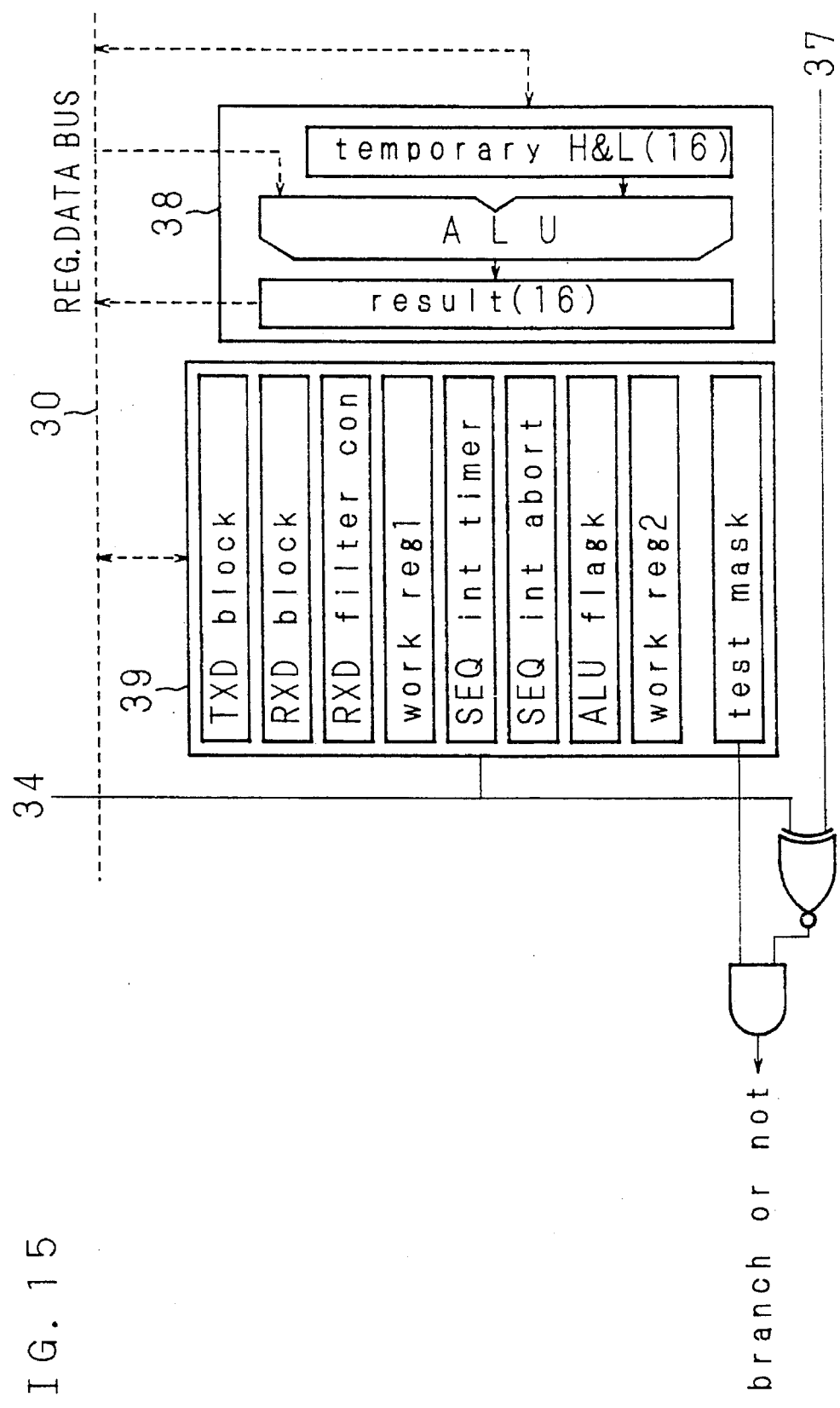
FIG. 15 is part of a block diagram illustrative of the constitution of registers in the sub CPU of an embodiment of the microcomputer according to the invention.
Figure 16:
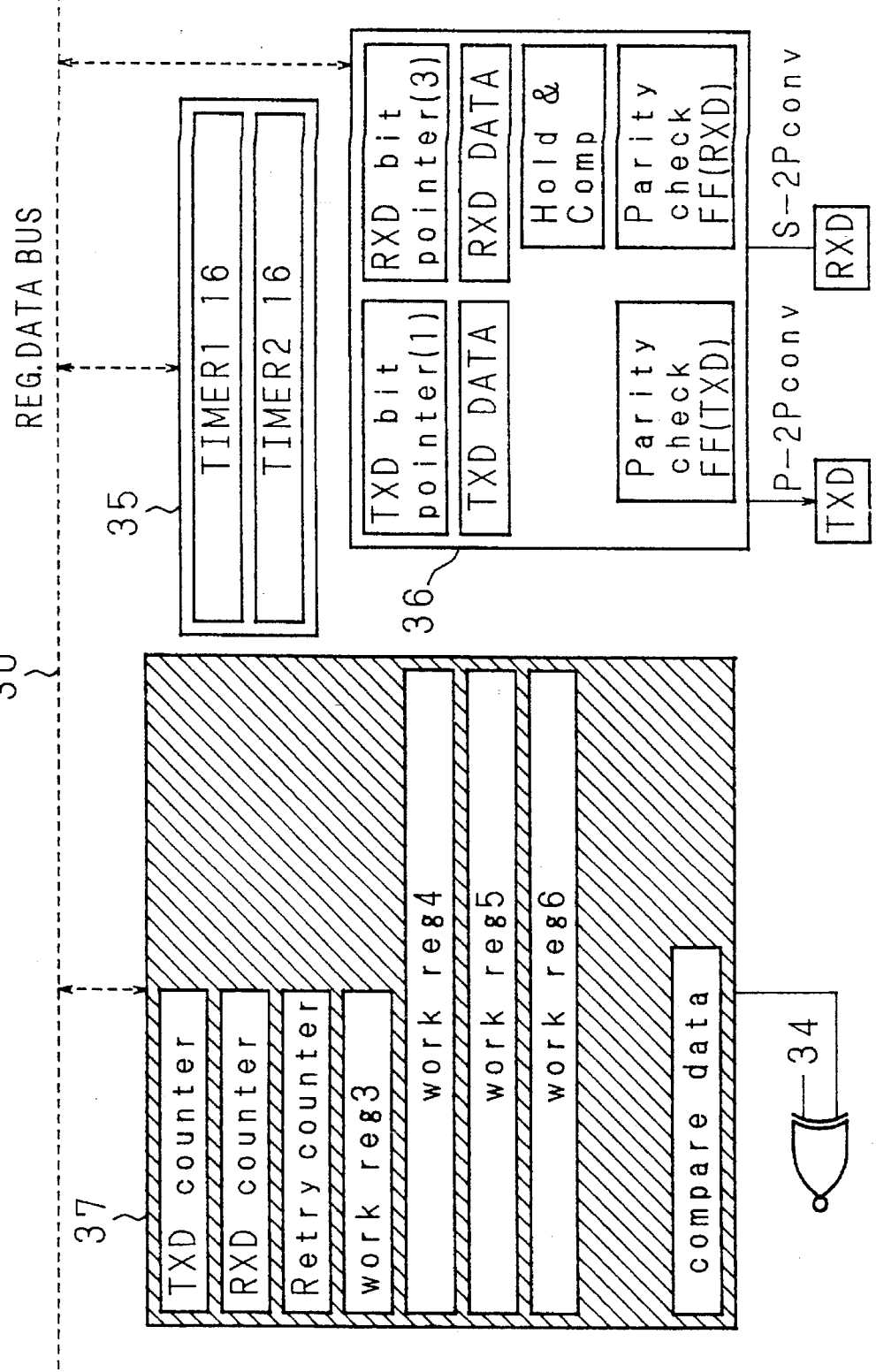
FIG. 16 is part of a block diagram illustrative of the constitution of registers in the sub CPU of an embodiment of the microcomputer according to the invention.

Numeral 10 denotes a main CPU bus which connects the sub CPU block 15 shown in FIG. 11 and the main CPU not shown in FIG. 11 (see FIG. 12).

Numeral 11 denotes a line for accessing the ROM/EPROM 3 of the sub CPU 1 from the main CPU bus 10, numeral 12 denotes a line for accessing the RAM 2 from the main CPU bus 10, numeral 13 denotes a line for accessing the break address register 6 from the main CPU bus 10, and numeral 14 denotes a line for accessing the break counter 9 from the main CPU bus 10.

FIG. 12 is a block diagram schematically illustrative of the overall constitution of an embodiment of the microcomputer of the invention configured on a single chip.

In FIG. 12, numeral 21 denotes the entire one-chip microcomputer, namely an LSI chip whereon the sub CPU block 15 shown in FIG. 11 is constituted on-chip manner as described previously.

Numeral 23 denotes the main CPU, numerals 24, 25, 26, 27 denote peripheral circuits and external input/output terminals such as a ROM, a RAM, an input/output (I/O) ports for the main CPU 23. These peripheral circuits 24, 25, 26 exchange data with each other or with the sub CPU block 15 by means of the main CPU bus 10.

Numeral 28 denotes a sub CPU bus connected to the functional circuits such as the sub CPU 1, the RAM 2, the ROM/EPROM 3 provided in the sub CPU block 15 to facilitate data exchange between thereof. A feature characteristic of the invention is such a constitution thereof as the memory areas dedicated to the sub CPU 1 such as the RAM 2 and the ROM/EPROM 3 on the sub CPU 1 side are connected to the main CPU bus 10 with the data access lines denoted by numerals 11, 12 during a particular mode.

Numeral 202 denotes a reset terminal whereto a reset signal is inputted from the outside of the LSI chip 21, numeral 203 denotes a mode setting terminal whereto a mode setting signal is inputted from the outside of the LSI chip 21. Signals which are fed through these terminals 202 and 203 are inputted to the reset circuit 201.

Upon receipt of the reset signal, the reset circuit 201 outputs it to the main CPU bus 10 to make the whole system reset. When a mode setting signal specifying the isolation mode is inputted, the reset circuit 201 sets an isolation mode register (ISO) 204. When a signal specifying the EPROM mode is inputted, the reset circuit 201 sets an EPROM mode register (EM) 205. When a mode setting signal specifying the CPU mode is inputted, the reset circuit 201 sets a CPU mode register (CM1, CM2) 206. Values of these mode registers 204, 205, 206 are outputted to the main CPU bus 10.

A technique for specifying the EPROM mode is disclosed in U.S. Pat. No. 5,113,093.

Although peripheral functions such as timer and SI/O which are provided in ordinary microcomputers are omitted in FIG. 12, it needs not to say that they are provided on the main CPU 23 side as well as on the sub CPU 1 side, and are connected to the respective CPU buses 10 and 28.

FIG. 13, FIG. 14, FIG. 15 and FIG. 16 are block diagrams illustrative of the constitution of registers provided in the sub CPU block 15 of an embodiment of the microcomputer of the invention.

In the microcomputer of the invention, a number of registers exist in the sub CPU 1, and 64 register spaces are provided in the embodiment shown in FIG. 13, FIG. 14, FIG. 15 and FIG. 16.

In FIG. 13, FIG. 14, FIG. 15 and FIG. 16, numeral 30 denotes a register data bus provided in the sub CPU 1. Numerals 31, 32, 33 and 34 denote register groups, all being used in data exchange between the main CPU 23 and the sub CPU 1. Specifically, numeral 31 denotes an FIFO register (TXD FIFO) used in sending data from the main CPU 23 to the sub CPU 1, 32 denotes an FIFO register (RXD FIFO) used in sending data from the sub CPU 1 to the main CPU 23 opposite to the above, 33 denotes a register group used to exchange data of 1-byte or 2-byte length, and 34 denotes a control register group designed for specialized application functions allocated for each bit.

For the registers denoted by numerals 33, 34, data transfer direction is determined at designing for every register or for each bit of the register, and therefore exclusive arbitration hardware is not provided.

Numeral 35 denotes two 16-bit timer circuits directly connected to the sub CPU bus 28. Numeral 36 denotes a serial transmitting/receiving circuit connected to the sub CPU bus 28. Numeral 37 denotes a simple register group which can be accessed only from the sub CPU 1 side, 38 denotes an ALU of the sub CPU 1, 39 denotes a control register group designed for specialized application functions allocated for each bit which can be accessed from the sub CPU 1 side only.

Although numeral 5 denotes the program counter of the sub CPU 1 as described previously, it will be called a sequence counter and abbreviated as SC hereafter. Numeral 40 denotes a special register which allows easy exchange of data with the SC 5 and is called a stack. However, this is not a usual push-down stack but a simple register capable of directly saving and restoring the data of the SC 5.

FIG. 17 through FIG. 20 are block diagrams illustrative of the specific constitution of the inside of the sub CPU block 15 shown in the block diagram of FIG. 11.

Figure 17:
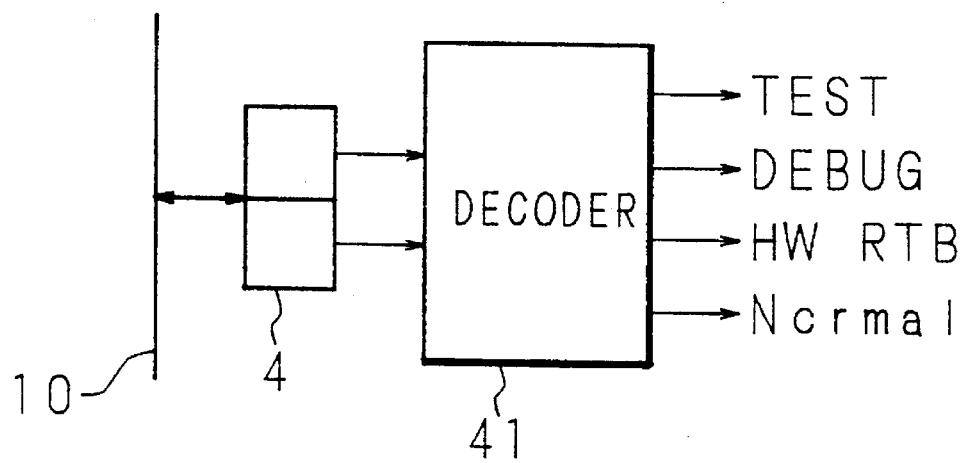
FIG. 17 is a circuit diagram illustrative of the specific constitution inside the sub CPU and a testing circuit and an emulation circuit thereof of the microcomputer of the invention shown in FIG. 11.

In FIG. 17, numeral 41 denotes a decoder which decodes the output of the 2-bit test mode control register 4 of the sub CPU 1, and generates a signal Lo distinguish the four modes. Four modes distinguished by the decoder 41 are; test mode (TEST), debug mode (DEBUG), Hardware Return from Break mode (HW RTB) and normal mode (Normal). Because the test mode control register 4 can be accessed from the main CPU 23 via the main CPU bus 10, each of these modes can be set from the main CPU 23 side. Differences between the modes will be described later with reference to FIG. 23.

Figure 18:
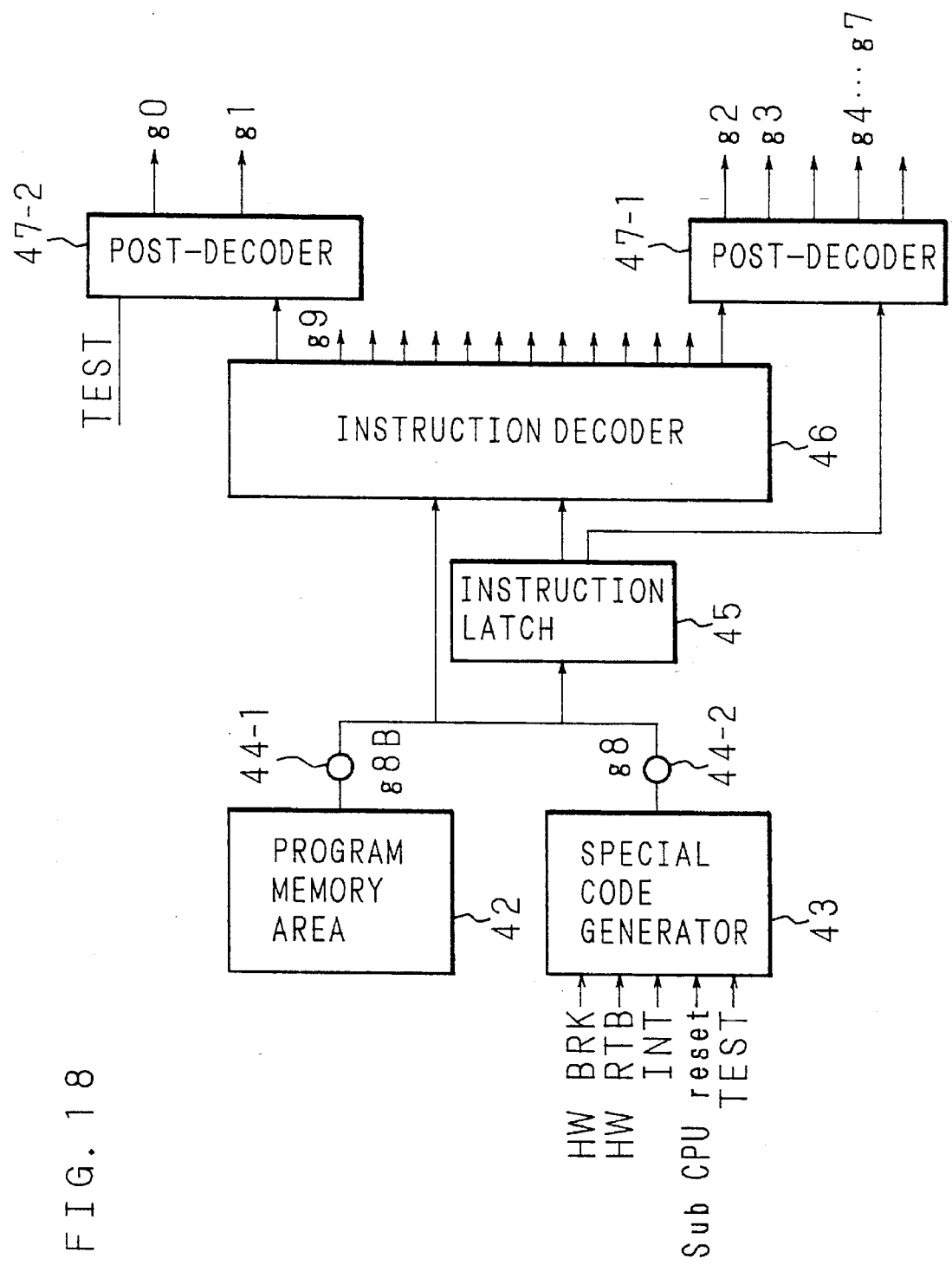
FIG. 18 is a circuit diagram illustrative of the specific constitution inside the sub CPU and the testing circuit and the emulation circuit thereof of the microcomputer of the invention shown in FIG. 11.

The portions denoted by numerals 42 through 47 in the block diagram of FIG. 18 are portions related to instruction decoding of the sub CPU 1. Normally, an instruction code is fetched from the program memory area 42 via a gate 44-1 to be held by an instruction latch 45 and is also sent to an instruction decoder 46 so that various signals for the control of units of the sub CPU 1 are generated.

The instruction decoder 46 further generates control signals g0, g1, g2, g3, g4 . . . g7 through combination with post-decoders denoted by numerals 47-1 and 47-2. Use of the post-decoders 47-1, 47-2 makes it easy to build a circuit for generating signals which are mutually exclusive in spite of having the same timing.

Numeral 43 denotes a special code generator which generates instruction codes executed in special cases. The special code generator 43 receives such input as Hardware Break signal (HW BRK), Hardware Return from Break signal (HW RTB), interrupt signal (INT), sub CPU reset signal (Sub CPU reset) and TEST signal, and supplies output signals having one-word length via the gate 44-2 to the instruction latch 45 and the instruction decoder 46.

The gates 44-1 and 44-2 are controlled to turn ON/OFF in complement to each other. Through such a constitution, an execution sequence comprising a plurality of instructions stored in the program memory area 42 is executed while normally the gate 44-1 is ON and 44-2 is OFF. In the event of an interrupt or the like, the gate 44-1 turns OFF and 44-2 turns ON so that a special code generated by the special code generator 43 is inputted to the instruction latch 45 and the instruction decoder 46 thereby the special instruction is executed unconditionally by means of hardware.

Figure 19:
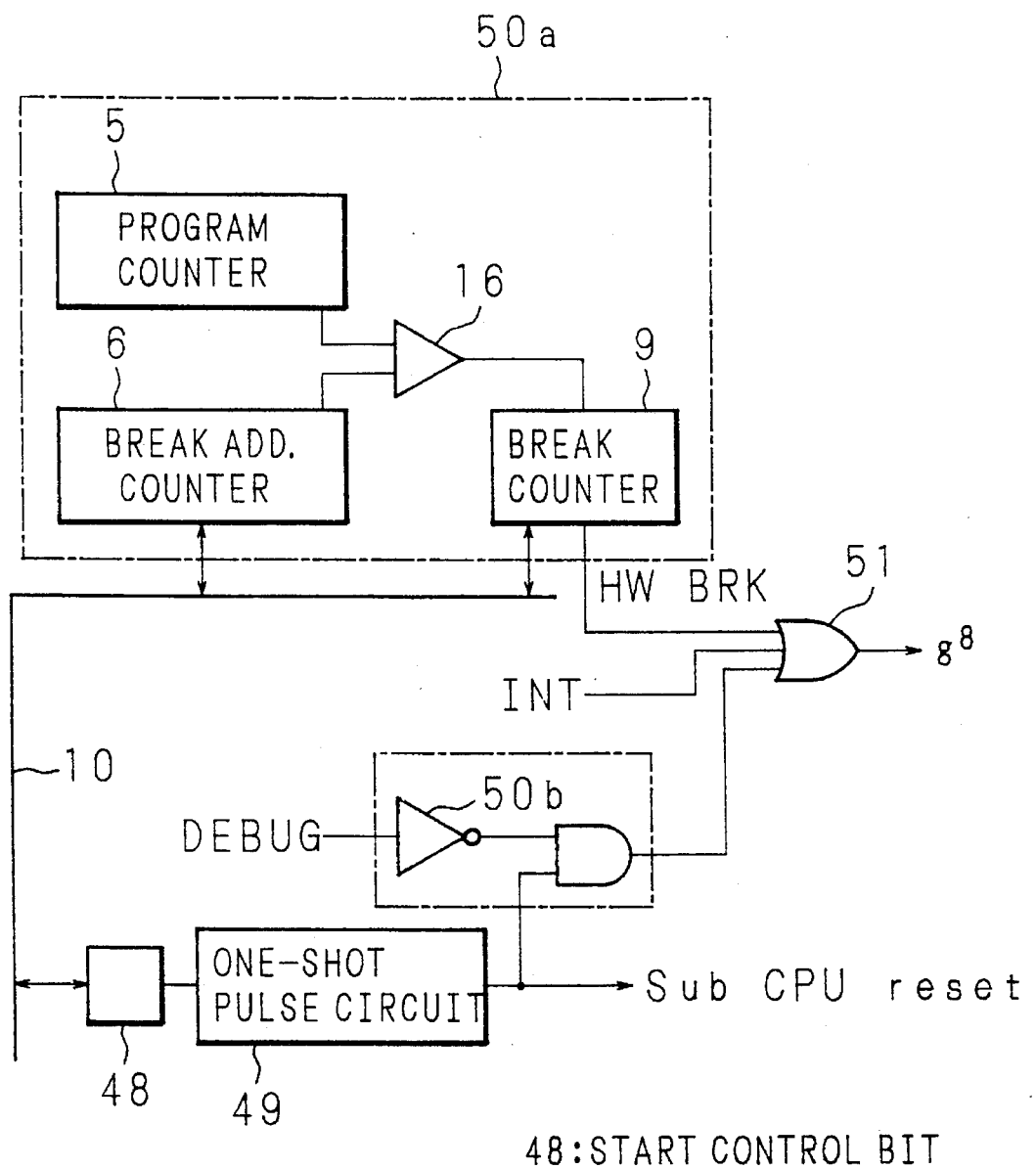
FIG. 19 is a circuit diagram illustrative of the specific constitution inside the sub CPU and the testing circuit and the emulation circuit thereof of the microcomputer of the invention shown in FIG. 11.

FIG. 19 is a block diagram illustrative of the constitution of a circuit which generates a signal g8 for ON/OFF control of the gates 44-1, 44-2. This circuit generates the signal g8 when any one of the following three events occurs, and thereupon sends the code of the special instruction generated by the special code generator 43 to the instruction latch 45 and the instruction decoder 46.

The first of the three events is such a case that a hardware break signal generating circuit 50a comprising the program counter (SC) 5, the break address register 6, the agreement detecting circuit 16 and the break counter 9 enables the HW BRK signal by counting the number of times the count of the program counter 5 of the sub CPU 1 and the value of the break address agree by means of the break counter 9.

The second is a case that an INT signal is given from an OR output of an effective interrupt request signal generated by an interrupt circuit which is inevitably provided in an ordinary microcomputer, although not shown in the drawing.

The third is a case when a reset signal (Sub CPU reset) of the sub CPU 1 is generated which is effective upon input of either a reset signal for the sub CPU 1 specified by the main CPU 23 or an external reset signal for the entire chip. In this case, as a signal of "H" level is written into the start control bit 48 which is accessed by the main CPU 23 via the main CPU bus 10, a one-shot pulse circuit 49 generates a one-shot pulse which is outputted via a logic circuit 50b comprising an inverter and an AND gate. The logic circuit 50b is provided in order to disable reset of the sub CPU 1 when a signal DEBUG generated by the decoder 41 is inputted to the inverter during debug mode.

Occurrence of these three events are inputted to the OR gate 51 to generate the control signal g8 as the logical sum signal thereof.

Figure 20:
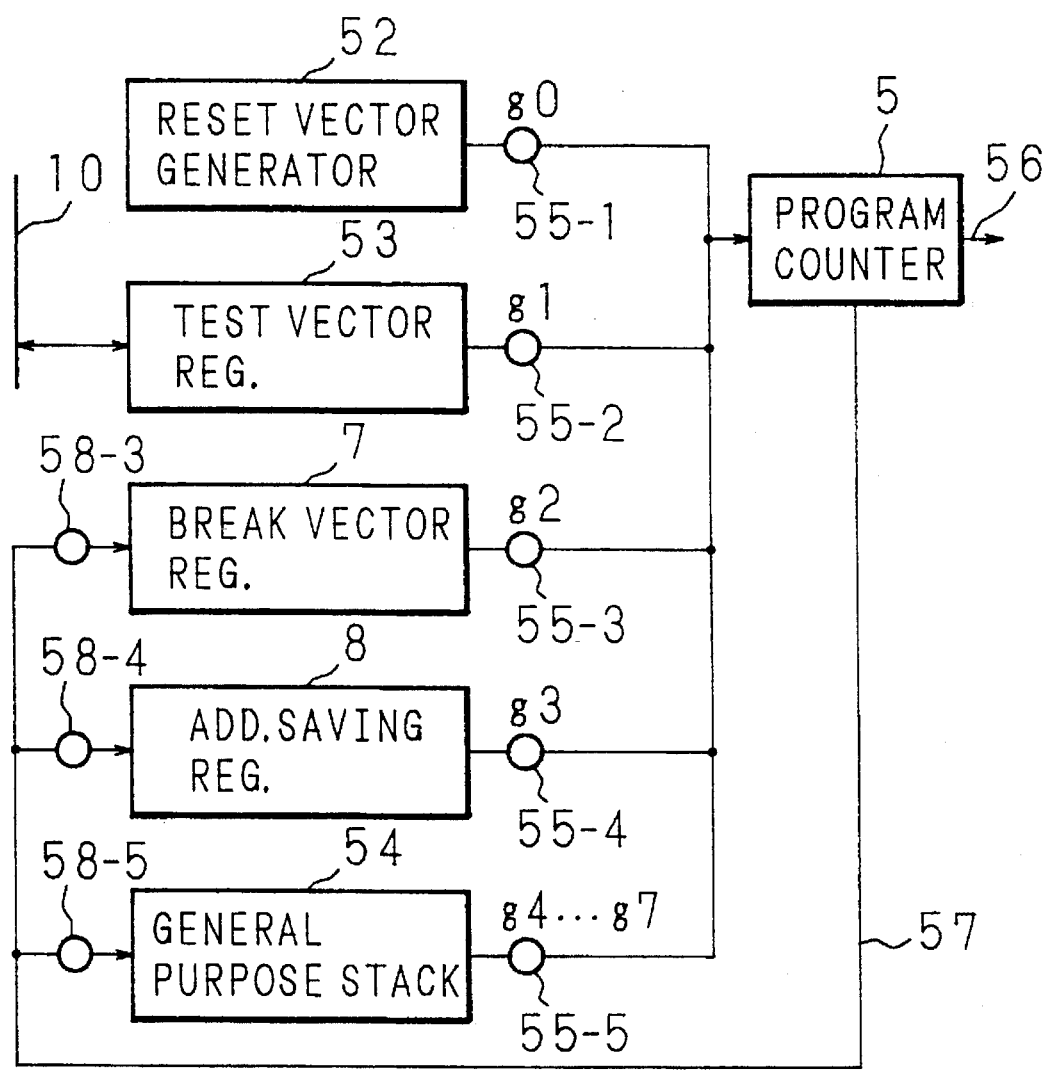
FIG. 20 is a circuit diagram illustrative of the specific constitution inside the sub CPU and the testing circuit and the emulation circuit thereof of the microcomputer of the invention shown in FIG. 11.

FIG. 20 is a block diagram illustrative of an example of constitution of the program counter 5 and the stack register portion connected thereto in the sub CPU 1, particularly showing important registers in relation to the reset operation, break operation or test operation.

Numeral 52 denotes a reset vector generator which generates an ordinary reset vector to supply the reset start address to the program counter 5 when the signal g0 is effective and the gate 55-1 is turned ON. Numeral 53 denotes a test vector register to store the start address at the time of test mode, which supplies the test, start address to the program counter 5 when the signal g1 is effective and the gate 55-2 is turned ON.

As described above, the break vector register 7 stores the break vector which is the branch destination of the program when a break instruction is executed. The address save register 8 is used to save the address (PC value) held by the program counter 5 indicating the point where the program execution was interrupted by break branching. When the break routine is completed, the value saved in the address save register 8 is loaded to the program counter 5 to enable it to return to the original routine from which branching into the break routine was made.

Numeral 54 denotes a general purpose stack which can be used in an instruction accompanying a subroutine call, although it has no direct relevance to the invention.

Output of the program counter 5 drives an address bus 56 for accessing the memory area of the sub CPU 1. Numeral 57 denotes a signal line used to save the value of the program counter 5 in the break vector register 7, address save register 8 or the general purpose stack 54, with the save destination stack of the data being selected by the ON/OFF status of the gates denoted by numerals 58-3, 58-4 and 58-5.

Figure 21:
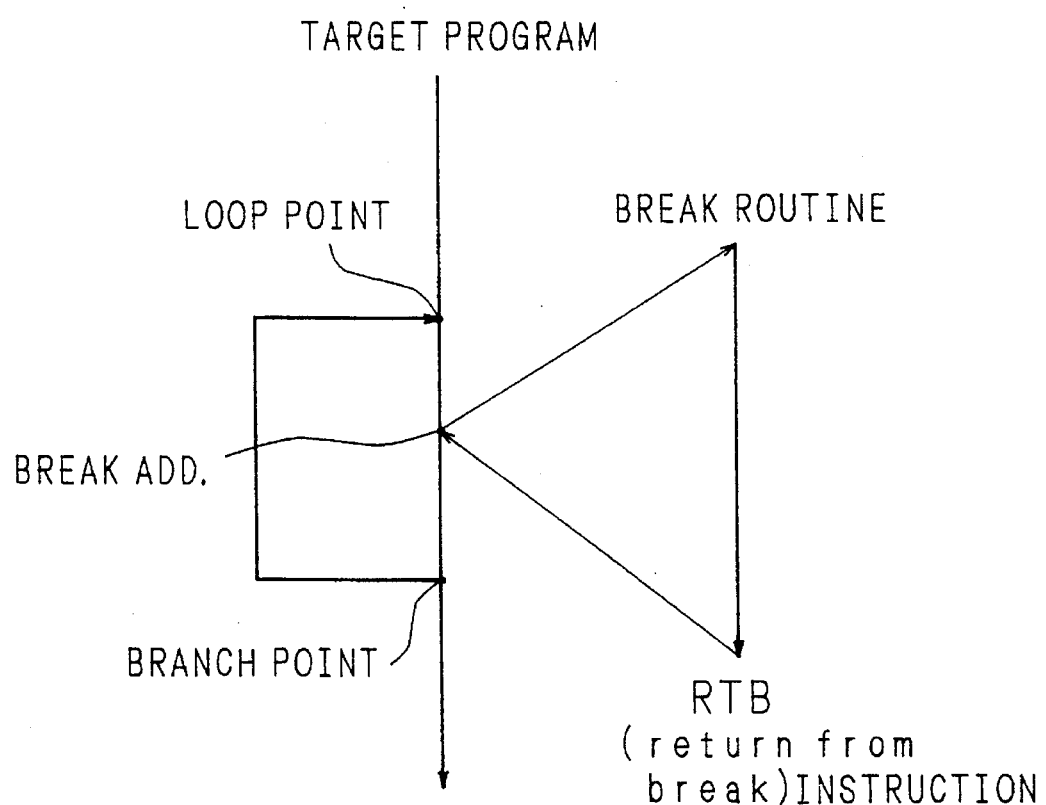
FIG. 21 is a schematic diagram illustrative of the sequence of break interrupt operation of the microcomputer of the invention.
Figure 22:
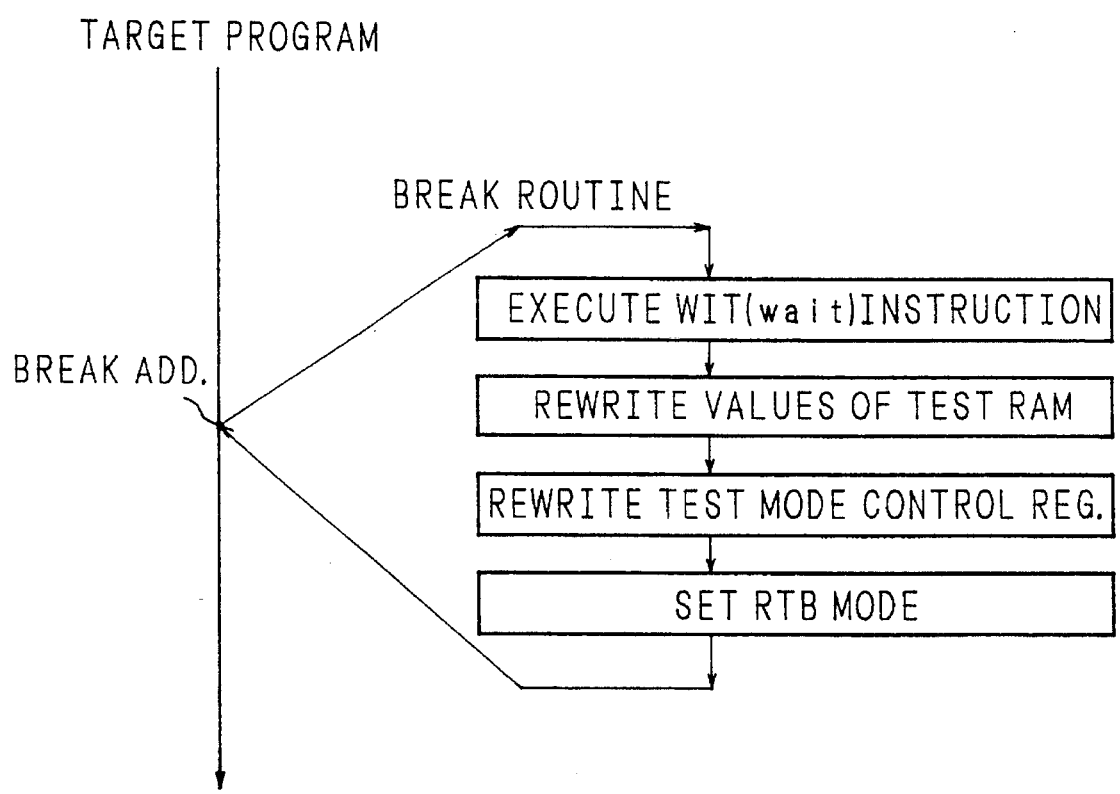
FIG. 22 is a schematic diagram illustrative of the sequence of break interrupt operation of the microcomputer of the invention.

FIG. 21 and FIG. 22 are schematic diagrams illustrative of the execution sequence of the program when break processing is executed by using the circuits shown in FIG. 17 through FIG. 20.

FIG. 21 shows the state of the break routine being executed by the break address detection circuit shown in FIG. 19, during execution of the target program. In this case, because the break address is detected by the hardware thereby to branch into a break routine, this is called the Hard BRK. Return from the break routine to the target program at the point of branching into the break routine can be made by program ruling so that RTB (return from break) instruction is executed at the end of the break routine. By determining the number of times of a loop is to be repeated and counting it down with the break counter 9, a break interrupt can also be made during execution of the loop from the break point to the loop point shown in FIG. 21.

FIG. 22 shows a schematic diagram illustrative of the program flow in case return from the break routine to the target program is controlled by the main CPU 23, while the break branching is carried out in the software by means of the break instruction BRK in the program.

When the wait instruction WIT is executed during execution of the break routine, the process is put to a temporary halt. Writing of data in the test mode control register 4 causes access to the test RAM 2 thereby causes the program to be rewritten. Then the test mode control register 4 is written over again to return to the sub CPU 1 execution mode, thereby RTB mode is set, process is returned to the break address and execution of the target program is resumed.

Figure 23:
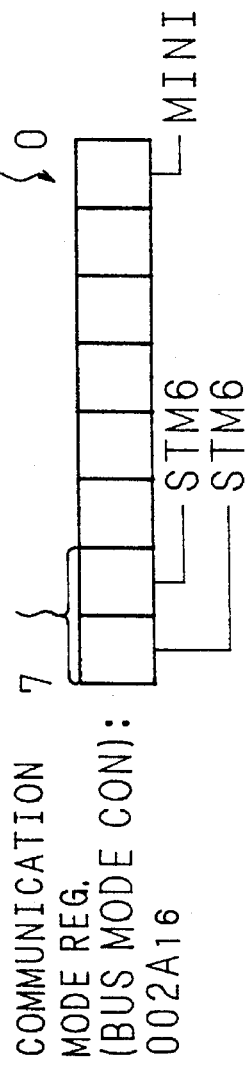
FIG. 23 is a schematic diagram explanatory of four modes of the sub CPU of the microcomputer of the invention.

FIG. 23 is a schematic diagram illustrative of the constitution of the data to designate the four modes of the sub CPU 1 which are generated by the circuit shown in FIG. 17.

In this example, bits 7 and 6 of the 8-bit communication mode register (BUS MOD CON) allocated to a particular address "002A" in the register group denoted by numeral 34 in FIG. 13, FIG. 14, FIG. 15 and FIG. 16 of the sub CPU 1 are allocated to the test mode bits STM 7, STM 6, and the start, control bit 48 is allocated to the MINI (Mode Initial Bit) which is bit 0. The two bits of the test mode bits STM 7 and STM 6 correspond to the test mode control register 4 shown in FIG. 11.

When the test mode bits STM 7 and STM 6 of the test mode control register 4 are "00", the normal mode is set, when they are "01", the test mode is set, when they are "10", the debug mode (also called memory access mode) DEBUG is set, and when they are "11", the RTB (Hardware Return From Break) mode is set.

In all modes except for the debug mode DEBUG, when "1" is written in the start control bit 48 of bit 0, the instruction is executed from the ordinary reset vector, the test start address or the RTB address saved in the address save register 8. At this time, the sub CPU block reset signal SUB reset shown in FIG. 23 is effective only during normal reset, and some of the registers in the sub CPU 1 are initialized.

During test mode or RTB mode, the SUB reset signal described above is not effective and the registers are not initialized. Access of the memory area of the sub CPU 1 from the main CPU 23 is made possible only during the debug mode, in which case the sub CPU 1 enters halt state. During the debug mode, memory access of the sub CPU 1 is naturally impossible.

Bit 7 of the control field register (local pointer) at address "0030" shown in FIG. 13, FIG. 14, FIG. 15 and FIG. 16 prepares SEQSTP bit which allows to check the operation status of the sub CPU 1 from the main CPU 23. Specifically, as shown in the schematic diagram of FIG. 23, the SEQSTP bit being "0" indicates that the sub CPU 1 sequence is in operation and "1" indicates that the sequence is at a halt.

Figure 24:
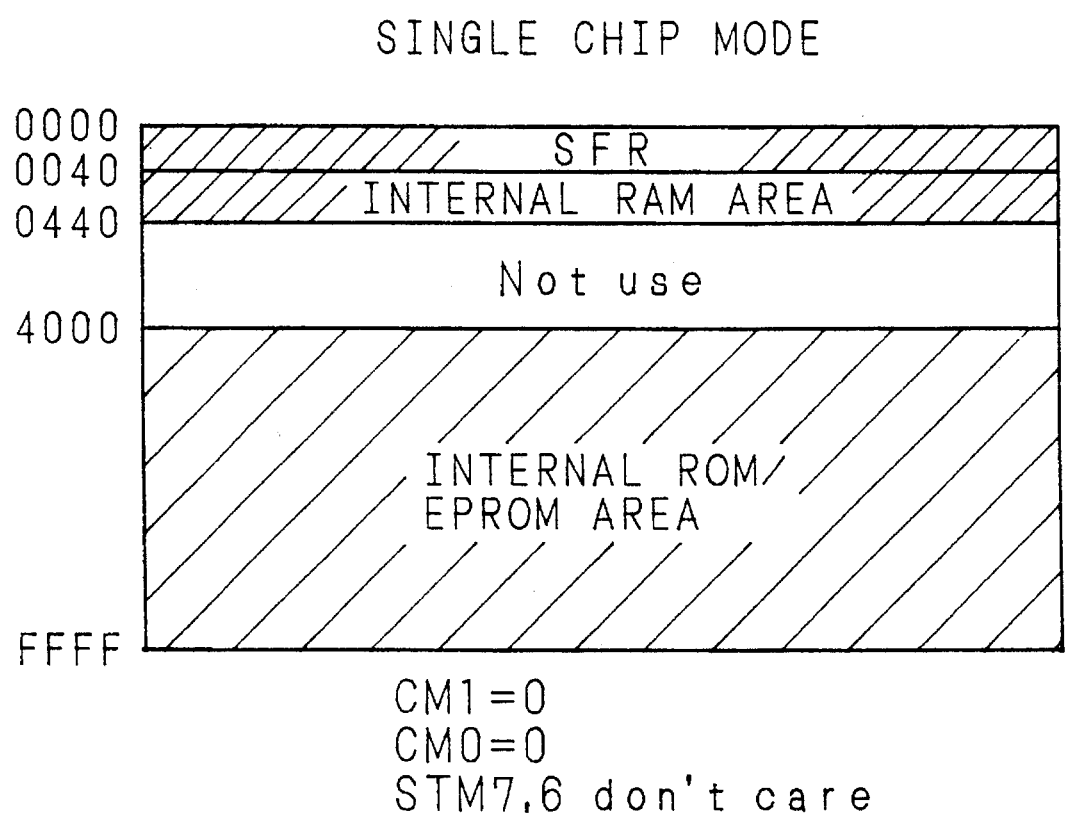
FIG. 24 is a schematic diagram illustrative of the memory area in an embodiment of the microcomputer of the invention.
Figure 25:
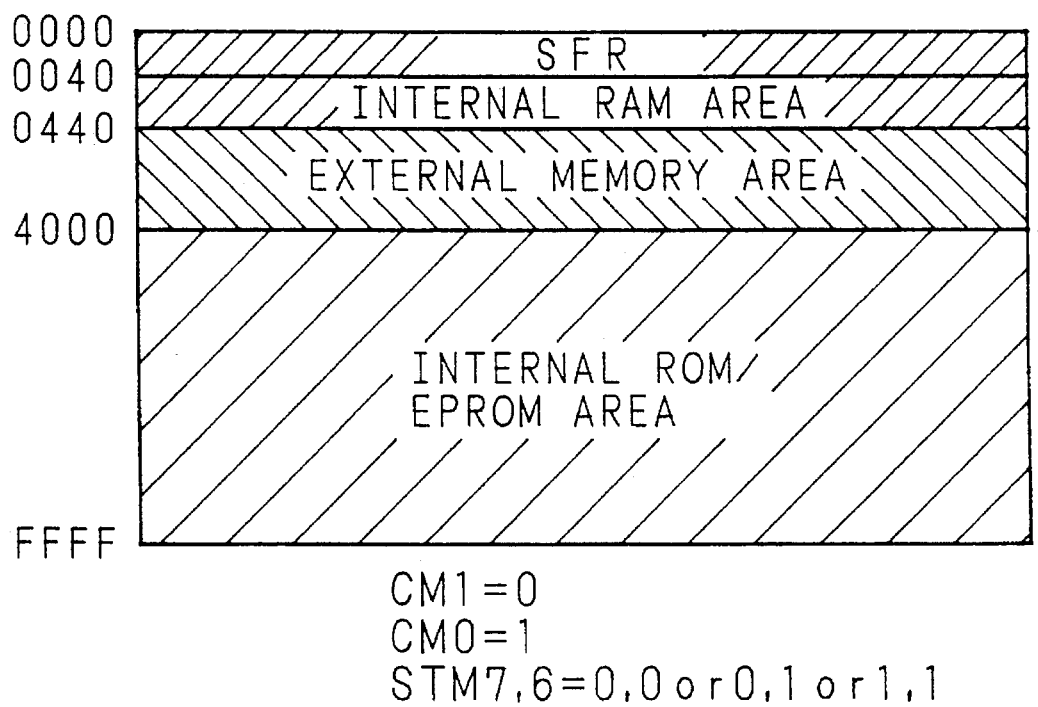
FIG. 25 is a schematic diagram illustrative of the memory area in an embodiment of the microcomputer of the invention.
Figure 26:
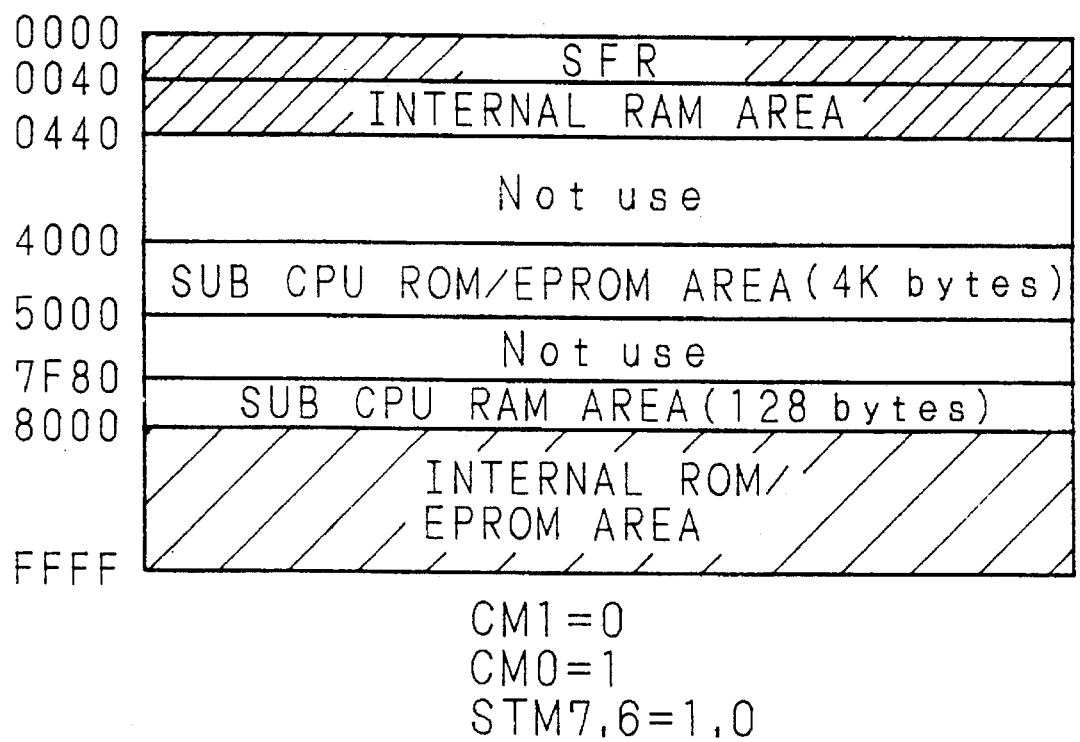
FIG. 26 is a schematic diagram illustrative of the memory area in an embodiment of the microcomputer of the invention.
Figure 27:
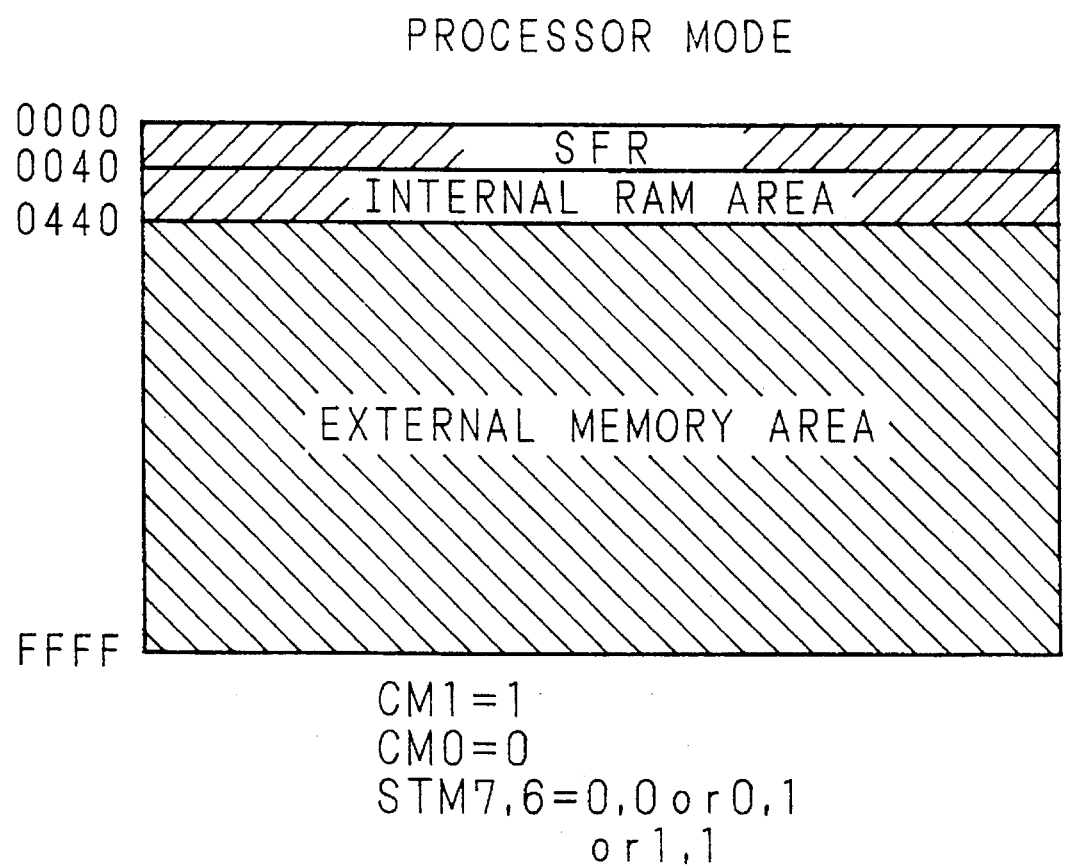
FIG. 27 is a schematic diagram illustrative of the memory area in an embodiment of the microcomputer of the invention.
Figure 28:
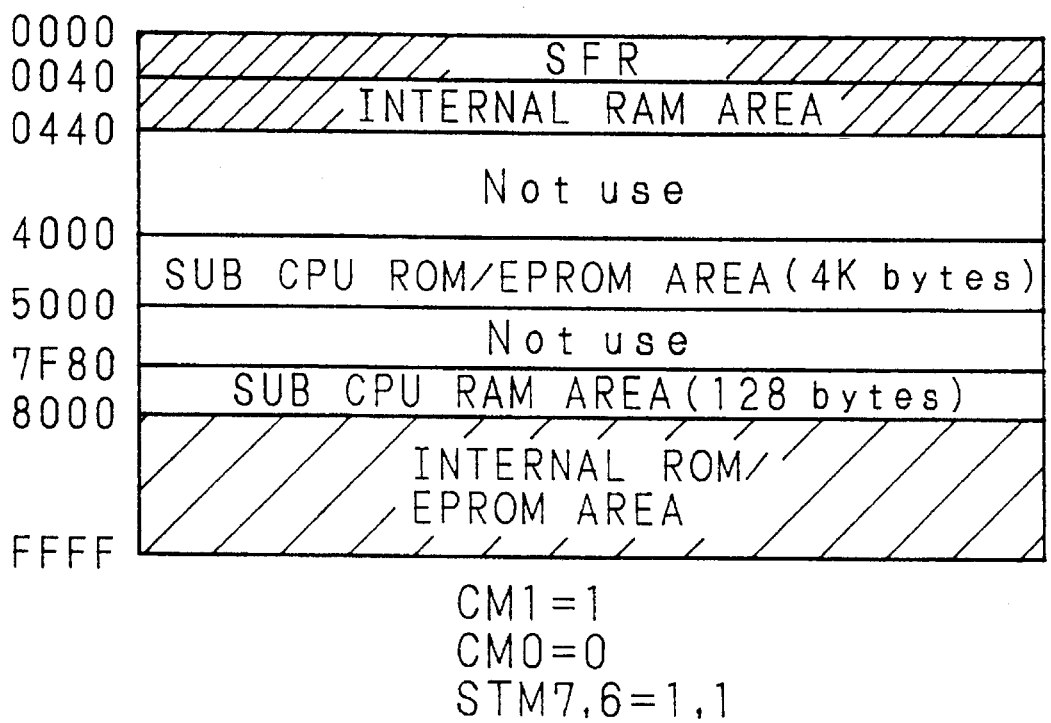
FIG. 28 is a schematic diagram illustrative of the memory area in an embodiment of the microcomputer of the invention.
Figure 29:
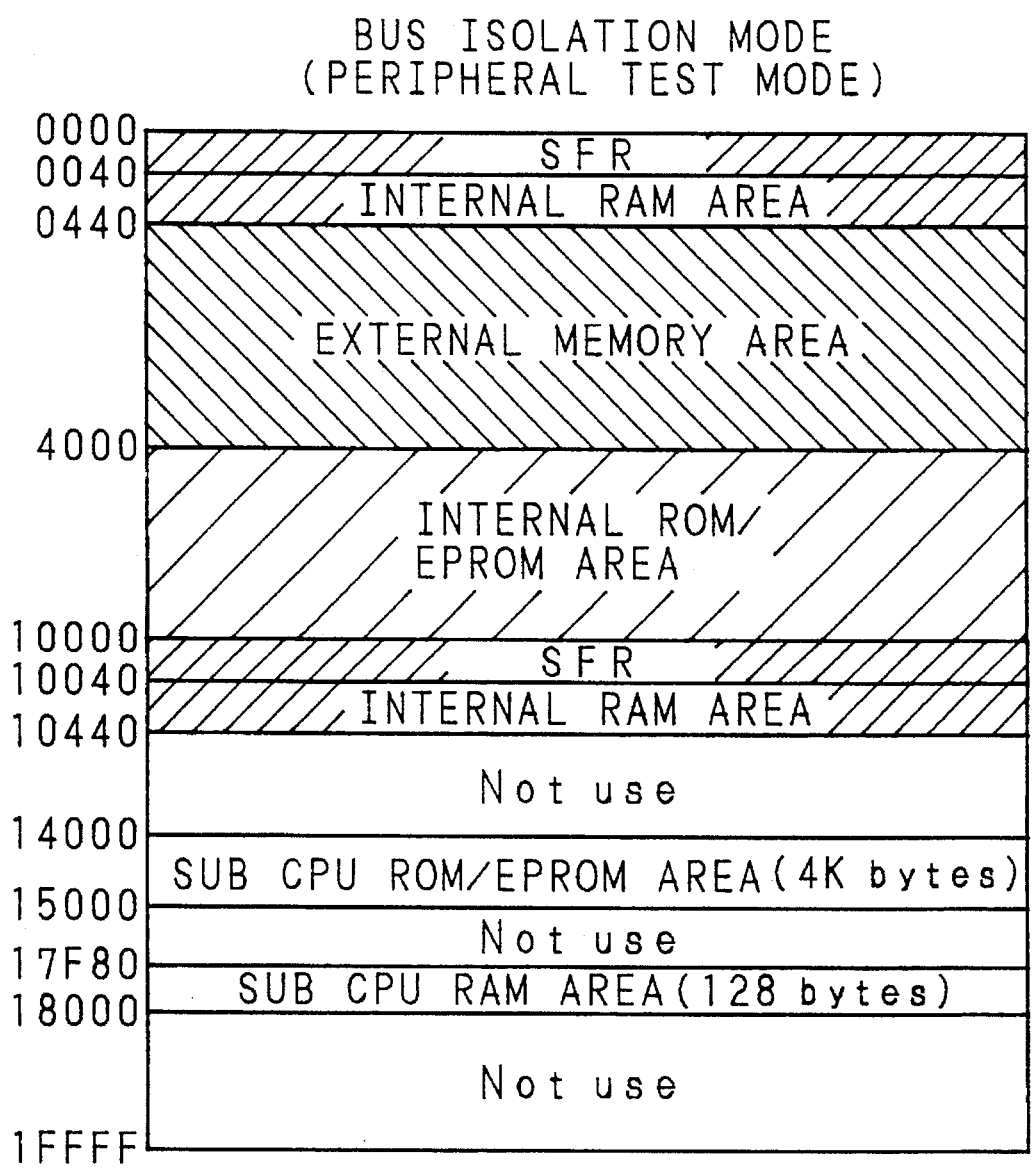
FIG. 29 is a schematic diagram illustrative of the memory area in an embodiment of the microcomputer of the invention.
Figures 32A, 32B:
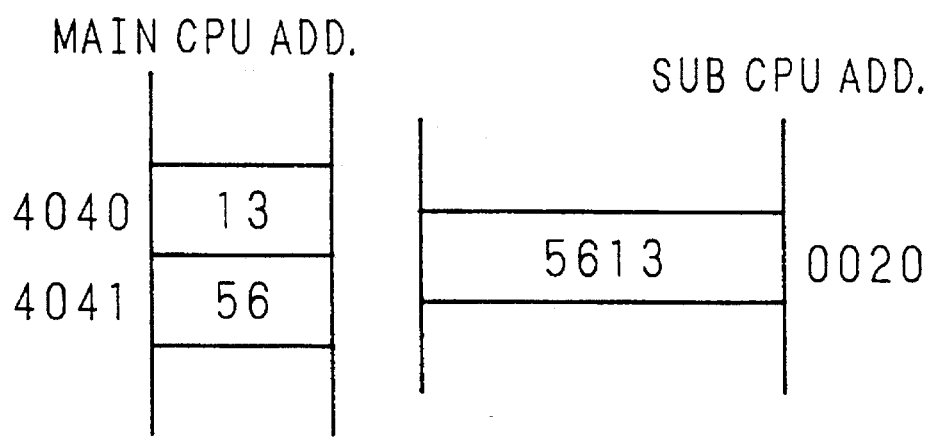
FIG. 32A and FIG. 32B are schematic diagrams illustrative of the memory area in an embodiment of the microcomputer of the invention.

FIG. 24 through FIG. 29, FIG. 30. FIG. 31, FIG. 32a and FIG. 32B are schematic diagrams illustrative of the memory allocation in one embodiment of the one-chip microcomputer of the invention. FIG. 24 through FIG. 29 show the access area of the main CPU 23, while FIG. 24 shows the state at single chip mode, FIG. 25 shows the state at memory expansion mode, FIG. 26 shows the state at memory expansion mode and debug mode of the sub CPU 1 combined, FIG. 27 shows the state at processor mode, FIG. 28 shows the state at the processor mode and the debug mode of the sub CPU 1 combined, and FIG. 29 shows the state at bus isolation mode. Memory allocations shown in FIG. 24, FIG. 25 and FIG. 27 are similar to the common memory allocations of the prior art.

Memory allocations in each mode shown in FIG. 24 through FIG. 29 will be described in detail below.

In the single chip mode shown in FIG. 24, the area from address "0000" to address "003F" is used as the SFR (Special Function Register) area, where control registers for input/output port, timer function, SI/O function and other peripheral functions are provided. Registers for data exchange with the sub CPU 1 are also provided in this area, while the sub CPU test mode control bits STM 7, STM 6 are also provided in part thereof. However, because test function has no relevance during the single chip mode, the sub CPU test mode control bits STM 7 and STM 6 may or may not function.

At the single chip mode, a memory space of 1K bytes from "0040" to "043F" is allocated to the internal RAM area and a memory space of 48K bytes from address "4000" to "FFFF" is allocated to the internal ROM area. It will not be needed to say that sizes of these internal memory areas is determined at designing, and therefore sizes may mentioned above are mere examples and other sizes may be employed. The single chip mode, the memory expansion mode and the processor mode are distinguished by means of the CPU mode registers CM1, CM0, and can be changed by the main CPU 23 by means of software. Addresses "0040" through "3FFF" are not used.

At the memory expansion mode shown in FIG. 25, addresses "0040" through "3FFF" which are not used at the single chip mode shown in FIG. 24 described above and part of the port control register in the SFR area become the accessible external memory area. This causes part of the input/output port to be switched to data bus, address bus and control bus for the external access.

At the processor mode shown in FIG. 27, the internal ROM is not used, and the entire area from address "0440" through "FFFF" becomes the external memory area.

When the system is in the memory expansion mode during which the memory area of the sub CPU 1 shown in FIG. 26 is accessible and the sub CPU 1 is in the debug mode, memory area of the sub CPU 1 is accessed instead of the memory area of the main CPU 23 as the area from address "4000" to "7FFF" in case the test mode control bits STM 7, STM 6 are set to the debug mode (also called the memory access mode) (STM 7=1, STM 6=0). The reason for providing an offset of "4000" to the address is to take advantage of avoiding the reset vector addresses "FFFC" and "FFFD" of the SFR area and the main CPU 23 and simplifying the address decoding circuit both during an access to the sub CPU 1 and during an access to the main CPU 23.

Similarly, in the processor mode shown in FIG. 28 and the debug mode of the sub CPU 1 combined, allocation of the memory area during the processor mode shown in FIG. 27 is shared to the memory area of the sub CPU 1 only in an area between address "4000" and "7FFF". This enables it to access the sub CPU 1 by using the main CPU 23 in the processor mode, and to test the one-chip microcomputer by running the sub CPU 1 and the main CPU 23 alternately.

Because the main CPU bus 10 has 8-bit width and the sub CPU bus 28 has 16-bit width, accessing address "0020" from the sub CPU 1 corresponds to accessing two addresses "4040" and "4041" from the main CPU 23 shown in FIG. 32A and FIG. 32B.

At the bus isolation mode or at the peripheral test mode shown in FIG. 29, the ROM and RAM of the sub CPU block 15 and the peripheral circuits on the chip can be accessed and tested by controlling the main CPU bus 10 from external terminals after separating the main CPU 23 and the main CPU bus 10.

In a conventional multi-CPU (MPU) system without sub CPU 1, only the addresses "0000" through "FFFF" are provided similarly to the single chip mode of the microcomputer of the invention shown in FIG. 24. In the invention, however, the address bus is further expanded by one bit (AD16) to realized a memory space of 128K bytes and thereby to enable it to directly access the memory area of the sub CPU 1. That is, addresses from "14000" through "17FFF" become the memory area of the sub CPU 1, and this area can be accessed regardless of the sub CPU test mode control bits STM 7, STM 6. By omitting the decoding of AD16 as 1-bit of the expanded address bus in order to simplify the realization of such a circuit, the same SFR area namely the RAM can be accessed by addresses "10000" through "1043F" similarly to the addresses "1000" through "043F".

Figure 30:
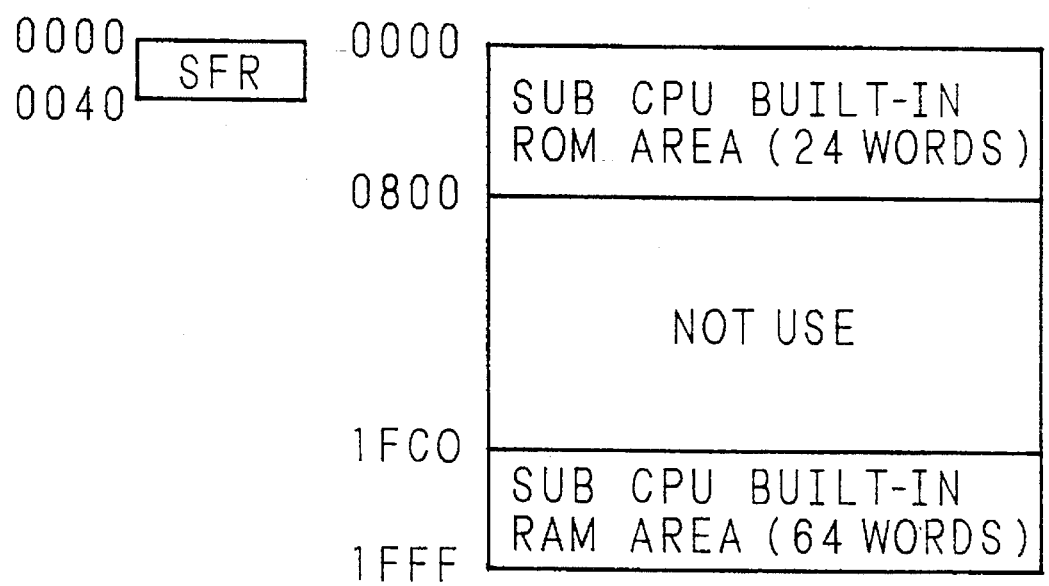
FIG. 30 is a schematic diagram illustrative of the memory area in an embodiment of the microcomputer of the invention.

FIG. 30 is a schematic diagram of the memory allocation viewed from the sub CPU 1. In this embodiment, the main CPU 23 is constituted to have an 8-bit data bus and a 16-bit address bus, with a memory space of 64K bytes, and is provided with an area from address "0000" through address "FFFF" of hexadecimal code. The sub CPU 1 is constituted to have a 16-bit data bus and a 13-bit address bus, with a memory space of 8K bytes, and is provided with an area from address "0000" through address "1FFF". In addition, the sub CPU 1 is provided with a register space (SFR: Special Function Registers) of 64 words.

In this example, a space of 8K words from address "0000" through "1FFF" is allocated to the sub CPU 1 side. Addresses from "0000" through "0800" out of this space are allocated to the internal ROM area and addresses from "1FC0" through "1FFF" are allocated to the internal RAM area. The sub CPU 1 can access this area except for the case when the sub CPU test mode bits STM 7, STM 6 are set to the debug mode.

During normal operation, memory space of the main CPU 23 and the memory space of the sub CPU 1 are independent from each other and therefore cannot be cross-accessed. However, use of the special register group described in conjunction with FIG. 13, FIG. 14, FIG. 15 and FIG. 16 makes it possible to exchange data between these memory spaces. For such an operation, correspondence between addresses of both memory spaces is established.

FIG. 31 is a schematic diagram showing the relationship between the addresses of the sub CPU 1 and addresses of the main CPU 23 of the microcomputer of the invention. As described above, the main CPU 23 side of the microcomputer of the invention is constituted to have a 8-bit data bus and a 16-bit address bus, and the sub CPU 1 side is constituted to have a 16-bit data bus and a 13-bit address bus. Therefore addresses of the main CPU 23 are provided with offset of "4000" with respect to the addresses of the sub CPU 1.

FIG. 32A and FIG. 32B are schematic diagrams indicating the relationship between addresses when the same data, "5613", for example, is stored on the sub CPU 1 side and on the main CPU 23 side, and between the data as stored at the respective addresses, in hexadecimal notation. While the whole data "5613" is stored at address "2020" on the sub CPU 1 side, it is divided so that "13" is stored at address "4040" and "56" is stored at address "4041" on the main CPU 23 side.

Figure 33:
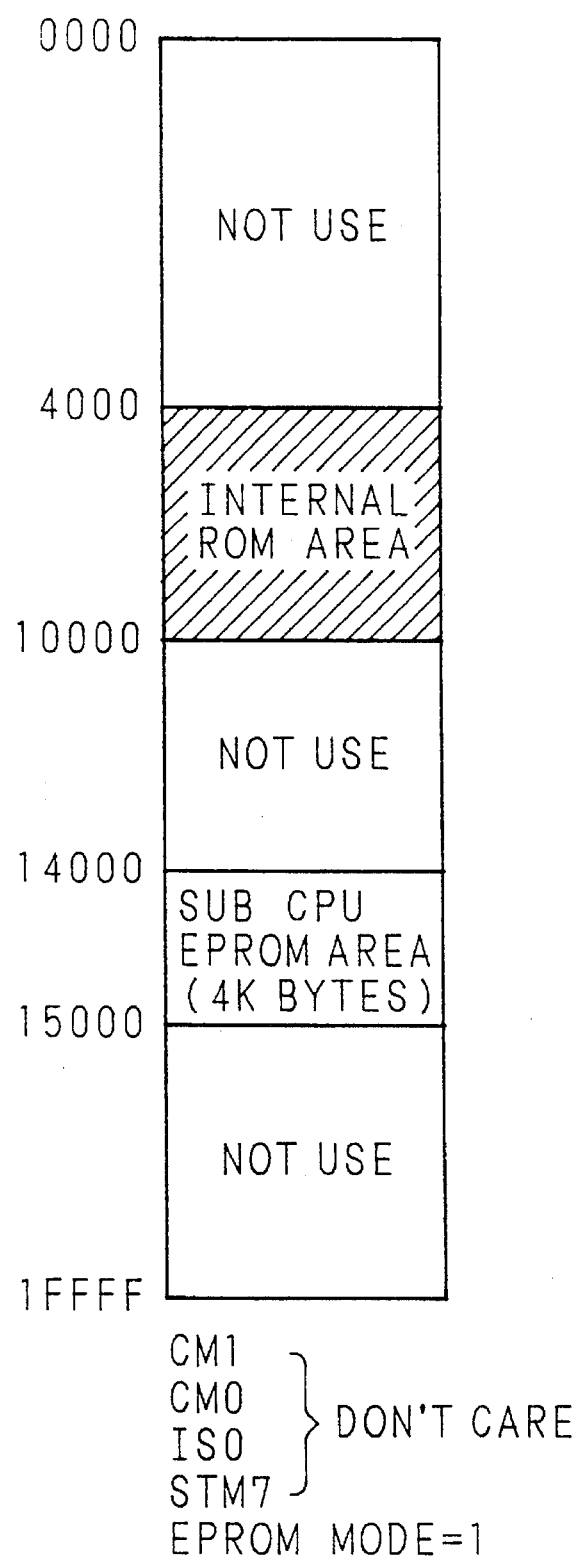
FIG. 33 is a schematic diagram illustrative of the memory allocation at the time of EPROM access mode of the microcomputer of the invention.

FIG. 33 is a schematic diagram illustrative of an example of the memory allocation at EPROM access mode conceived in correspondence to the memory allocation shown in FIG. 24 through FIG. 29, FIG. 30, FIG. 31, FIG. 32A and FIG. 32B.

The EPROM access mode refers collectively to the operation modes such as program (writing), verification, read and test of the built-in EPROM. In this example, the EPROM of the main CPU 23 side is located in the memory area of 48K bytes from address "4000" through "FFFF", and the EPROM of the sub CPU 1 side is located in the memory area of 16K bytes, namely 8K words, from address "14000" through "14FFF". Because 16 bits are handled as one word on the sub CPU 1 side, 2-byte address corresponds to one word.

As the conventional microcomputer has only a main CPU without a sub CPU, a memory space of 64K bytes from address "0000" through "FFFF" suffices for the operation thereof. In the microcomputer of the invention, however, a memory space of 128K bytes is allocated during EPROM access by expanding the address bus by 1 bit (AD16) for accessing to the EPROM by the sub CPU 1. In this embodiment, design of the address decoding circuit is made simple by employing a memory allocation similar to that during the peripheral test mode shown in FIG. 29, namely by employing the same addresses for the EPROM portion in both modes.

Figure 34:
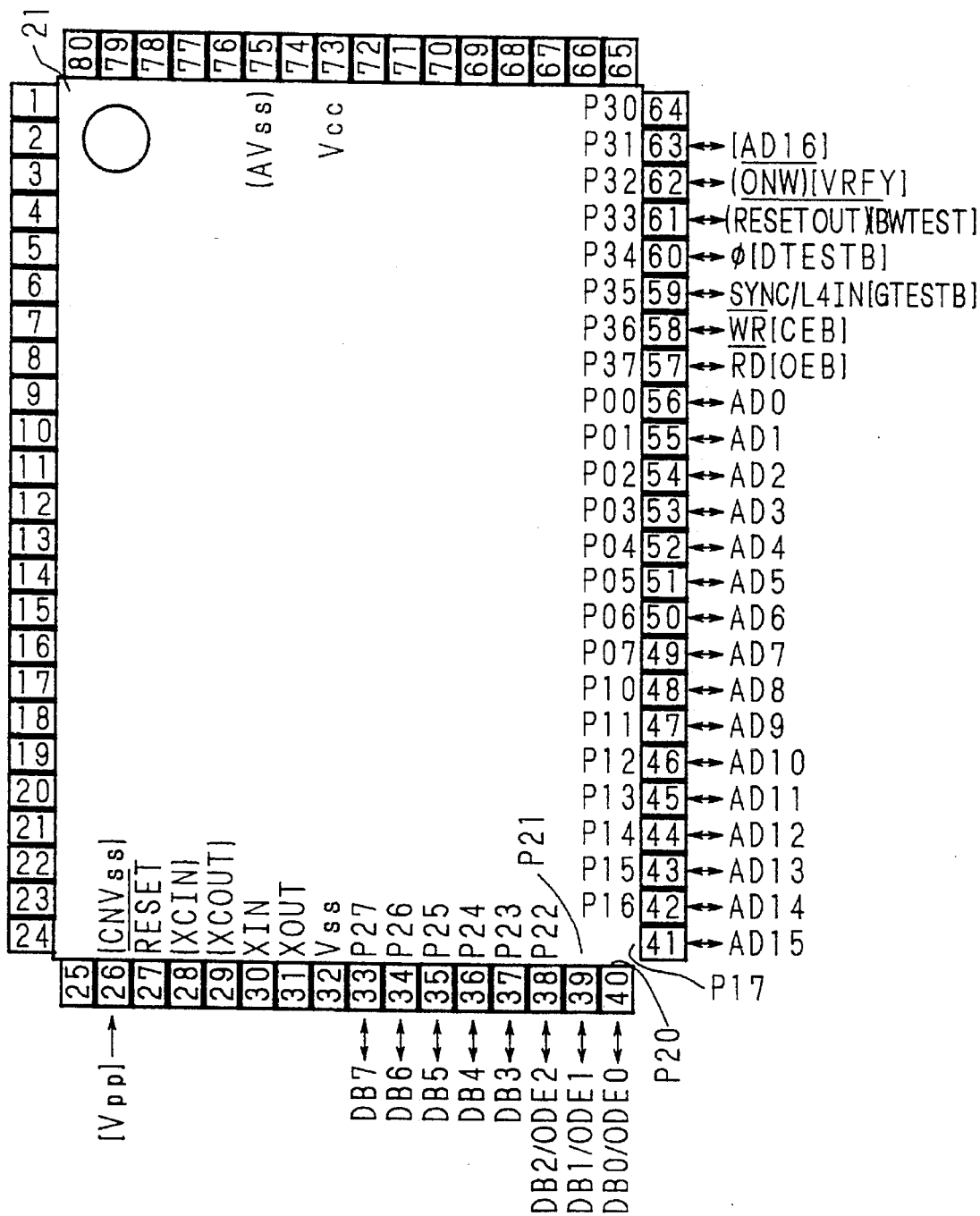
FIG. 34 is a schematic diagram illustrative of the terminals for control from the outside similar to the prior art, in the microcomputer of the invention.
Figure 36:
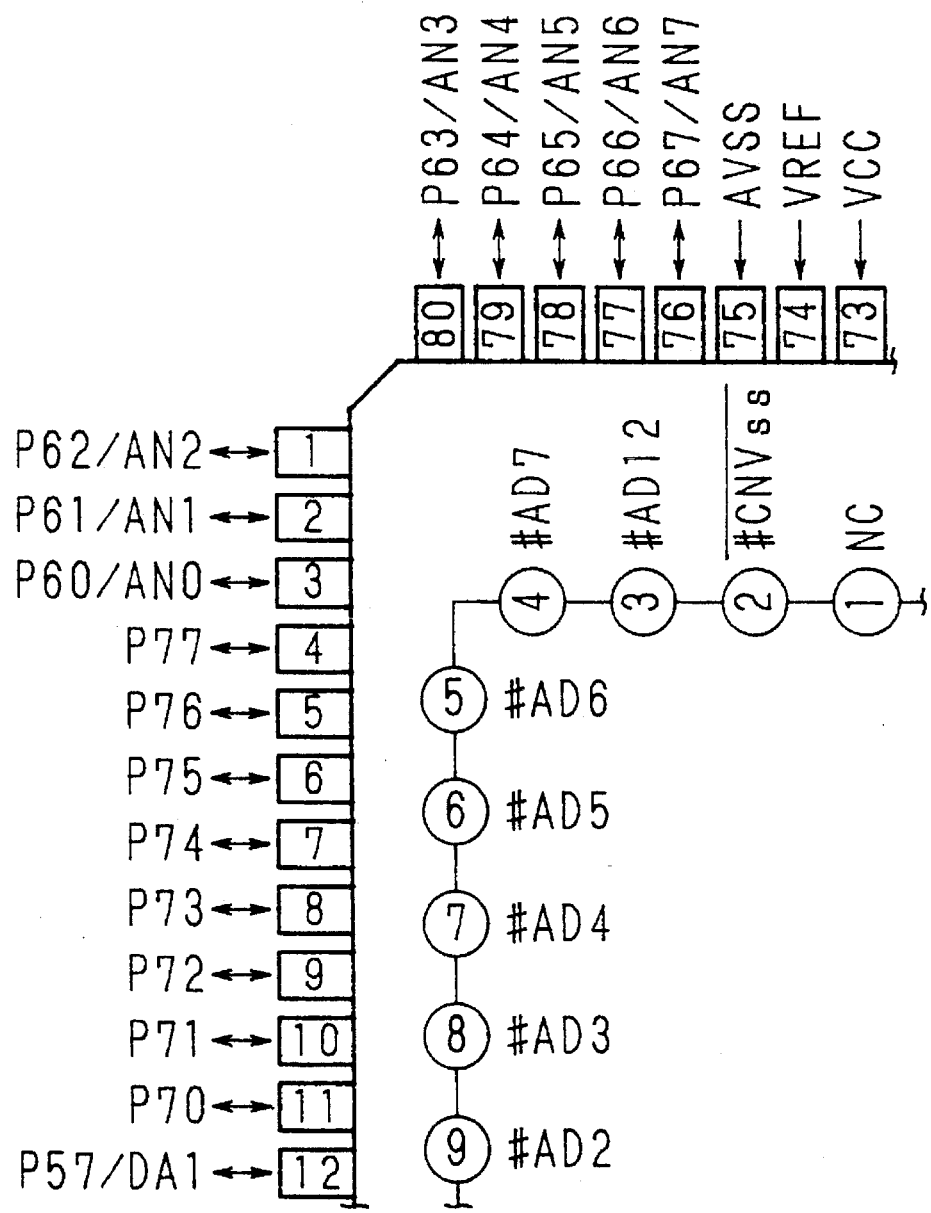
FIG. 36 is a schematic diagram illustrative of the pin connection of the emulation chip in the microcomputer of the invention.
Figure 37:
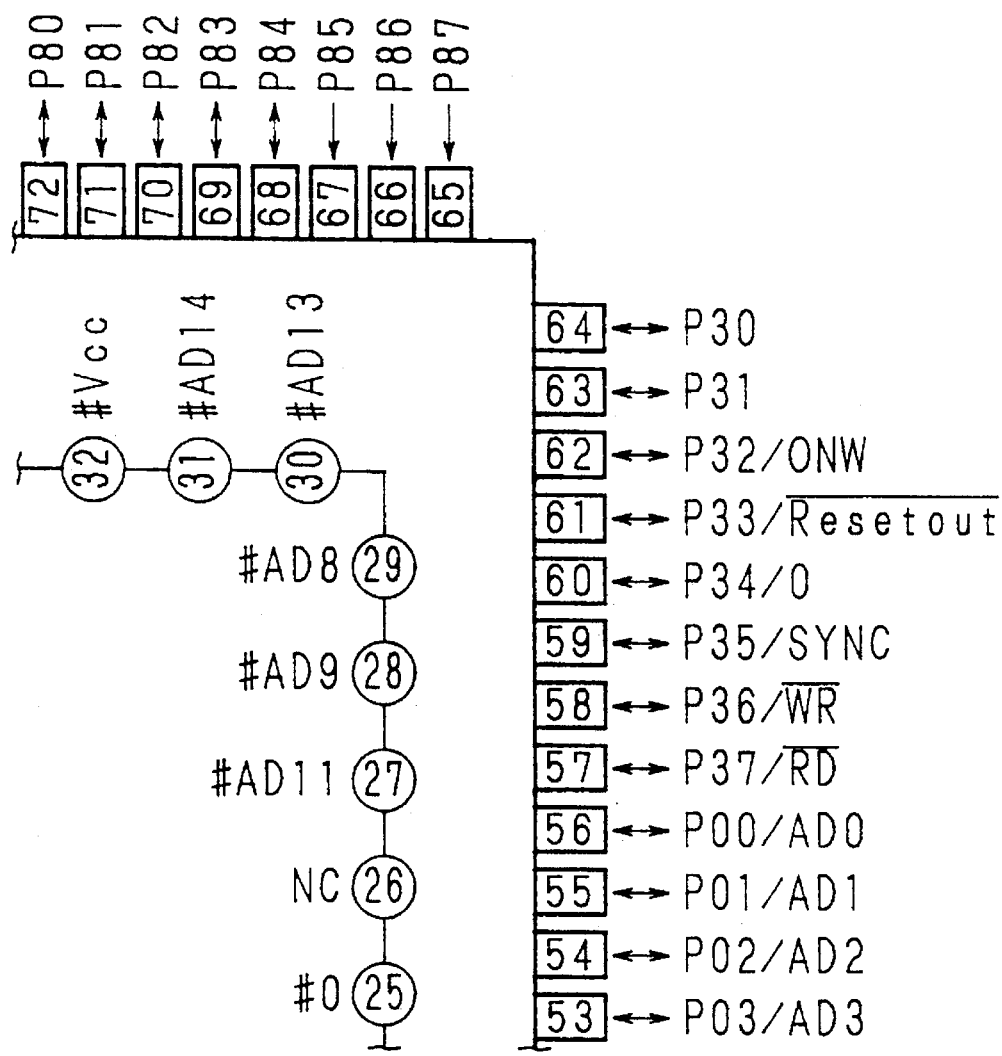
FIG. 37 is a schematic diagram illustrative of the pin connection of the emulation chip in the microcomputer of the invention.
Figure 38:
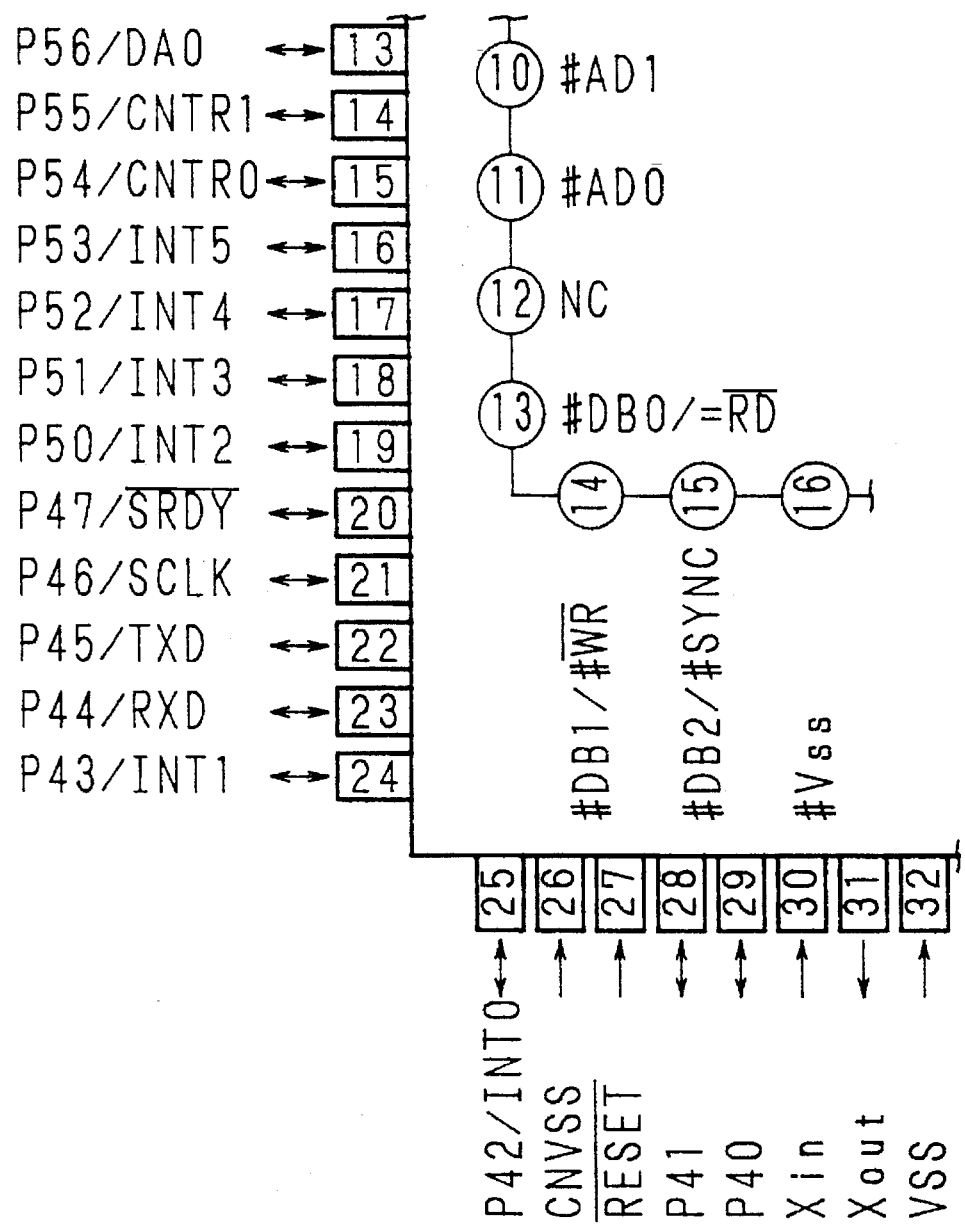
FIG. 38 is a schematic diagram illustrative of the pin connection of the emulation chip in the microcomputer of the invention.
Figure 39:
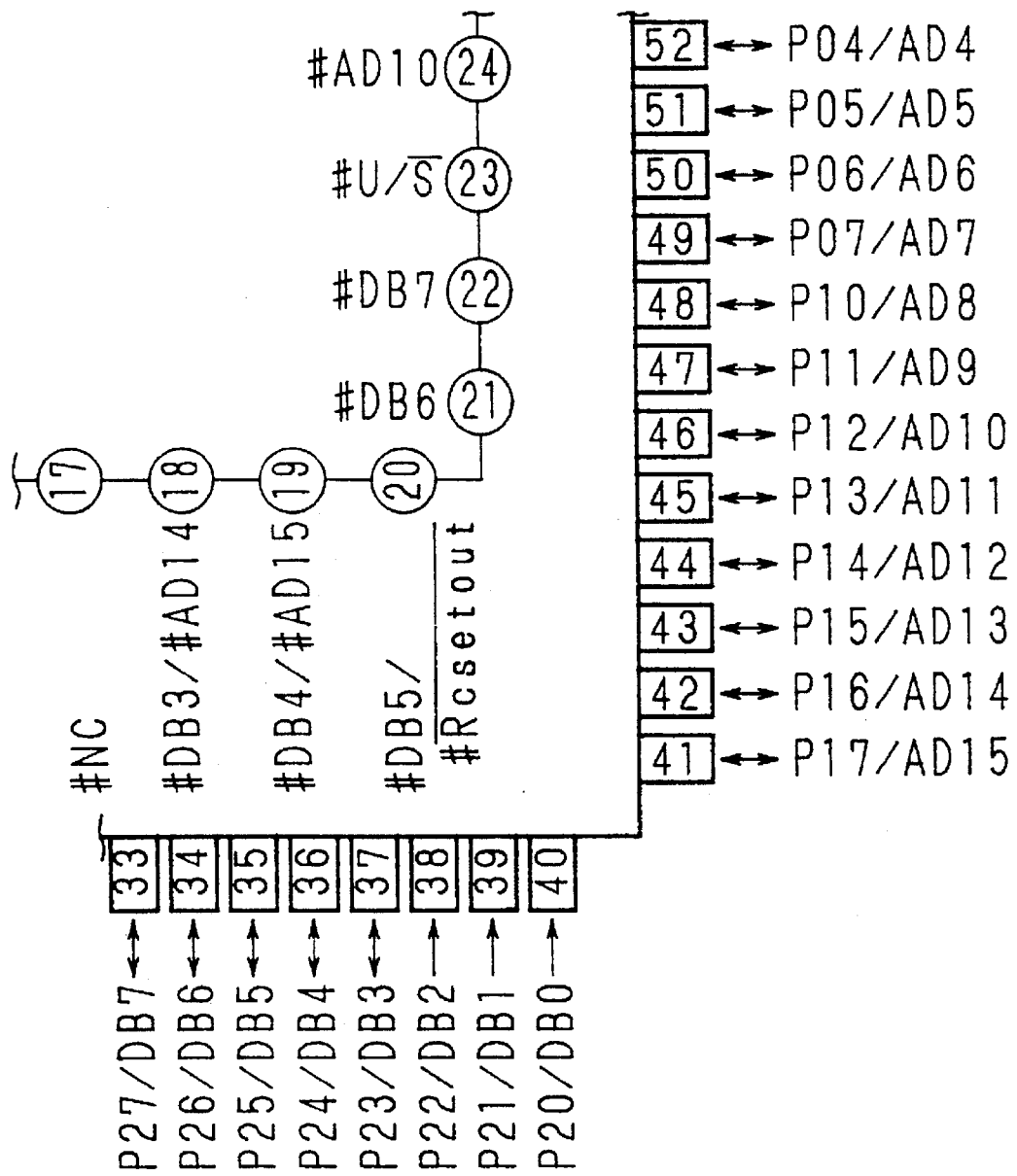
FIG. 39 is a schematic diagram illustrative of the pin connection of the emulation chip in the microcomputer of the invention.
Figure 40:
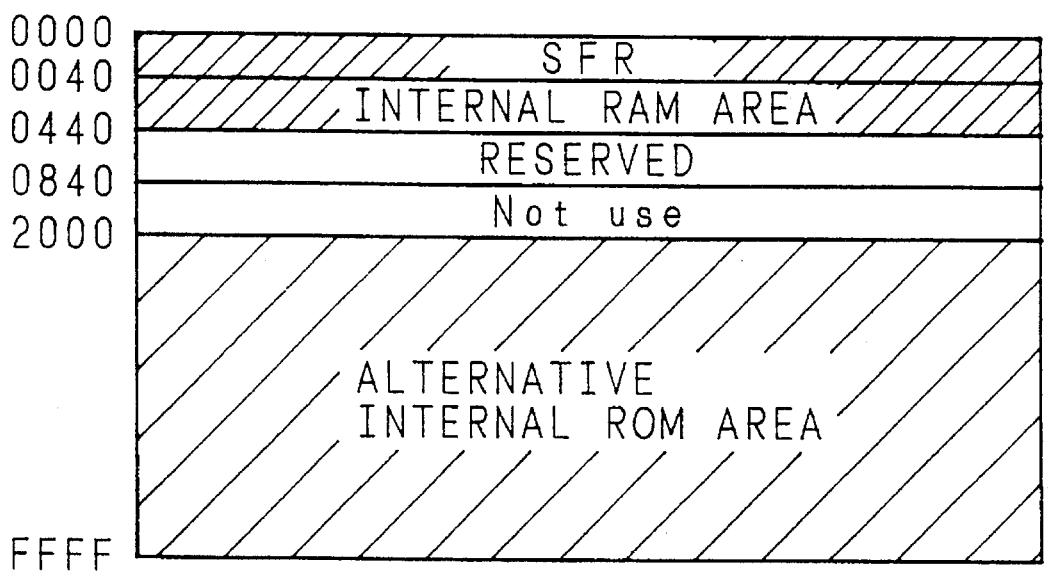
FIG. 40 is a schematic diagram illustrative of the memory allocation of the emulation chip of the microcomputer incorporating the sub CPU of the microcomputer of the invention.
Figure 41:
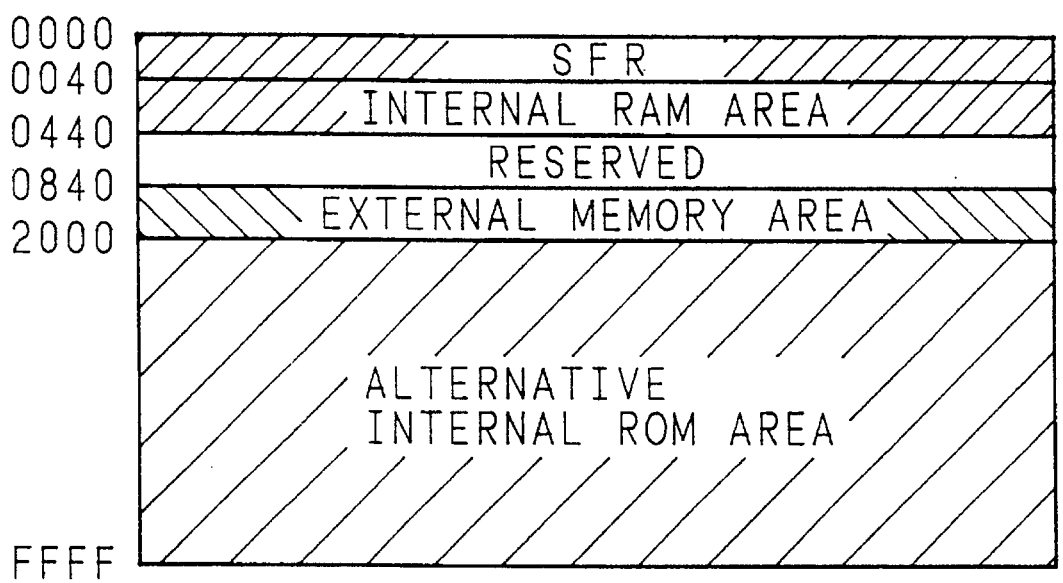
FIG. 41 is a schematic diagram illustrative of the memory allocation of the emulation chip of the microcomputer incorporating the sub CPU of the microcomputer of the invention.
Figure 42:
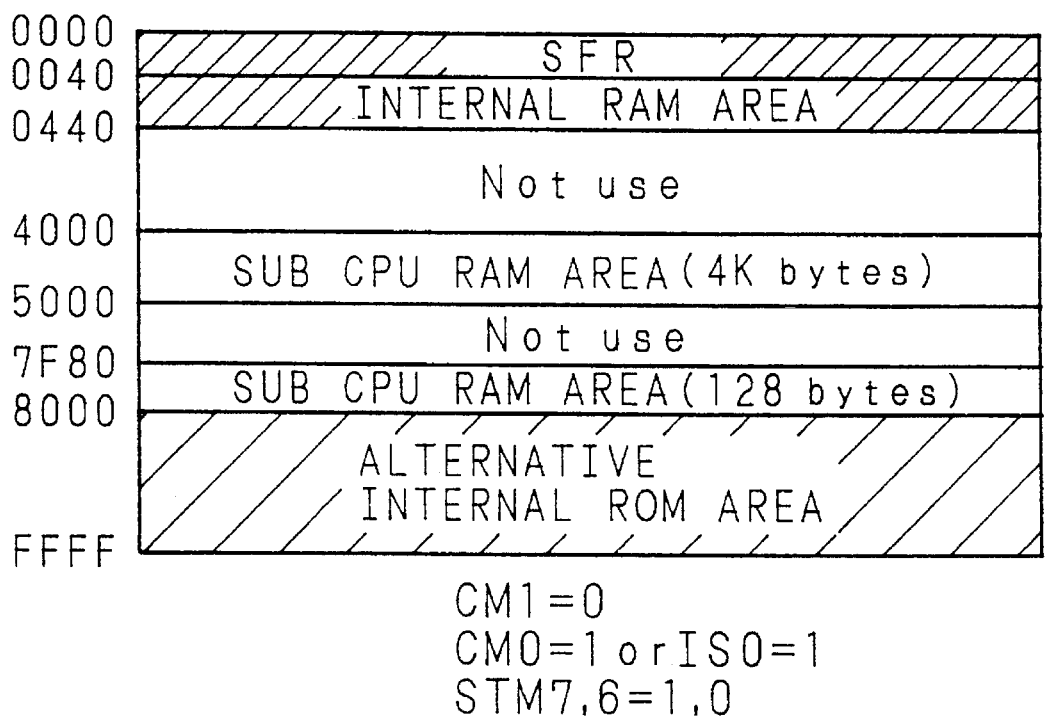
FIG. 42 is a schematic diagram illustrative of the memory allocation of the emulation chip of the microcomputer incorporating the sub CPU of the microcomputer of the invention.
Figure 43:
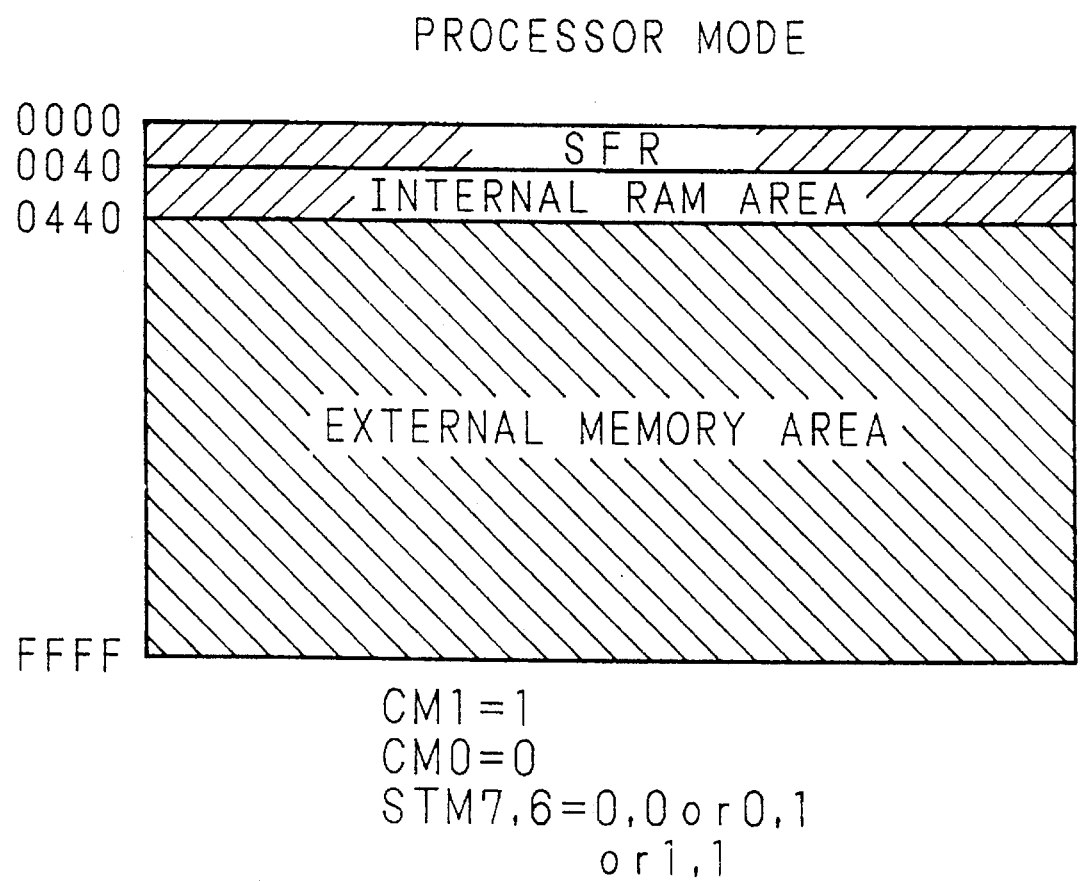
FIG. 43 is a schematic diagram illustrative of the memory allocation of the emulation chip of the microcomputer incorporating the sub CPU of the microcomputer of the invention.
Figure 44:
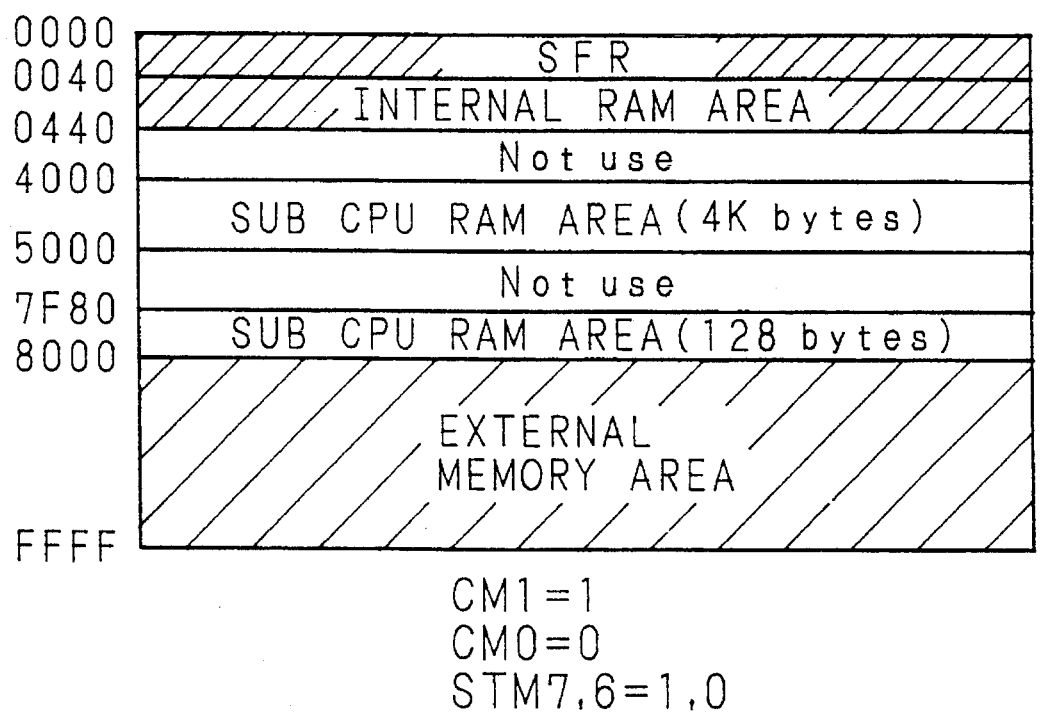
FIG. 44 is a schematic diagram illustrative of the memory allocation of the emulation chip of the microcomputer incorporating the sub CPU of the microcomputer of the invention.
Figure 45:
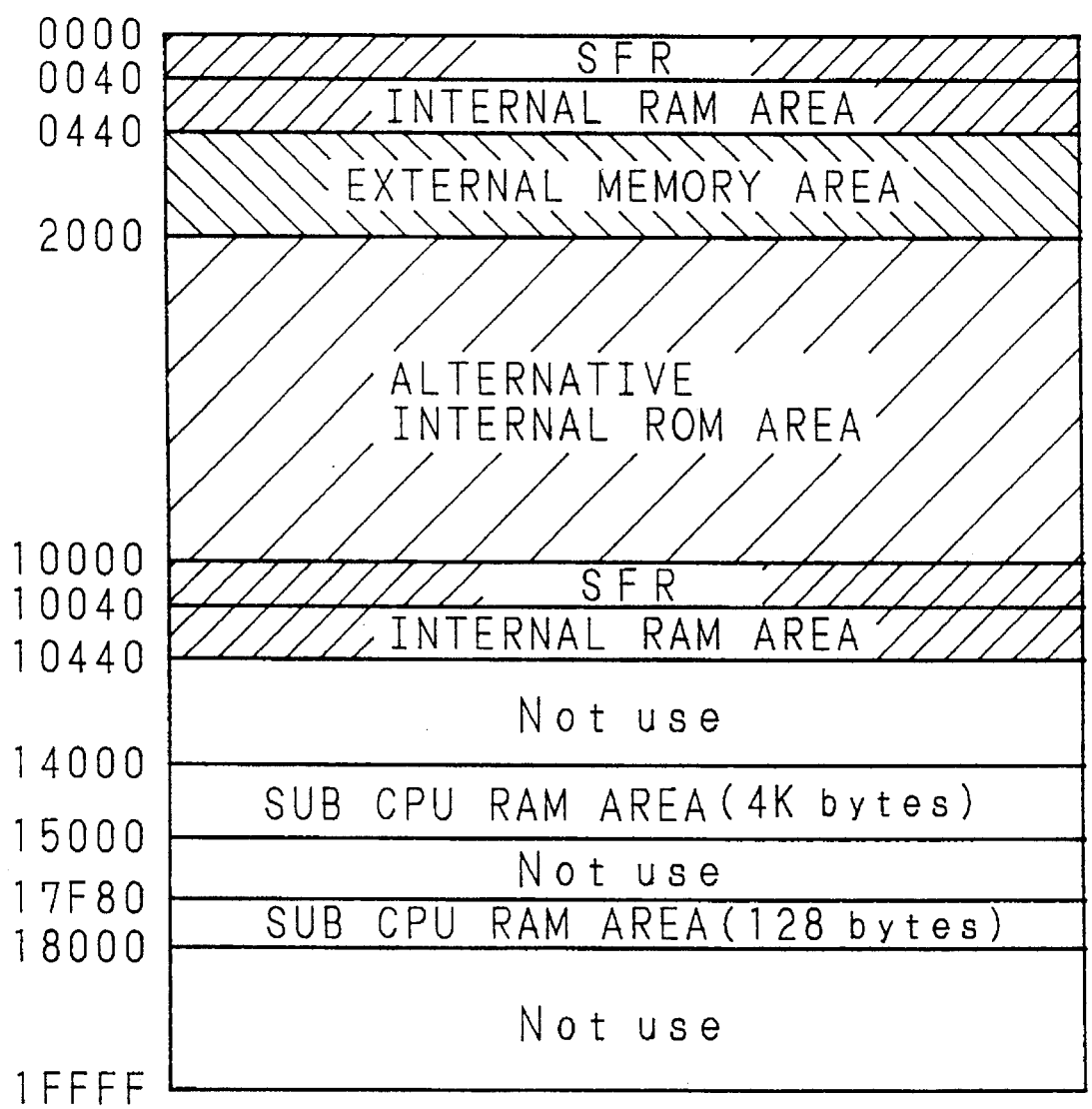
FIG. 45 is a schematic diagram illustrative of the memory allocation of the emulation chip of the microcomputer incorporating the sub CPU of the microcomputer of the invention.

FIG. 34 is a schematic diagram illustrative of the terminals of the LSI chip 21 of the microcomputer of the invention for controlling from the outside, which is basically the same as in the prior art.

In FIG. 34, terminal names enclosed in [ ] represent control terminals used during EPROM mode. Specifically, Vpp is a a power terminal for writing the EPROM, CEB and OEB are chip select and output enable control terminals, BWTEST, DTESTB, GTESTB are EPROM test terminals, and VRFY is a mode control terminal unique to the invention.

Address output terminals AD0 through AD15 and data input/output terminals DB0 through DB7 are shared by the processor mode and are used also at the EPROM mode. The terminal AD16 is unique to the microcomputer of the invention, and receives a control signal from the outside to distinguish the address space of the sub CPU 1 and the address space of the main CPU 23 applied thereto.

FIG. 35 is a schematic diagram illustrative of the states of the inputs on the mode setting terminals of the microcomputer shown in FIG. 34 for each mode during EPROM mode.

While ordinary individual EPROM is constituted so that the mode can be changed by switching the voltage of the write power terminal Vpp between 12 V and 5 V, this function is assigned to the VRFY terminal in the microcomputer of the invention. The microcomputer of the invention equipped with the built-in EPROM and the EPROM writing device for the programming thereof are connected via an adapter board provided with an exclusive control circuit. This constitution provided with the VRFY terminal is a special one, although similar to the prior art. This constitution makes it possible to have the Vpp terminal function as a double-function port serving also as the ordinary input terminal.

An example of emulators (ICE: In-Circuit Emulator) used for program development for the conventional microcomputer is PC4600 made by Mitsubishi Electric Co., Ltd. An exclusive emulation chip can be controlled from a host machine via this emulator. The host machine, under the control of exclusive control software "RTT 74" which is capable of real-time tracing, is capable of programming and debugging the microcomputer.

The microcomputer having the built-in sub CPU of the invention is also capable of operating with exactly the same emulator system provided that only control software is added therefor. The control software to be added is, for example, software to boot the program of the sub CPU 1 by making access to the memory of the sub CPU 1 from the main CPU bus 10 or software to monitor the contents of the registers and the memory provided in the sub CPU 1 by using the break function.

FIG. 36 through FIG. 39 are schematic diagrams illustrative of an example of terminals for pin-connection of the emulation chip described above, particularly the top face terminals connected with the emulator controller PC4600, showing a constitution basically the same as that of the conventional microcomputer.

In the example shown in FIG. 36 through FIG. 39, address signals #AD0 through #AD15, data signals #B0 through #B7, as well as write control signal #WR, read control signal

RD, instruction synchronizing signal #SYNC, reset output signal #RESETout and power terminals #Vss, #Vcc are provided. In addition, #U/S signal input terminal for the selectively controlling the user mode and system mode is provided. Terminals from 1st pin through 80th pin located at the bottom surface are arranged in the same layout as the functions of the microcomputer having the mask ROM or EPROM being built therein of the final target, and an emulation tool having the same electrical characteristics is provided at the time of program development.

In the microcomputer having the sub CPU of the invention built therein too, functions of the terminals on top surface of the emulation chip are the same as those of the prior art in such a constitution as the conventional emulation system can be used as it is.

FIG. 40 through FIG. 45, FIG. 46, FIG. 47, FIG. 48A and FIG. 48B are schematic diagrams illustrative of the memory allocation of the emulation chip in one embodiment of the microcomputer with the sub CPU of the invention being built therein.

Although the memory allocation shown in these drawings is almost the same as the memory allocation of the mask ROM or EPROM shown in FIG. 24 through FIG. 29, FIG. 30, FIG. 31, FIG. 32A and FIG. 32B, the ROM area of the main CPU 23 serves as a kind of external memory area (alternative internal ROM area) whereto data is supplied from the emulator controller upon receipt of a signal at a terminal on the top surface. There is no restriction for the RAM size on the main CPU 23 side to be the same. Memory on the sub CPU 1 side is constituted of RAM instead of ROM in order to make it easy to rewrite the program.

FIG. 49 through FIG. 52 are block diagrams illustrative of the constitution of a memory read-out circuit of the sub CPU 1 in one embodiment of the microcomputer of the invention. In the microcomputer of the invention, it is required for the memory of the sub CPU 1 to be accessible from the main CPU 23 as well as from the sub CPU 1 as described so far, and therefore a kind of dual-port memory constitution becomes necessary.

Figure 49:
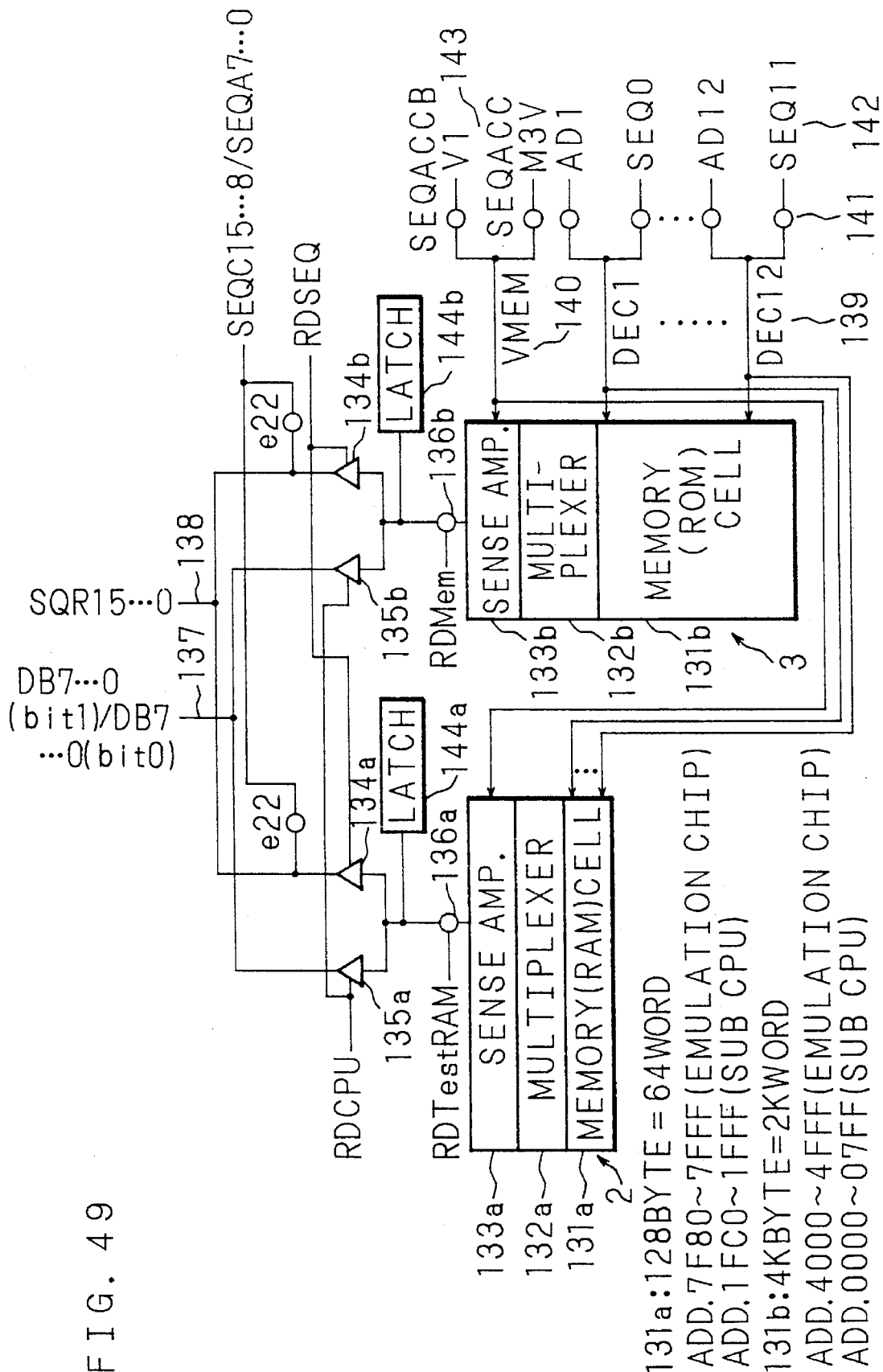
FIG. 49 is a block diagram illustrative of the constitution of a memory read-out circuit of the sub CPU of the microcomputer of the invention.

FIG. 49 shows the constitution of the memory read-out circuit to read from the RAM 2 and the ROM/EPROM 3 of the microcomputer of the invention. In FIG. 49, numeral 131(a, b) denotes memory cells of the RAM 2 and the ROM/EPROM 3, numeral 132(a, b) denotes multiplexers of read-out bit lines of the memory cells 131(a, b), and numeral 133(a, b) denotes sense amplifiers for data read-out from the memory cells 131(a, b).

Numeral 135(a, b) denotes a bus buffer to drive data which is read from the memory cells 131(a, b) to the main CPU data bus 137. The bus buffer 135(a, b) is driven to output to the main CPU data bus 137 when the RDCPU signal is true, and becomes a high impedance for the output to the main CPU data bus 137 when it is false. The RDCPU signal is obtained by decoding the address of the main CPU 23 and the read signal thereof and the sub CPU test mode bits STM 7, STM 6.

The numeral 134(a, b) denotes bus buffers to drive data read out from the memory cells 131(a, b) to the sub CPU data bus 138. The bus buffers 134(a, b) are driven to output to the sub CPU data bus 138 when the RDSEQ signal is true, and is set to a high impedance for the output to the sub CPU data bus 138 when it is false. The RDSEQ signal is obtained by decoding the address of the sub CPU 1 and the read signal thereof. The sub CPU test mode bits STM 7, STM 6 are not necessarily be related to this decoding operation.

Numeral 136(a, b) denotes gates to control the output of the sense amplifiers 133(a, b), and the output thereof is held by a latch denoted by numeral 144b and is at the same time supplied to the bus buffers 134b, 135b described above, when the RDMem signal is true on the ROM/EPROM 3 side. When the RDMem signal is false, the gate 136b is turned OFF so that the data held by the latch 144b remains to be supplied to the bus buffers 134b, 135b. On the RAM 2 side, on the other hand, the data is held by a latch denoted by numeral 144a and is at the same time supplied to the bus buffers 134a, 135a described above, when the RDTestRAM signal is true. When the RDTestRAM signal is false, the gate 136b is turned OFF so that the data held by the latch 144a remains to be supplied to the bus buffers 134a, 135a.

Consequently, on the ROM/EPROM 3 side, data is outputted to the sub CPU data bus 138 when the RDMem signal is true and the RDSEQ signal is true, and is outputted to the main CPU data bus 137 when the RDMem signal is true and the RDCPU signal is true. On the RAM 2 side, data is outputted to the sub CPU data bus 138 when the RDTestRAM signal is true and the RDSEQ signal is true, and is outputted to the main CPU data bus 137 when the RDTestRAM signal is true and the RDCPU signal is true.

DEC1 through DEC12 denoted by numeral 139 are address signals supplied to the memory cells 131(a, b), and selected from either SEQ 0 through SEQ 11 on the sub CPU 1 side denoted by numeral 142 or addresses AD1 through AD12 on the main CPU 23 side, by sub CPU mode switching signal SEQACC at the gate 141.

Similarly, a VMEM signal denoted by numeral 140 is a synchronizing signal for accessing the memory cells 131(a, b), and selected either a clock M3V on the sub CPU 1 side or a clock V1 on the main CPU 23 side by means of the SEQACC signal. Because the bus on the main CPU 23 side has 8-bit width and the bus on the sub CPU 1 side has 16-bit width in this embodiment, data DB7 ... DB0 (bit1) and DB7 ... DB0 (bit0) of the main CPU data bus 137 make one set. Therefore, to output data to the main CPU data bus 137, outputs from the sense amplifier block of both bits are connected by the control of the address line bit 0AD0. Data of the sub CPU data bus 138 is denoted by SQR15 through SQR0.

In the example shown in FIG. 49, the bus buffers 134b, 135b of the memory cell 131b of the ROM/EPROM 3 and the bus buffers 134a, 135a of the memory cell 131a of the RAM 2 are separated. However, constitution shown in FIG. 49 may be modified to make such a constitution as shown in FIG. 50.

Figure 50:
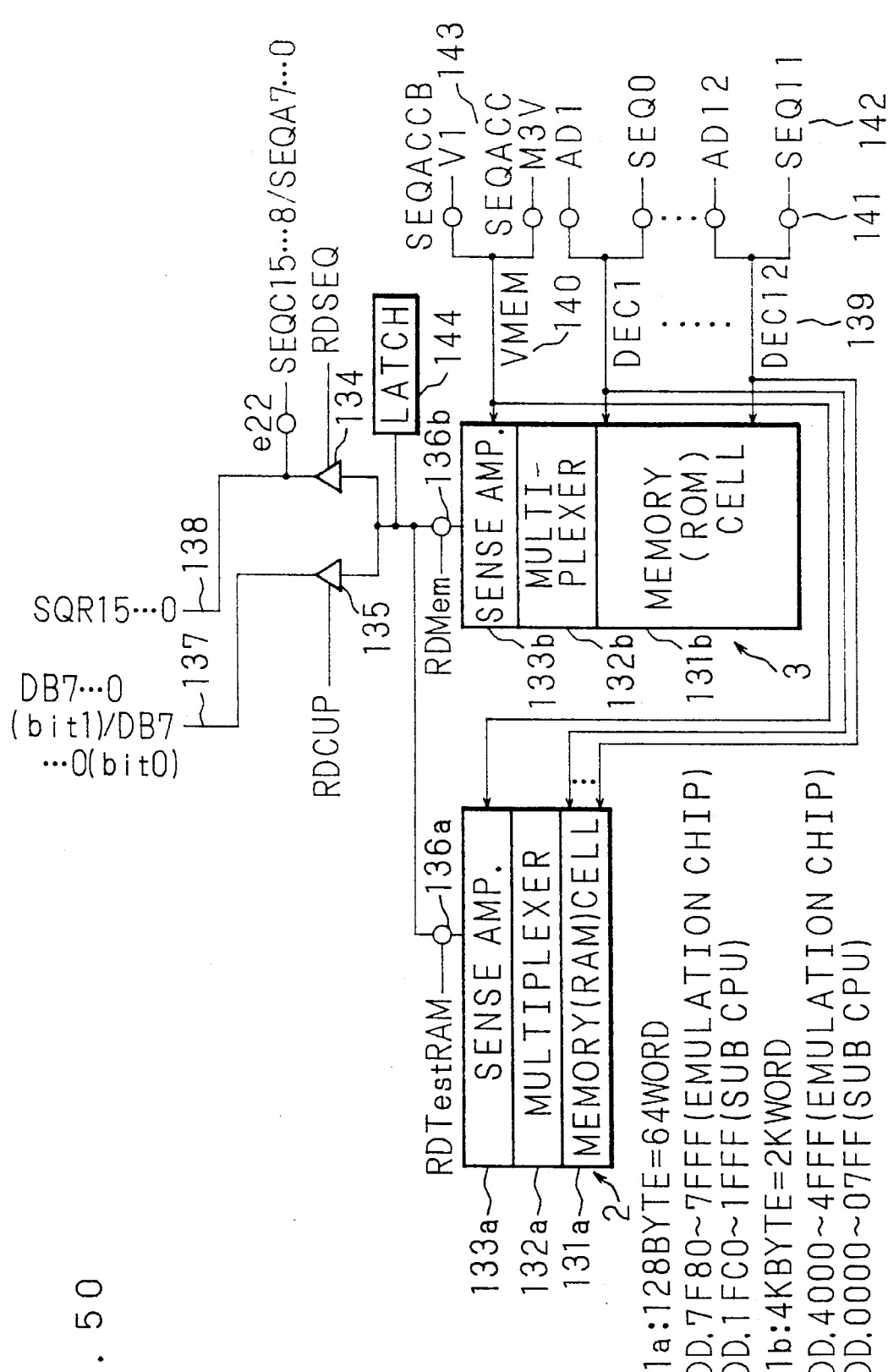
FIG. 50 is a block diagram illustrative of the constitution of a memory read-out circuit of the sub CPU of the microcomputer of the invention.

In the circuit shown in FIG. 50, output from the sense amplifier 133a of the RAM 2 and output from the sense amplifier 133b of the ROM/EPROM 3 are coupled to supply read-out data to the two bus buffers 134, 135.

Figure 46:
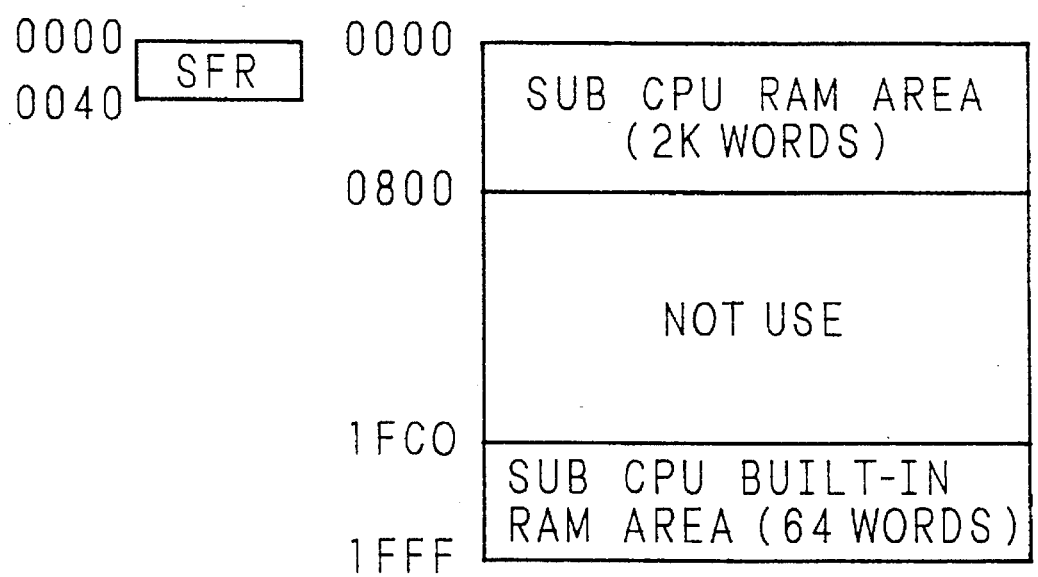
FIG. 46 is a schematic diagram illustrative of the memory allocation of the emulation chip of the microcomputer incorporating the sub CPU of the microcomputer of the invention.
Figure 51:
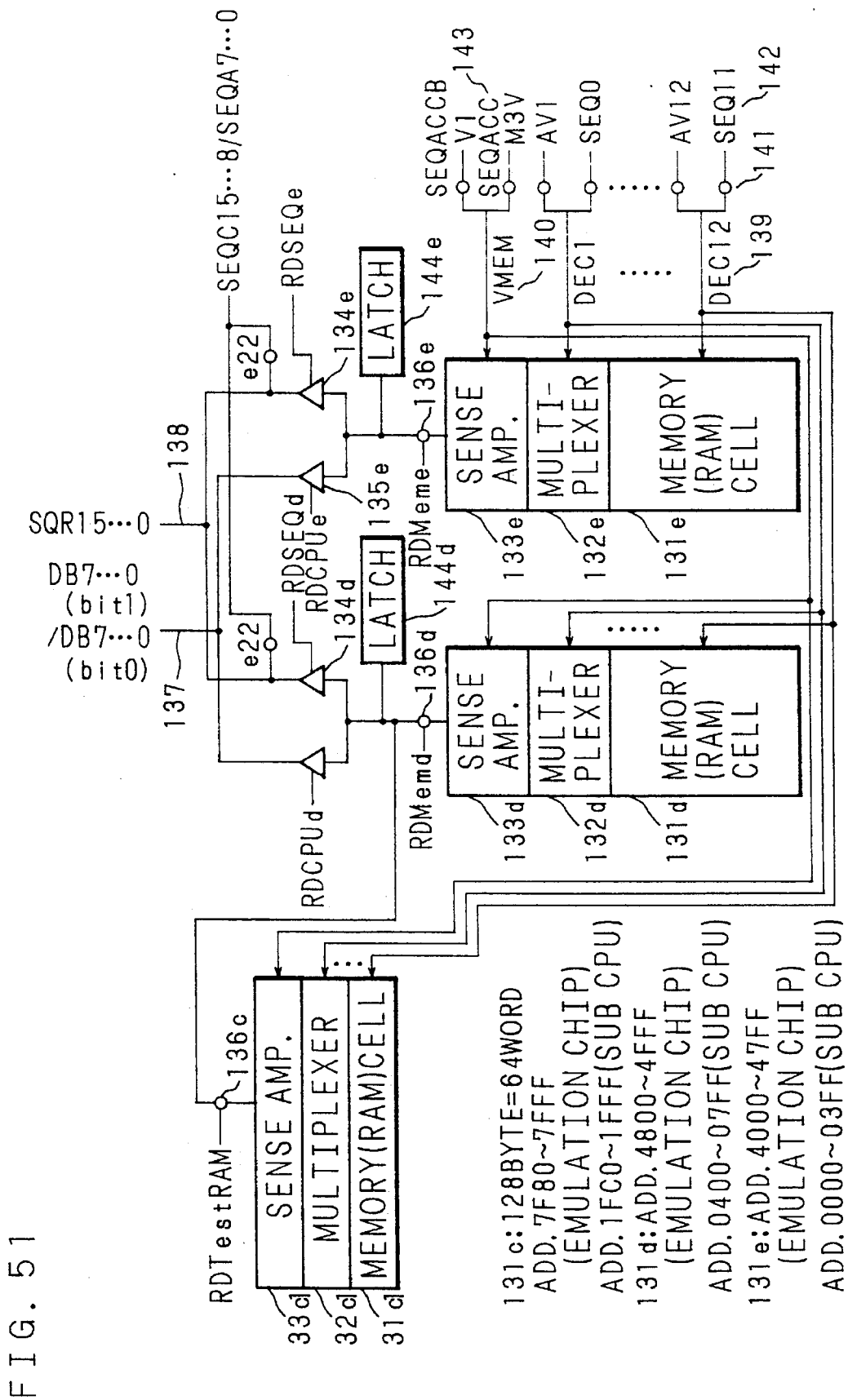
FIG. 51 is a block diagram illustrative of the constitution of a memory read-out circuit of an emulation chip incorporating the sub CPU of the microcomputer of the invention.

FIG. 51 is a block diagram illustrative of an example of circuit constitution wherein the ROM area of the sub CPU 1 is replaced with the RAM area for the emulation chip. In FIG. 51, memory allocation of the memory cells 131c, 131d is shown in FIG. 46, and memory allocation of the memory cell 131e corresponds to addresses "0000" through "0800" of the built-in ROM area of the sub CPU 1 shown in FIG. 30.

Figure 52:
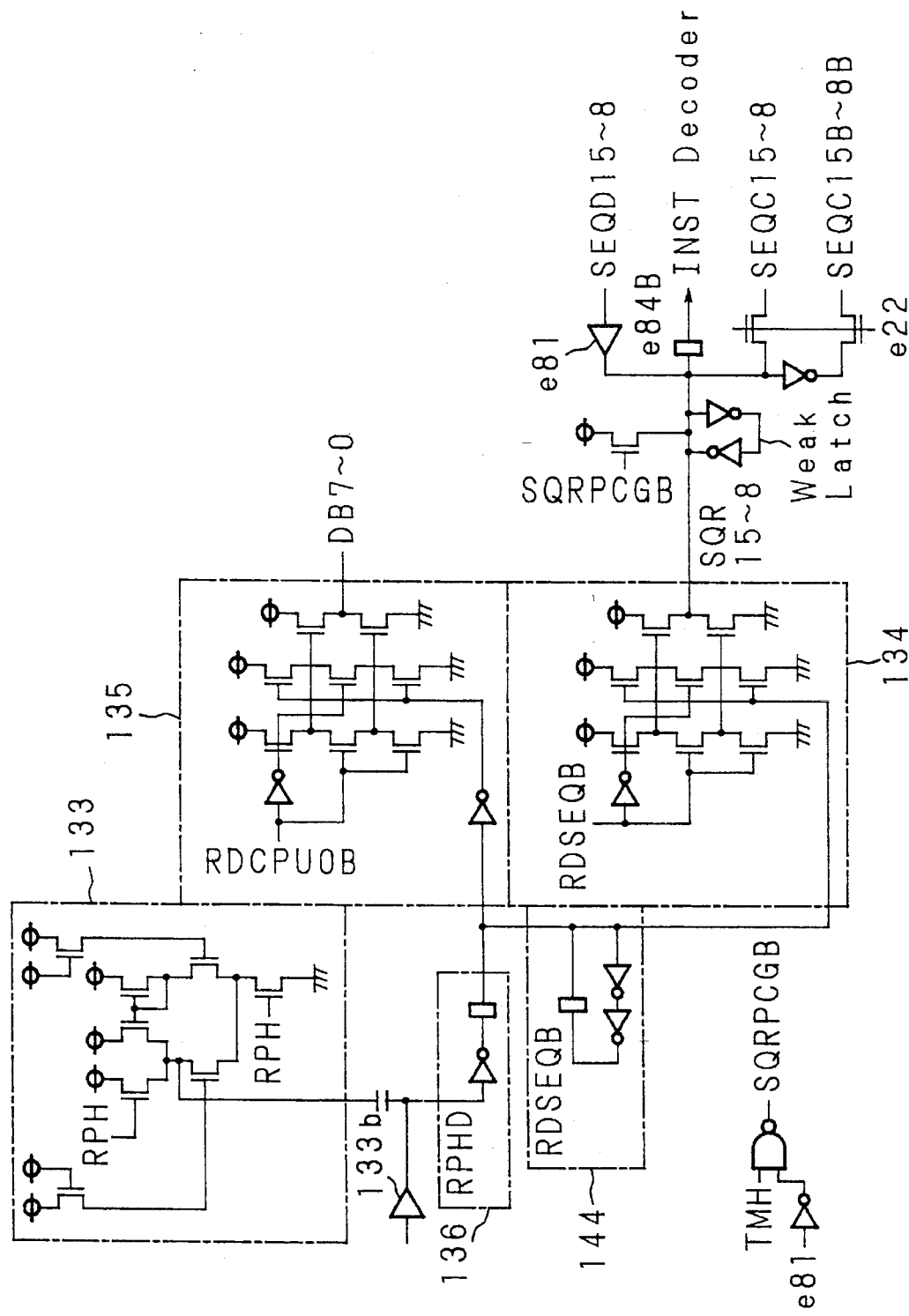
FIG. 52 is a logic circuit diagram illustrative of the specific constitution of the memory read-out circuit of the sub CPU of the microcomputer of the invention.

FIG. 52 is a detailed logic circuit diagram to realize the constitution of the ROM/EPROM 3 side shown at the right-hand side of FIG. 49.

In FIG. 52, numeral 133b denotes a sense amplifier of the ROM/EPROM 3, where a signal from a bit signal line selected by the multiplexer 132b from bit lines of the memory (ROM) cell 131b shown in FIG. 49 is compared with a reference voltage, and the result is supplied to the gate 136.

Figure 53:
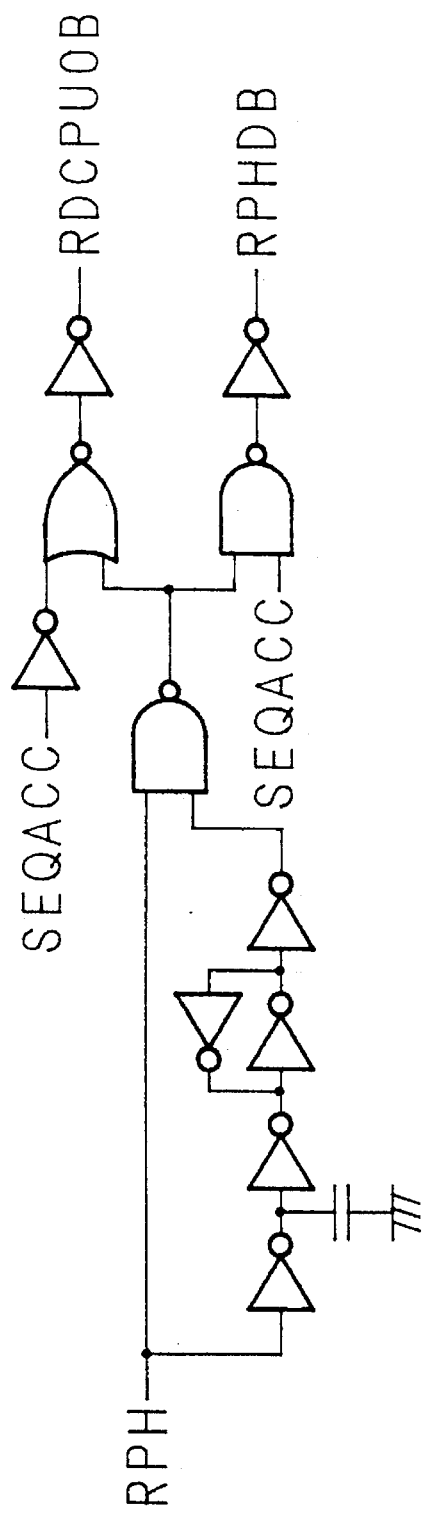
FIG. 53 is a circuit diagram illustrative of the constitution of a circuit to generate a signal for controlling delay of rising of a sense amplifier output.
Figure 54:
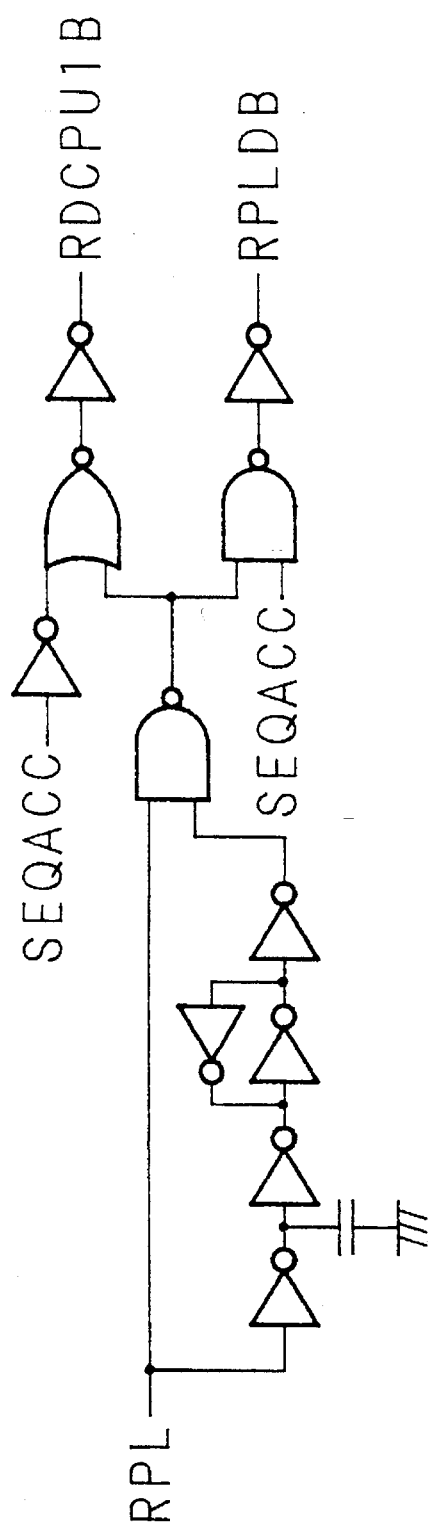
FIG. 54 is a circuit diagram illustrative of the constitution of a circuit to generate a signal for the control of the delay in rise of a sense amplifier output.
Figure 55:
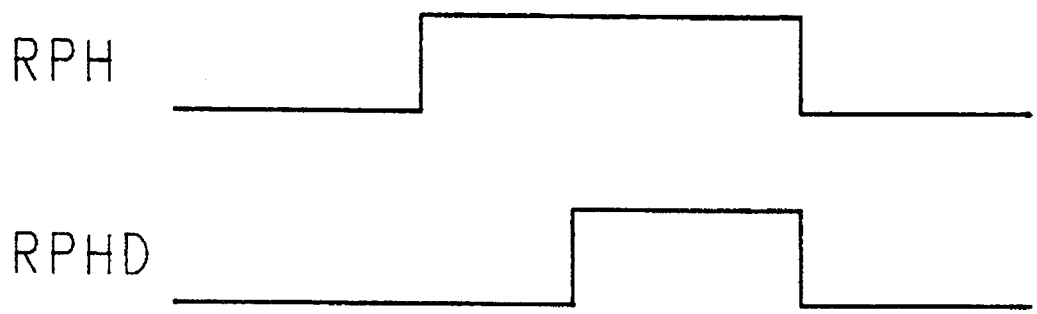
FIG. 55 is a timing chart illustrative of the timing of RPH, RPHD signals for controlling delay of rising of a sense amplifier output.

FIG. 53, FIG. 54 are circuit diagrams illustrative of examples of circuit constitutions to control the delay in rising of RPH signal. The RPH signal and the RPHD signal having such a relationship as shown in FIG. 55 are obtained by such circuit. The delay is provided in order to supply data to a buffer in the next stage after the data was read from the ROM/EPROM 3 and completely established, because reading of data by means of the sense amplifier 133*b* requires a certain length of time. Established data is held by the latch 144*b* and, at the same time, supplied to the two buffers 134*b*, 135*b*. These buffers 134*b*, 135*b* are tri-state buffers subject to active control by means of the RDSEQ signal or the RDCPU0 signal.

FIG. 56 is a circuit diagram illustrative of a circuit constitution to generate a timing signal RDROMZ for reading the ROM and a timing signal PGMEM for writing the EPROM, where they are generated upon input of the address signal, read signal and synchronizing clock SQMEMCLK. The entire ROM/EPROM 3 is constituted as a combination of two 8-bit blocks specified by decoding the least significant address AD0.

Figure 57:
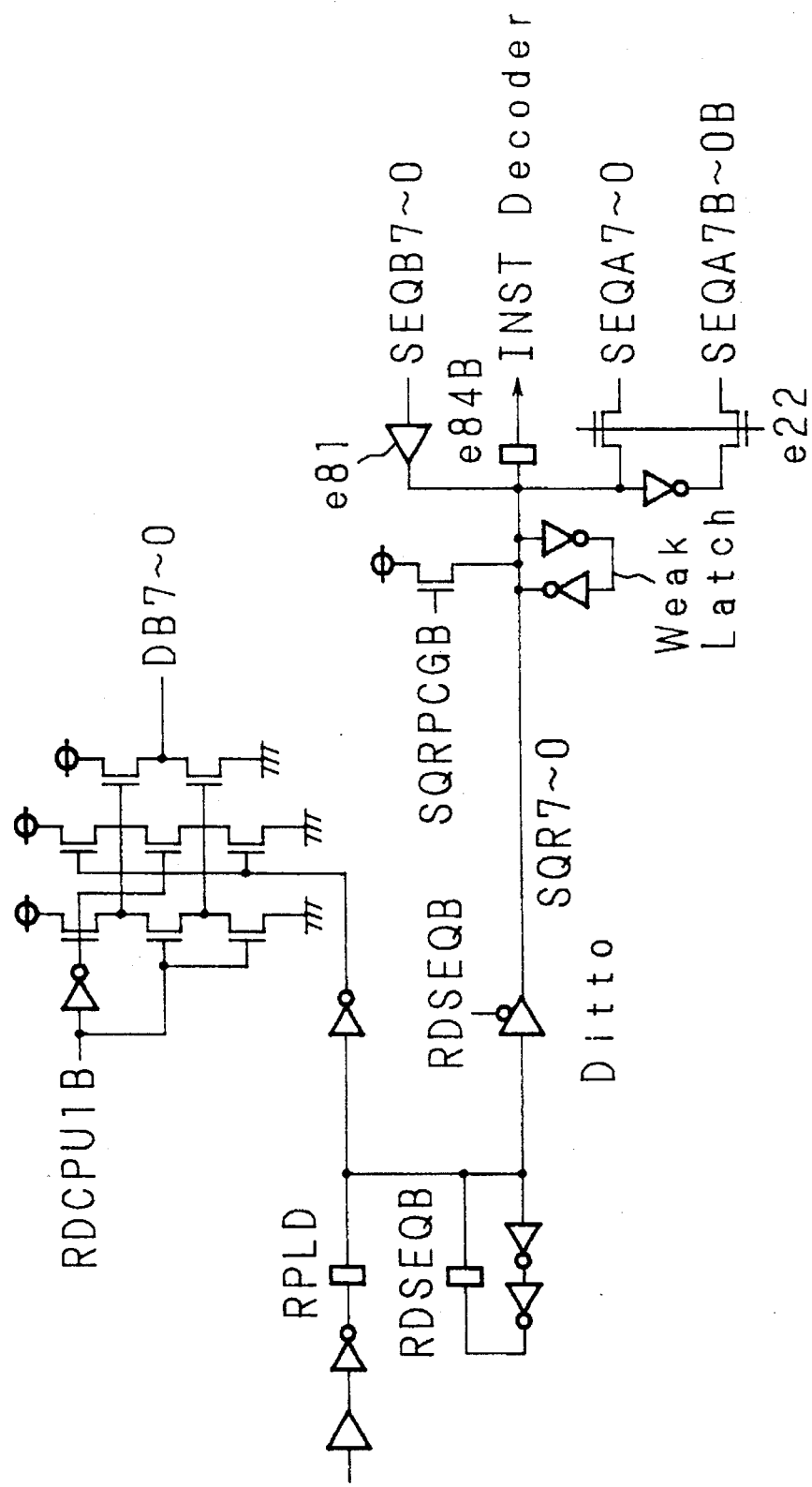
FIG. 57 is a circuit diagram illustrative of the specific constitution of a circuit of the lower 8 bits corresponding to FIG. 52.
Figure 58:
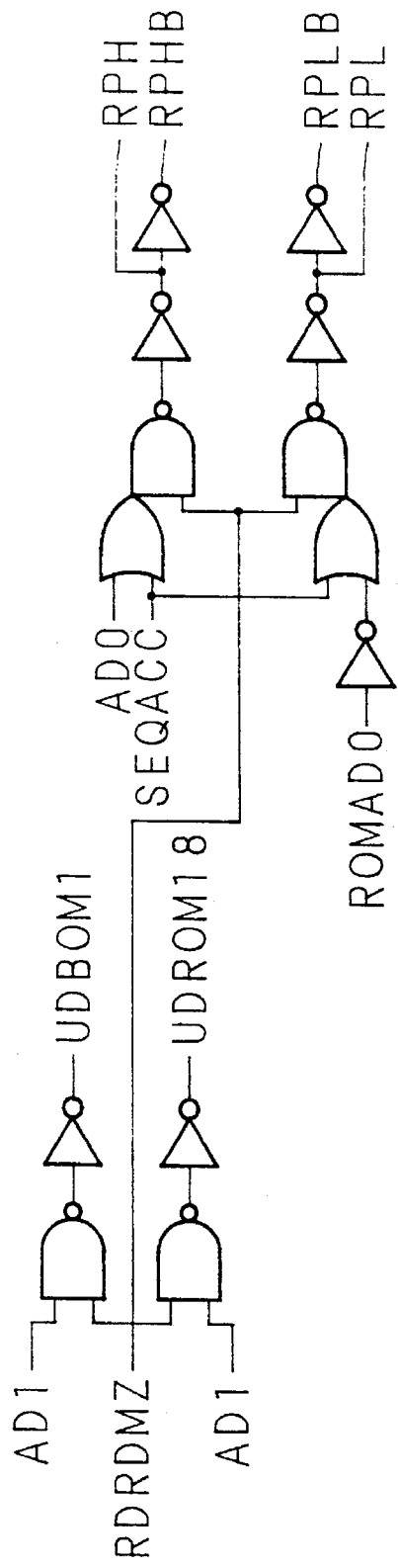
FIG. 58 is a circuit diagram illustrative of the constitution of a circuit for generating sense amplifier read-out control signals RPH, RPL.

FIG. 57 is a circuit diagram illustrative of the constitution of a sense amplifier and a bus buffer which correspond to the lower portion of the circuit shown in FIG. 52. FIG. 58 is a block diagram illustrative of a circuit constitution to generate read-out control signals RPM, RPL by using AD0 signal therefor.

Figure 59:
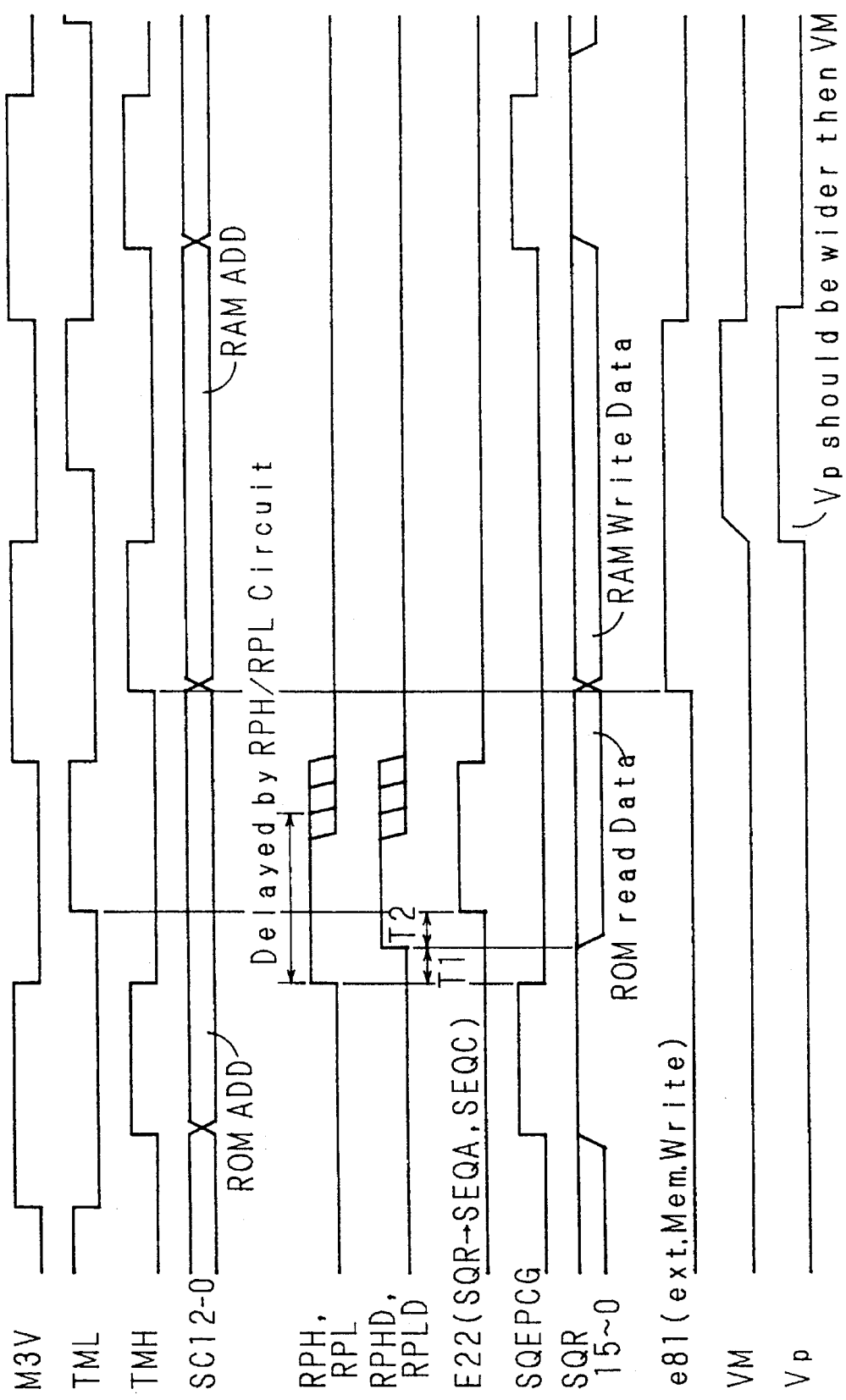
FIG. 59 is a timing chart illustrative of the timing of reading data from the ROM of the sub CPU of the microcomputer of the invention.

FIG. 59 is a timing chart illustrative of the reading timing from the ROM shown in FIG. 52, where the timing of accessing to the ROM 3 by the sub CPU 1 is shown.

In FIG. 59, M3V denotes a system clock of the sub CPU 1, and TML and TMM are timing signals obtained from the clock M3V by providing delay to the rising or falling thereof. SC12 through SC0 are values of the address bus of the CPU 1. Contents of the memory are accessed according to the ROM address (ROM ADD) or the RAM address (RAM ADD). Data reading from the memory is carried out in a period when the system clock M3V is at "L" level. With a delay of T1 on the timing of the sense amplifier reading signal RPH, RPL, timing of the holding signals RPHD, RPLD for the buffer latch 144 are controlled and, with a delay of T2 thereon, timing of the signal E22 to be supplied to the ALU 38 of the sub CPU 1 is controlled. These delays are provided in order to supply data to the signal tines in the next stage having greater wiring capacity load after the data has been established.

Figure 60:
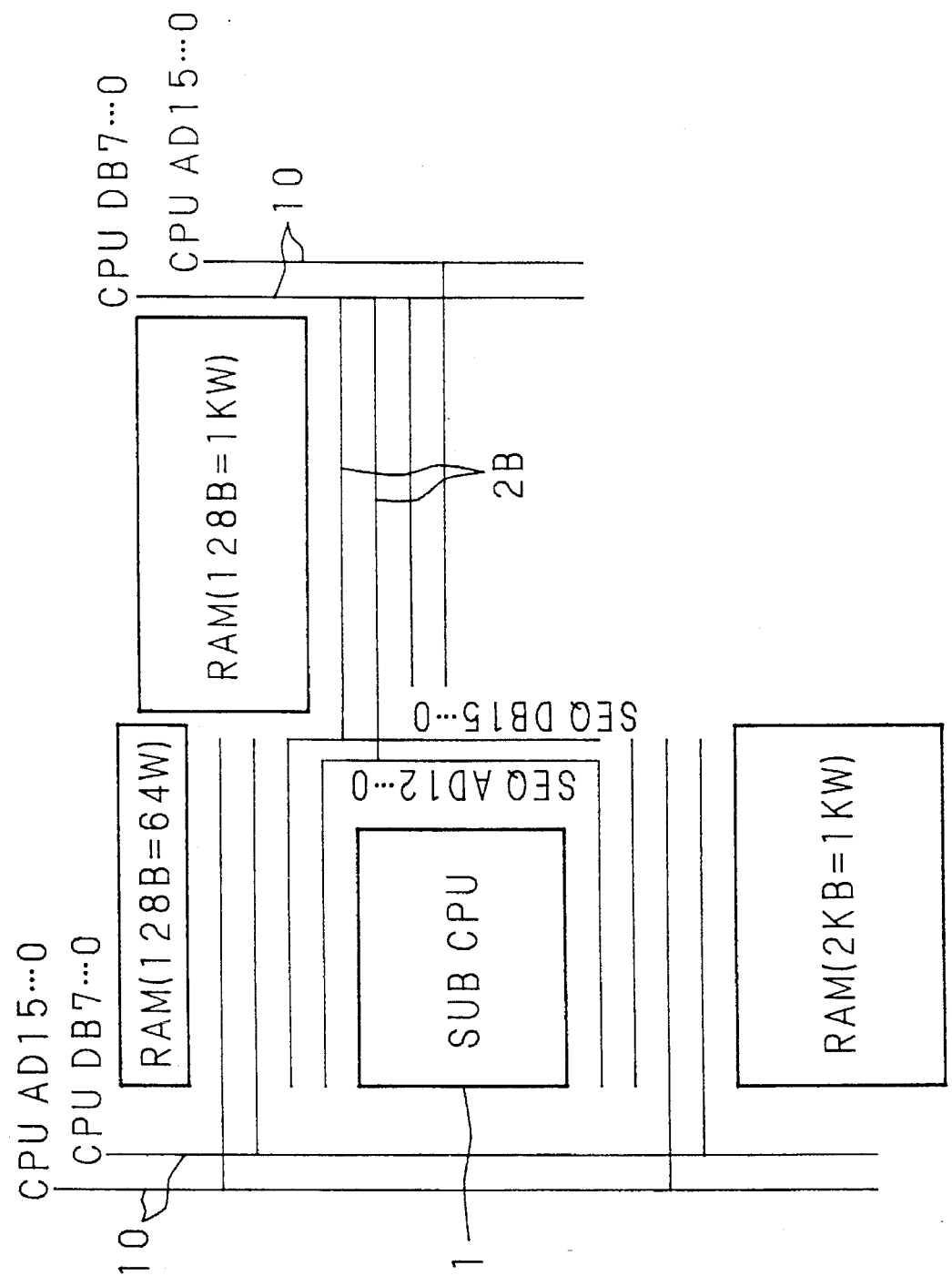
FIG. 60 is a schematic diagram illustrative of an example of chip layout of the sub CPU and the memory thereof of the microcomputer of the invention.
Figure 61:
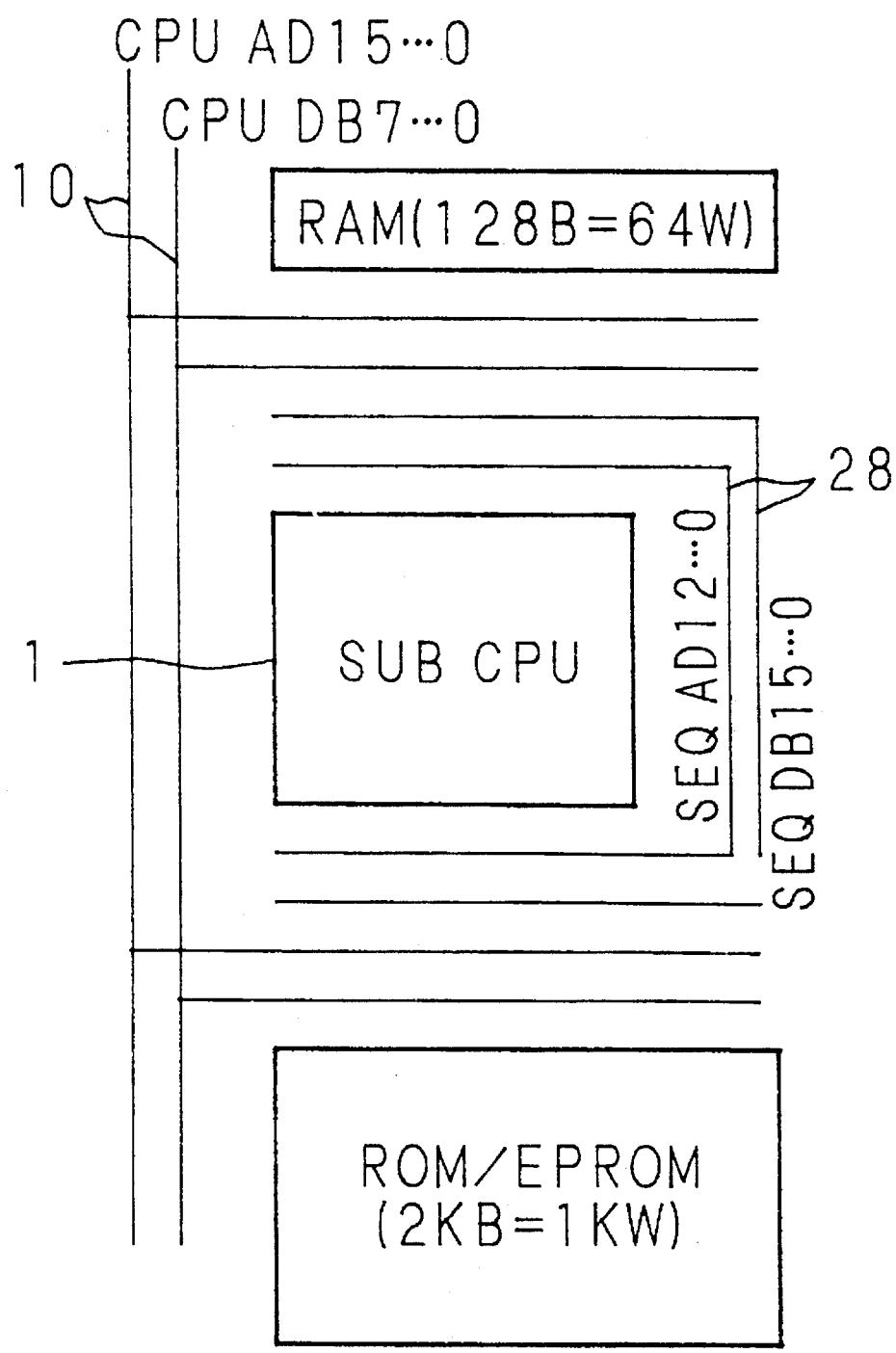
FIG. 61 is a schematic diagram illustrative of an example of chip layout of the sub CPU and the memory thereof of the microcomputer of the invention.

FIG. 60, FIG. 61 are schematic diagrams illustrative of the sub CPU 1 of the microcomputer of the invention and the layout of the memory thereof on the chip.

As described above, because the memory of the sub CPU 1 is required to be accessible in parallel from the two CPUs, namely the sub CPU 1 and the main CPU 23, it is necessary to arrange the main CPU bus 10 (CPU AD15 through AD0 and CPU DB7 through DB0) and the sub CPU bus 28 (SEQAD12 through SEQAD0 and SEQDB15 through SEQDB0) adjoining each other. It is also necessary to arrange a plurality of memory blocks such as ROM memory blocks and RAM memory blocks, which require accessing from two kinds of bus.

On such considerations as described above, memory of the emulation chip is constituted as shown in the schematic diagram of FIG. 60, and memory of the target product built-in the mask ROM or the EPROM is constituted as shown in the schematic diagram of FIG. 61.

Now the operation of the preferred embodiments of the microcomputer of the invention constituted as described above will be described below.

At first, the embodiment corresponding to claim 1 and claim 4, namely a switching circuit for accessing to the memory area of the sub CPU 1 side from the sub CPU 1 by means of a control register which is accessible from the main CPU 23, will be described below.

As described in conjunction with FIG. 17 and FIG. 18, memory area of the main CPU 23 and the memory area of the sub CPU 1 are separated in the microcomputer of the invention, so that the memory area of the main CPU 23 is accessed from the main CPU 23 and the memory area of the sub CPU 1 is accessed from the sub CPU 1 independently. However, for the purpose of testing the sub CPU 1 as described below or to provide a program debugging tool, the memory area of the sub CPU 1 is made to be accessible from the main CPU 23. This special mode of operation is executed in several cases.

One of the cases is when the test mode control bits STM 7, STM 6 are set to the debug mode. In this case, allocation of the both memory areas corresponds to the relationship are allocated as shown in FIG. 25 and FIG. 26, or as shown in FIG. 27 and FIG. 28. Because values of the sub CPU test mode control bits STM 7, STM 6 can be set from the main CPU 23, a series of operations can be controlled by access from the main CPU 23.

Another case is to use the AD16 at the EPROM mode or the peripheral test mode. Introducing the expanded 1-bit address AD16 enables it to expand the memory space from the normal size of 64K bytes to 128K bytes at a special mode. Thus the memory area of the sub CPU 1 becomes accessible from the main CPU 23. In this case, allocation of the memory area becomes allocated as shown in FIG. 29 through FIG. 31 and FIG. 32A, FIG. 32B. Setting of the EPROM mode and the peripheral test mode are adopted in the conventional microcomputer too, and the setting can be made by applying a signal to the terminal of the microcomputer directly from the outside without operating the main CPU 23.

In order to test, the memory area of the sub CPU 1 using the peripheral test mode, at first, external terminals of the microcomputer are set in a predetermined procedure to switch the peripheral test mode, then the address of the memory of the sub CPU 1 is supplied from the address terminal. In the example shown in FIG. 29, an area from address "14000" through "14FFF" is read simply by using the expansion address AD16 at ROM test, thereby making it possible to read the data written in the mask ROM or the EPROM and check the contents. At RAM test, test data is once written in the area from address "17F80" through "17FFF" then the data is read from these addresses to check to see whether the written data is read correctly, thus the operation of the RAM circuit can be checked. The process is the same as described above when the processor mode is used, in which case memory of the sub CPU 1 is tested by running a program of the main CPU 23 after setting the sub CPU test mode control bits STM 7, STM 6 to the debug mode.

In the embodiment of the EPROM mode corresponding to claim 6, as described previously with reference to FIG. 33, ordinary memory area is expanded by adding one bit of address bit line, namely the AD16, to correspond the memory of the sub CPU 1. The AD16 and EPROM mode judging signal are inputted to the address decoding circuit of the sub CPU 1, and the AD16 becomes effective at the EPROM mode. Naturally, when designing such a circuit for the memory of the main CPU 23, it is necessary to decode the AD16 being "0" at EPROM mode, so that outputs from or inputs to the memories of both CPUs will not be confused. Constitution of this portion is principally the same also in the peripheral test mode, and greater portion can be used in common for the decoding circuits for both CPUs.

Now an embodiment corresponding to claim 2 and claim 3, namely the operation of the microcomputer having means of generating the sub CPU reset vector exclusively for testing purpose, will be described below with reference to FIG. 17 through FIG. 23.

At first, the sub CPU 1 of the microcomputer of the invention is normally reset and started as described below. The sub CPU test mode bits STM 7, STM 6 are set to the normal mode "00", and "1" is written in the start control bit MINI shown in FIG. 19 with numeral 48. This causes the one-shot pulse circuit 49 to generate a single pulse so that the sub CPU reset signal Sub CPU reset is activated during the period of this pulse. At this time, when the sub CPU test mode bits STM 7, STM 6 are set to a mode other than the debug mode, the signal g8 is enabled and an instruction code generated by the special code generator 43 is inputted to the instruction latch 45 and the instruction decoder 46, while the reset signal g9 among the outputs of the instruction decoder 46 is activated and supplied to the post-decoder 47-2. The post-decoder 47-2 generates the logical product of the signal g9 and inverted value of the TEST signal and thereby causes the normal reset signal g0 to be activated. This causes the gate 55-1 to turn ON so that the output of the reset vector generator 52 is supplied to the program counter 5 of the sub CPU 1 thereby initializing the value of the program counter 5. Output of the program counter 5 is an address for accessing to the memory area of the sub CPU 1 and is outputted onto the path 56. As the value of the program counter 5 is reset (initialized), value stored in the memory in the program area indicated by the reset vector address is supplied, in the next cycle, to the instruction decoder 45 and the instruction latch 46 as the instruction code to be executed first.

Thereafter, the program counter 5 is incremented successively to execute the target program. This procedure is the same as that of the ordinary von Neuman type computers of the prior art.

Now the operation of resetting the sub CPU dedicated to the test, which is the characteristic feature of the invention, will be described below. However, operation is the same as the normal resetting operation.

In this case, the test mode control register 4 is set to the test mode (TEST=1). As value "1" is written in the start control register 48, the signal g0 among the outputs of the post-decoder 47-2 becomes "0" and the signal g1 becomes "1" (active). This causes the gate 55-2 to turn ON so that the value of the test vector register 53 is loaded to the program counter 5 and the program is started at the address specified by this value.

The test vector register 53 may not be constituted as a register, but may be made, in such a constitution as a fixed value is outputted by means of hardware. However, the constitution with the test vector register 53 to enables accessing from the main CPU 23 makes it possible to set any address which can be specified by the main CPU 23 for starting the program.

In case such a circuit constitution is constituted that the sub CPU block 15 is not reset by the hardware at test resetting, in addition to the above constitution, conditions when the program is interrupted during execution can be preserved and, under these conditions, the program can be restarted at a desired address, when making an emulator.

This function is very useful when combined with the stop (STP) instruction which corresponds to claim 10. For example, use of this function makes it possible to execute a long program with a small RAM area dedicated to the test. The stop instruction is to halt the execution of a program temporarily until next interrupt or reset signal is received. Function of the stop instruction is generally performed by stopping the system clock.

An example of test procedure which is made possible by combining the constitutions of claim 1, claim 2, claim 3, claim 4 and claim 10 will be described below.

At first, the main CPU 23 is put into operation in the processor mode or the memory expansion mode. Then the sub CPU test mode bits STM 7, STM 6 are switched to the debug mode thereby to write the first portion of the test program data of the sub CPU 1 in the memory RAM area of the sub CPU 1 from the main CPU 23. The first portion is provided with stop instruction at the end of the executable part thereof, to halt the execution of the program upon completion of the first portion. Then after writing the start address of the test program in the test vector register 53, value "1" is written in the start control bit 48 thereby to start the execution of the program. Thus execution of the first portion of the test program is started.

As shown at the bottom of FIG. 23, whether the program is at a halt or not is made to be detectable by monitoring the SEQSTP bit with the main CPU 23. By checking the SEQSTP bit upon lapse of an appropriate period of time, the main CPU 23 is also capable of detecting the halt of the sub CPU 1. Or alternatively, such a circuit may be employed that the main CPU 23 is interrupted when the sub CPU 1 is stopped, namely the SEQSTP bit is set to "1".

When the execution of the program of the sub CPU 1 has been stopped, the sub CPU test mode bits STM 7, STM 6 are set to the debug mode thereby to write the second portion of the test, program, that follows the first portion described above, from the main CPU 23 into the RAM portion of the sub CPU 1 similarly to the case described above. The second portion is also provided with the stop instruction at the end thereof. As the sub CPU test mode bits STM 7, STM 6 are set to the test mode thereby to write the start address of the second portion of the test program in the test vector register 53, execution of the program is started similarly to that described above.

As the test program is executed, data stored in memories such as the registers and the RAM of the CPU 1 is processed to rewrite the values. Whether the program is executed as intended or not can be checked by accessing the registers or the RAM from the main CPU bus 10 and examining the values thereof. This enables it to test the functions of the sub CPU 1 to see whether they work correctly.

When testing the function of adding up the values of registers A, B and storing the sum in a register C, for example, the test program sets values in the registers A, B and executes adding (ADD) instruction and stores the result in the register C. After transferring the result of addition stored in the register C to a register D which is accessible from the main CPU 23, stop instruction is executed and the value of the register D is checked by the main CPU 23, and the sub CPU 1 can be checked from the main CPU 23 to see whether it is operating correctly or not.

Now an embodiment corresponding to claim 7 and claim 8, namely the operation of the microcomputer provided with a control circuit to branch the operation according to a break vector upon detection of break, will be described below with reference to FIG. 17 through FIG. 22.

Value of the program counter 5, namely the PC value changes according to the instructions of the program, while the agreement detecting circuit 16 compares the PC value with the break address as the value of the break address register 6 to check for agreement thereof in every cycle. Number of times of agreements detected by the agreement detecting circuit 16 is counted by the break counter 9 and, when the count value reaches a predetermined value, specifically counted down to zero, the break signal HW BRK is activated.

A constitution not provided with the break counter 9 is also possible, in which case the break signal HW BRK is activated once the agreement detecting circuit 16 detects agreement.

In this case, at the same time as the output signal g8 from the OR gate 51 turns to "1", the special code generator 43 generates the BRK instruction code. Upon receipt of the BRK instruction code, value of the break vector register 7 is loaded to the program counter 5, while the instruction latch 45, the instruction decoder 46 and the post-decoder 47-1 process the instructions at the address indicated by the break vector. At the same time, the address where the program is stopped during execution is saved from the program counter 5 into the address save register 8 via the signal line 57 and the gate 58-4.

The value stored in the address save register 8 is used at returning from the break routine. Break address can be optionally selected by setting a desired value in the break address register 6 from the main CPU 23 side.

The program counter denoted by numeral 5 in FIG. 19 may be replaced with an address buffer, in which case agreement of the address during access to the memory for data, not the program address, may also be detected. Flow of a program in such a case is schematically shown in FIG. 21.

For the break vector, such a method can be used as hard logic which is fixed in advance, or loading data written in the ROM or the value written in an exclusive register may be used. When an exclusive register is used, the program can be branched after breaking at a desired address by executing the part of the program to be debugged, once the break vector has been stored in the break vector register 7 by the test reset routine.

In the above description, the break instruction accompanies the operation of a hardware circuit for detecting the agreement with the break address. However, the break instruction can also be executed through software by including BRK instruction in the program, in which case branching into the break routine is carried out in the same procedure. The software break is employed in such a case as the BRK instruction is placed at an appropriate position in the program before debugging, thereby to decide whether a nearby routine is being executed or not, or to examine the values of the registers when the program execution has proceeded to the position of BRK instruction.

The embodiment corresponding to claim 9 has such a constitution as, in addition to the constitution described above, the number of times the agreement detecting circuit 16 shown in FIG. 19 has detected agreement is counted down by the break counter 9 and, when the break address has been accessed the predetermined number of times, program execution is interrupted. This constitution makes it easy, for example, to check the register values by breaking after a loop of the program has been repeated by the predetermined number of times, or to break the execution when accessing to a particular address has been made the predetermined number of times and check the state. Data for the break counter 9 can be set in this case too, by writing it in the register from the main CPU 23.

Now an embodiment corresponding to claim 10 and claim 11, that is the operation of the microcomputer provided with the instruction to return from break state in the form of hardware, will be described below.

Although this embodiment is very similar to the operation of the test reset described above, the test mode control register 4 is set to MW RTB mode and value "1" is set to the start control bit 48 in this embodiment. In this case, the control signal g3 from the post-decoder 47-2 is enabled for the decoder output, and the value of the address save register 8 is loaded to the program counter 5. This makes it possible to resume the execution of the program at the address, which has been saved in the address save register 8, of the instruction which was being executed at the time of the break.

A technique for debugging the sub CPU which is made possible by using this function will be described below. Purpose of debugging a program is to see when the program which has been developed is made correctly as specified and how the program works, by checking the values of registers and data stored in the memory when the program has been executed to a target address.

At first, the target address is written in the break address register 6 and, as required, number of repeating a loop is written in the break counter 9. The sub CPU 1 is started in the test mode and, after storing the start address of the break routine in the break vector register 7, the program branches to the program to be debugged. Because the agreement detecting circuit 16 is always operating, when execution of the target program reaches the break address, the program branches into the break routine by means of hardware. In the break routine, the value of necessary registers or RAM is copied and temporarily saved in a saving area of the RAM, and executes the stop instruction. When the stop instruction is executed, the state is detected by the main CPU 23 similarly as described above, and the sub CPU 1 is switched to the debug mode. Then the data saved in the saving area of the RAM is read by the main CPU 23 and the value of the register at the break point is examined.

When execution of the program returns from the break routine to the address at the point where the break took place, the function described in claim 7 is effective. That is, as the sub CPU test mode bits STM 7, STM 6 are rewritten to the RTB mode and the sub CPU 1 is started after confirming the register values, the address which has been saved in the address save register 8 is restored to the program counter 5 of the sub CPU 1. This enables it to return to the routine which was being executed before branching into the break routine and to execute the rest of the program only by a command from the main CPU 23. Through repetition of such operations, the program of the sub CPU 1 can be executed step by step while debugging it. An example of a program flow for such an operation is shown in the schematic diagram of FIG. 22.

Now an embodiment corresponding to claim 12, namely the operation of an emulation chip for program development will be described below.

Development of a program for a microcomputer requires an emulation chip and an emulator for the control thereof. The emulator stores the program being debugged, and transfers the program to the emulation chip as required. Emulation of programs for the sub CPU 1 of the microcomputer of the invention is carried out not in the conventional method of supplying program data from the emulator every cycle, but in such a method as the entire program is stored in the sub CPU 1 program memory area located on the emulation chip in advance, before executing the program. This means that emulation is carried out after booting the program for the sub CPU 1 onto the emulation chip.

The above operation will be described in detail below. Control of the main CPU 23 is carried out in the conventional method wherein a program of the main CPU 23 is supplied from the emulator via terminals located on the top surface of the emulation chip in every cycle. As the terminals on the top surface are directly connected to the main CPU bus 10, this operation is equivalent to that of a processor which uses the emulator as an external memory. Because the memory area of the sub CPU 1 is accessible from the main CPU 23 in the microcomputer of the invention as described before, a group of program data for the sub CPU 1 can be written continuously into the memory of the sub CPU 1 by means of a simple program of the main CPU 23, by operating the main CPU 23 and rewriting the sub CPU test mode bits STM 7, STM 6. The program can be written freely because the entire memory for the sub CPU 1 is made up only of RAMs in the emulation chip. After the program has been written, the program for the sub CPU 1 is executed according to the program which has been written in the RAM, when the sub CPU test mode bits STM 7, STM 6 are written again to the normal mode or test mode.

When debugging, the function of monitoring the contents of the registers or the memory of the sub CPU 1 can be realized in the emulator by using the break function, as described previously. Therefore it is also possible, by providing several programs of the break routine and, after setting values directly on the registers or the memory of the sub CPU 1, to execute the program of the sub CPU 1 in the test mode at any point desired by the programmer.

Emulation can also be carried out by operating both the sub CPU 1 and the main CPU 23 simultaneously, as a matter of course. That is, after booting the program for the sub CPU 1 as described previously, the program is supplied to the main CPU 23 through the terminal located on the top surface in every cycle similarly to the conventional emulation method, thereby making both CPUs operate in exactly the same manner as they will be in the final state as the product of the microcomputer. In such a final state, the main CPU 23 and the sub CPU 1 execute the programs thereof independently from each other according to the situation, while exchanging data with each other.

At the end, embodiment corresponding to claim 5, namely operation of the memory of the sub CPU 1 will be described below.

It is necessary that the memory of the sub CPU 1 be accessible from the main CPU 23 as well from the sub CPU 1 as described so far, requiring a kind of dual-port memory structure. In the microcomputer of the invention, output of one sense amplifier 133(a, b) for each bit line at the read-out point of the memories 2, 3 of the sub CPU 1 is branched into buffers which lead to the sub CPU bus 28 and to the main CPU bus 10. Data which is read from the memories 2, 3 is sent from the memory cells 131(a, b) via the bit lines to the sense amplifiers 133(a, b) thereby to obtain digital outputs of "1"/"0" similarly to the case of the conventional microcomputer.

The outputs of the sub CPU test mode bits STM 7, STM 6 are decoded to output the mode signal, while in the debug mode, buffer output of the main CPU 23 is activated so that data is transmitted to the main CPU bus 10. In other modes than the debug mode, the buffer to the main CPU 23 is made to have a high impedance, namely put in OFF state, and therefore its data is supplied only to the sub CPU bus 28. Naturally, the memory buffer on the sub CPU 1 side is activated only when the memory block of the sub CPU 1 is accessed according to the result of decoding the address space of the sub CPU 1, while the buffer output becomes a high impedance state when the memory block is not being accessed.

Circles in FIG. 49 through FIG. 51 represent switches of signal line which can be constituted from transmission gates or tri-state buffers and are ON/OFF controlled by the signals indicated beside the respective circles.

Address signals are supplied to the address decoder of this memory by selecting either the sub CPU address signals SEQ0 through SEQ11 and the READ signal or the main CPU address signals AD1 through AD12 and the main CPU READ signal, thereby to obtain DEC1 through DEC12. In this embodiment, because the memory data of the sub CPU 1 is 16-bit length and the memory data of the main CPU 23 is 8-bit length, the address bit lines are staggered by one bit from each other to supply the address signals to DECn signals. Address signals of more higher bits than AD13 are decoded in another portion thereby to control the RDCPU signal itself, and thus the data is supplied to the bus only when it corresponds to the target area of the entire memory space.

Moreover, number of bus buffers can be reduced by making such a constitution as outputs of the sense amplifiers 133(a, b) of the two memory areas are selectively supplied to the bus buffers 135(a, b). That is, when reading the value of the RAM cell, the RDTestRAM signal is activated so that output of the RAM sense amplifier is connected to the inputs of the two buffers and, when reading the value of the ROM cell, the RDMem signal is activated so that the value of the ROM is supplied to the buffer.

When the basic clock V1 of the main CPU 23 and the basic clock M3V of the sub CPU 1 are different, either the clock signal V1 or M3V which corresponds to the mode is selected also for the clock VMEM to be supplied to the sense amplifier. That is, the V1 clock becomes the basic clock of memory access at the debug mode, so that pre-charging of the memory and reading of the memory data are carried out according to the clock cycle thereof. In other modes than the debug mode, the sub CPU clock M3V is supplied to enable accessing to the memory from the sub CPU 1.

Signal lines which branch under control by signal e22 in FIG. 49, FIG. 50 are sign l lines to supply memory data of the register bus space of the sub CPU 1. When instruction decoding causes the signal e22 to activate, it is enabled to send the data which is read from the memory to the register memory space, and the data is supplied to the ALU 38 provided in the CPU 1.

As described above, the microcomputer of the invention is capable of providing a testing environment and debugging environment for on-chip sub CPU. Although only one sub CPU is provided in the embodiments described above, the invention is not limited to such constitutions and a constitution having a plurality of sub CPUs can be easily achieved.

Because a control circuit to control the memory access and the operation of the sub CPU from the main CPU bus is provided in the invention as described above, such a microcomputer can be provided that the sub CPU can be tested and debugged without increasing the number of special terminals and has the main CPU and one or a plurality of sub CPUs being packaged on-chip.

As for the emulation chip, because the entire program memory area of the sub CPU is constituted from RAMs and a control circuit to enable access from the main CPU is provided similarly to the above, it is made possible to provide an in-circuit emulator (ICE) which is capable of booting the program from the main CPU bus side and supplying it to the RAM of the sub CPU in order to debug the program, when developing programs for the sub CPU.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A microcomputer having a main CPU capable of accessing a main memory area through a main CPU bus and at least one sub CPU capable of accessing a sub memory area through a sub CPU bus, comprising:

a control register which can be accessed from the main CPU, controlling means for connecting said sub memory area to said main CPU bus to make said sub memory area accessible from said main CPU, when said main CPU writes a predetermined value in said control register, program counter which generates an address of an instruction of a program to be executed next; and controlling means for loading a test reset vector indicating a start address of a test program for said sub memory area into said program counter upon reset of said sub CPU from said main CPU, when said main CPU has written a predetermined value in said control register, wherein said controlling means controls loading of an output value of hard logic which is fixed in advance, data written in a ROM which constitutes said sub memory area, or a value written in an exclusive register which is accessible from said main CPU bus, as the test reset vector.

2. A microcomputer, comprising:

a main CPU capable of accessing a main memory area through a main CPU bus; and at least one sub CPU having a program counter which generates an address of an instruction of a program to be executed next and capable of accessing a sub memory area through a sub CPU bus;

further comprising:

a break address register which stores a break address for executing another program by interrupting a program under operation;

comparing means which always compares the value of said program counter of said sub CPU and the value of said break address register to detect their agreement; and controlling means for loading the break vector as the start address of said another program to said program counter to branch the program by generating a break interrupt when said comparing means detects the agreement of the values, wherein said break address register is accessible from said main CPU through said main CPU bus and is provided with controlling means for loading an output value of a hard logic which is fixed in advance, data written in a ROM which constitute said sub memory area, or a value stored in an exclusive register to said program counter.

* * * * *